US008582084B2

(12) United States Patent
Shibazaki et al.

(10) Patent No.: US 8,582,084 B2

(45) Date of Patent: Nov. 12, 2013

(54) MOVABLE BODY DRIVE METHOD AND MOVABLE BODY DRIVE SYSTEM, PATTERN FORMATION METHOD AND APPARATUS, EXPOSURE METHOD AND APPARATUS, POSITION CONTROL METHOD AND POSITION CONTROL SYSTEM, AND DEVICE MANUFACTURING METHOD

(75) Inventors: Yuichi Shibazaki, Kumagaya (JP); Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 43 days.

(21) Appl. No.: 13/460,187

(22) Filed: Apr. 30, 2012

(65) Prior Publication Data

US 2012/0212726 A1 Aug. 23, 2012

Related U.S. Application Data

(62) Division of application No. 12/176,050, filed on Jul. 18, 2008, now Pat. No. 8,194,232.

(60) Provisional application No. 60/935,061, filed on Jul. 24, 2007.

(51) Int. Cl.
*G03B 27/32* (2006.01)

(52) U.S. Cl.
USPC .................................. 355/77; 355/53; 355/72

(58) Field of Classification Search
USPC .......................................... 355/30, 53, 72, 77
See application file for complete search history.

(56) References Cited

U.S. PATENT DOCUMENTS 4,465,368 A 8/1984 Matsuura et al.
5,448,332 A 9/1995 Sakakibara et al.
5,610,715 A 3/1997 Yoshii et al.
5,969,441 A 10/1999 Loopstra et al.
6,208,407 B1 3/2001 Loopstra
6,590,634 B1 7/2003 Nishi et al.
6,611,316 B2 8/2003 Sewell (Continued)

FOREIGN PATENT DOCUMENTS

EP 1 079 223 A1 2/2001
EP 1 420 298 A2 5/2004

(Continued)

OTHER PUBLICATIONS

PCT Written Opinion of the International Searching Authority issued in PCT/JP2008/063619.

(Continued)

*Primary Examiner* — Steven H Whitesell Gordon
*Assistant Examiner* — Mesfin T Asfaw
(74) *Attorney, Agent, or Firm* — Oliff & Berridge, PLC

(57) ABSTRACT

Positional information of a movement plane of a wafer stage is measured using an encoder system such as, for example, an X head and a Y head, and the wafer stage is controlled based on the measurement results. At the same time, positional information of the wafer stage is measured using an interferometer system such as, for example, an X interferometer and a Y interferometer. When abnormality of the encoder system is detected or when the wafer stage moves off from a measurement area of the encoder system, drive control is switched to a drive control based on the measurement results of the interferometer system. Accordingly, drive control of the wafer stage can be performed continuously in the entire stroke area, even at the time when abnormality occurs in the encoder system.

44 Claims, 21 Drawing Sheets

(56) References Cited

U.S. PATENT DOCUMENTS

| | | | |
|---|---|---|---|
| 6,778,257 | B2 | 8/2004 | Bleeker et al. |
| 6,952,253 | B2 | 10/2005 | Lof et al. |
| 7,023,610 | B2 | 4/2006 | Ohtsuki et al. |
| 2002/0041377 | A1 | 4/2002 | Hagiwara et al. |
| 2002/0041380 | A1 | 4/2002 | Kwan |
| 2002/0061469 | A1 | 5/2002 | Tanaka |
| 2003/0025890 | A1 | 2/2003 | Nishinaga |
| 2003/0076482 | A1 | 4/2003 | Inoue |
| 2005/0248856 | A1 | 11/2005 | Omura et al. |
| 2005/0280791 | A1 | 12/2005 | Nagasaka et al. |
| 2006/0227309 | A1 | 10/2006 | Loopstra et al. |
| 2006/0231206 | A1 | 10/2006 | Nagasaka et al. |
| 2006/0238731 | A1 | 10/2006 | Beems et al. |
| 2007/0201010 | A1 | 8/2007 | Shibazaki |
| 2007/0263191 | A1 | 11/2007 | Shibazaki |
| 2007/0288121 | A1 | 12/2007 | Shibazaki |
| 2008/0043212 | A1 | 2/2008 | Shibazaki |
| 2008/0088843 | A1 | 4/2008 | Shibazaki |
| 2008/0094604 | A1 | 4/2008 | Shibazaki |
| 2008/0158531 | A1 | 7/2008 | Kiuchi |

FOREIGN PATENT DOCUMENTS

| | | | |
|---|---|---|---|
| EP | 1 630 585 | A1 | 3/2006 |
| EP | 1 655 765 | A1 | 5/2006 |
| EP | 1 737 024 | A1 | 12/2006 |
| JP | A-57-117238 | | 7/1982 |
| JP | A-6-283403 | | 10/1994 |
| JP | A-10-163099 | | 6/1998 |
| JP | A-10-214783 | | 8/1998 |
| JP | A-11-16816 | | 1/1999 |
| JP | A-2000-505958 | | 5/2000 |
| JP | A-2001-313250 | | 11/2001 |
| JP | A-2002-14005 | | 1/2002 |
| JP | A-2002-151405 | | 5/2002 |
| JP | A-2003-249443 | | 9/2003 |
| JP | A-2004-140290 | | 5/2004 |
| JP | A-2004-519850 | | 7/2004 |
| JP | A-2004-289126 | | 10/2004 |
| JP | A-2005-308592 | | 11/2005 |
| WO | WO 99/46835 | | 9/1999 |
| WO | WO 99/49504 | | 9/1999 |
| WO | WO 99/60361 | | 11/1999 |
| WO | WO 01/35168 | A1 | 5/2001 |
| WO | WO 03/065428 | A1 | 8/2003 |
| WO | WO 2004/019128 | A2 | 3/2004 |
| WO | WO 2004/053955 | A1 | 6/2004 |
| WO | WO 2004/055803 | A1 | 7/2004 |
| WO | WO 2004/057590 | A1 | 7/2004 |
| WO | WO 2004/086468 | A1 | 10/2004 |
| WO | WO 2004/107011 | A1 | 12/2004 |
| WO | WO 2005/029559 | A1 | 3/2005 |
| WO | WO 2005/059617 | A2 | 6/2005 |
| WO | WO 2005/059618 | A2 | 6/2005 |
| WO | WO 2006/038952 | A2 | 4/2006 |

OTHER PUBLICATIONS

English Language Translation of JP-2003-249443.
English Language Translation of WO 2004/053955 A1.
English Language Translation of WO 03/065428 Al.
Jul. 2, 2012 Office Action issued in Taiwanese Patent Application No. 097127904 (with translation).
Aug. 2, 2013 Office Action issued in Japanese Patent Application No. 2008-189293 (with translation).

100
10
116
15
IL
R
Z
X
Y
RST
IAR
PU
40
PL
AX
191
16
47A
32
31B
8
50
43A
(43B)
B4
B1
28
31A
MTB
18
MST
12
B3
B2
47B
41
91
IA
Lq
WST
W
WTB
92

Y
X
39X1
WTB
17b
37
38
38
IntX
dx
eY
Qx
O
ex
LX
Ox=(px, qx)
39Y1
39Y2
Qy
dy
37
39X2
17a
LY
IntY
Oy=(py, qy)
Z

Y
39X1
WTB
17b
37
38
38
dx'
ρx
O'
39Y1
ρ
eY
X
O
ex
LX
Qx
IntX
(px, qx)
39Y2
dy'
37
39X2
17a
Qy
ρY
LY
IntY
(pY, qY)
Z

WST
(WTB)
W
Enc1
Enc2
Enc3
30
SL
FM
37
38
39X1
39X2
39Y1
39Y2
LW
LL
28a
28b
28
O=O'
X=X'
Y=Y'
O
O'
X
X'
Y
Y'
X
Y
Z

WST COORDINATE (X, Y, θZ)
Enc1 MEASUREMENT VALUE
Enc2 MEASUREMENT VALUE
Enc3 MEASUREMENT VALUE
Enc4 MEASUREMENT VALUE
CLOCK
(CSCK)
(MSCK)
CH
1
2
3
4
96 μ sec

MOVABLE BODY DRIVE METHOD AND MOVABLE BODY DRIVE SYSTEM, PATTERN FORMATION METHOD AND APPARATUS, EXPOSURE METHOD AND APPARATUS, POSITION CONTROL METHOD AND POSITION CONTROL SYSTEM, AND DEVICE MANUFACTURING METHOD

CROSS-REFERENCE TO RELATED APPLICATIONS

This is a Divisional of application Ser. No. 12/176,050 filed Jul. 18, 2008, which claims the benefit of U.S. Provisional of Application No. 60/935,061 filed Jul. 24, 2007, the disclosure of which is hereby incorporated herein by reference in their entirety.

BACKGROUND OF THE INVENTION

1. Field of the Invention

The present invention relates to movable body driving methods and movable body drive systems, patterning methods and apparatus, exposure methods and apparatus, position control methods and position control systems, and device manufacturing methods, and more particularly, to a movable body drive method and a movable body drive system in which a movable body is driven along a predetermined plane, a pattern formation method using the movable body drive method and a pattern formation apparatus equipped with the movable body drive system, an exposure method using the movable body drive method and an exposure apparatus equipped with the movable body drive system, a position control method and a position control system to control the position of the movable body, and a device manufacturing method using the pattern formation method.

2. Description of the Background Art

Conventionally, in a lithography process for manufacturing microdevices (electron devices and the like) such as semiconductor devices and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are relatively frequently used.

In this kind of exposure apparatus, in order to transfer a pattern of a reticle (or a mask) on a plurality of shot areas on a substrate such as a wafer or a glass plate (hereinafter, generally referred to as a wafer), a wafer stage holding the wafer is driven in a two-dimensional direction, for example, by linear motors and the like. Position measurement of the wafer stage and the like was generally performed using a laser interferometer whose stability of measurement values was good for over a long time and had a high resolution.

However, requirements for a stage position control with higher precision are increasing due to finer patterns that accompany higher integration of semiconductor devices, and now, short-term variation of measurement values due to temperature fluctuation of the atmosphere on the beam path of the laser interferometer or the influence of temperature gradient has come to occupy a large percentage in the overlay budget.

Meanwhile, as a measurement device besides the laser interferometer used for position measurement of the stage, an encoder can be used, however, because the encoder uses a scale, which lacks in mechanical long-term stability (drift of grating pitch, fixed position drift, thermal expansion and the like), it makes the encoder have a drawback of lacking measurement value linearity and being inferior in long-term stability when compared with the laser interferometer.

In view of the drawbacks of the laser interferometer and the encoder described above, various proposals are being made (refer to Kokai (Japanese Patent Unexamined Application Publication) No. 2002-151405 bulletin) of a device that measures the position of a stage using both a laser interferometer and an encoder (a position detection sensor which uses a diffraction grating) together.

Further, the measurement resolution of the conventional encoder was inferior when compared with an interferometer. However, recently, an encoder which has a nearly equal or a better measurement resolution than a laser interferometer has appeared (for example, refer to Kokai (Japanese Patent Unexamined Application Publication) No. 2005-308592 bulletin), and the technology to put the laser interferometer and the encoder described above together is beginning to gather attention.

For example, in the exposure apparatus, in the case of performing position measurement of a wafer stage on which a scale (a grating) has been arranged using an encoder, in order to cover a broad movement range of the wafer stage, it is conceivable that a plurality of heads are placed at a predetermined interval within a two-dimensional plane. However, in the case of using the plurality of heads having such a placement, because the scale is placed on the upper surface of the wafer stage, for example, foreign materials such as particles can easily adhere to the surface of the scale, and in the case such foreign particles adhere to the scale, position measurement accuracy of the wafer stage by an encoder deteriorates, or position measurement becomes difficult. Accordingly, when the position control of the wafer stage is performed using an encoder, it is desirable to prepare a countermeasure of some kind which takes such a situation into consideration.

SUMMARY OF THE INVENTION

According to a first aspect of the present invention, there is provided a first movable body drive method in which a movable body is driven at least in a uniaxial direction, the method comprising: a first process in which positional information of the movable body in the uniaxial direction is measured using a laser interferometer and an encoder at their respective sampling intervals, and the movable body is driven in the uniaxial direction based on measurement results of the encoder; and a second process in which a measurement device used in position control of the movable body in the uniaxial direction is switched from the encoder to the laser interferometer whose output coordinate is corrected so that the output coordinate becomes successive to the output coordinate of the encoder just before when abnormality occurring in the encoder output is detected.

According to this method, when abnormality occurring in the encoder output which measures the position of the movable body in the uniaxial direction is detected during the drive of the movable body in the uniaxial direction, the measurement device used in the position control of the movable body in the uniaxial direction is switched from the encoder to the laser interferometer whose output coordinate is corrected to be successive with the output coordinate of the encoder just before. By this switching, the movable body can be driven continuously even at the time of abnormality of the encoder.

According to a second aspect of the present invention, there is provided a second movable body drive method in which a movable body is driven in directions of three degree of freedom in a predetermined plane, the method comprising: a first process in which the movable body is driven based on an output of an interferometer system that measures positional information in the directions of three degrees of freedom; and a second process in which when switching from servo control of the position in the directions of three degrees of freedom of the movable body using the interferometer system to servo control of the position in the directions of three degrees of freedom of the movable body using an encoder system, the switching of the control is performed by phase linkage where an output coordinate of the encoder system at the time of the switching is computed using an offset of a measurement unit computed based on the output coordinate of the interferometer system and an offset of the encoder system equal to or less than the measurement unit that has already been set for at least about a rotational direction in the predetermined plane.

According to this method, when switching from the servo control of the position of the movable body in directions of three degrees of freedom using the interferometer system to the servo control of the position of the movable body in directions of three degrees of freedom using the encoder system, the switching of the control is performed by the phase linkage described above for the rotational direction within the predetermined plane. By this switching, the offset (the measurement error of the interferometer system) equal to or less than the measurement unit computed based on the output coordinate of the interferometer system can suppress the increase of the rotational error of the movable body which is caused due to being amplified by a predetermined cause.

According to a third aspect of the present invention, there is provided a third movable body drive method in which a movable body is driven at least in a uniaxial direction, the method comprising: a first process in which the movable body is driven based on an output of an encoder that measures positional information in the uniaxial direction of the movable body; and a second process in which in the case of switching from servo control of the position of the movable body using the encoder to servo control of the position of the movable body using a laser interferometer, switching of the control is performed at the point when the movable body stops or becomes stationary.

According to this method, in the case of switching from the servo control of the position of the movable body using the encoder to the servo control of the position of the movable body using the laser interferometer, the switching of the control is performed at the point when the movable body stops or becomes stationary. By this switching, even if the difference between the position of the movable body computed based on the measurement values of the encoder and the position of movable body computed based on the measurement values of the laser interferometer grows large, the difference can be canceled by setting the position coordinate of the movable body again to an uncorrected position coordinate obtained from the laser interferometer.

According to a fourth aspect of the present invention, there is provided a fourth movable body drive method in which a movable body is driven at least in a uniaxial direction, the method comprising: a first process in which the movable body is driven based on an output of an encoder that measures positional information in the uniaxial direction of the movable body; and a second process in which a coordinate linkage is performed in the case of switching from servo control of the position of the movable body using the encoder to servo control of the position of the movable body using the laser interferometer, when abnormality occurring in the encoder output is detected, where an initial value of the output of the laser interferometer is set to coincide with the output coordinate of the encoder just before.

According to this method, in the case of switching from the servo control of the position of the movable body using the encoder to the servo control of the position of the movable body using the laser interferometer, when abnormality occurring in the encoder output is detected, the coordinate linkage is performed where the initial value of the output of the laser interferometer is set to coincide with the output coordinate of the encoder just before. By this linkage, it becomes possible to perform control switching while keeping the position of the movable body in the control before and after the switching, and it becomes possible to drive the movable body smoothly and continuously also at the time of abnormality of the encoder.

According to a fifth aspect of the present invention, there is provided a pattern formation method to form a pattern on an object wherein a movable body on which the object is mounted is driven using any one of the first to fourth movable body drive methods of the present invention to perform pattern formation to the object.

According to this method, by forming a pattern on the object mounted on the movable body which is driven using one of the first to fourth movable body drive methods of the present invention, it becomes possible to form a pattern on the object with good accuracy.

According to a sixth aspect of the present invention, there is provided a second pattern formation method to form a pattern on an object wherein at least one of a plurality of movable bodies including a movable body on which the object is mounted is driven according to any one of the movable body drive methods of the present invention to perform pattern formation to the object.

According to a seventh aspect of the present invention, there is provided a device manufacturing method including a pattern formation process wherein in the pattern formation process, a pattern is formed on a substrate using one of the first and second pattern formation methods of the present invention.

According to an eighth aspect of the present invention, there is provided an exposure method in which a pattern is formed on an object by an irradiation of an energy beam wherein for relative movement of the energy beam and the object, a movable body on which the object is mounted is driven, using one of the first to fourth movable body drive methods of the present invention.

According to this method, for relative movement of the energy beam irradiated on the object and the object, the movable body on which the object is mounted is driven with good precision, using one of the first to fourth movable body drive methods of the present invention. Accordingly, it becomes possible to form a pattern on the object with good precision by scanning exposure.

According to a ninth aspect of the present invention, there is provided a first position control method in which a position of a movable body is controlled in at least a uniaxial direction wherein the position of the movable body is controlled using at least one of an output from an encoder that generates information corresponding to the position in the uniaxial direction of the movable body and an output from a laser interferometer that irradiates a laser beam to the movable body in the uniaxial direction and generates a signal corresponding to an optical path length of the laser beam in the uniaxial direction to the movable body, and relation information between positional information of the movable body using the output from the encoder and positional information of the movable body using the output from the laser interferometer is obtained, whereby when abnormality occurs in one of the output from the encoder and the output from the laser interferometer used for the control of the movable body, the other output and the relation information are used to control the position of the movable body.

According to this method, when abnormality occurs in one of the output from the encoder and the output from the laser interferometer used for the control of the movable body, the other output and the relation information are used to control the position of the movable body. By this control, of the encoder and the laser interferometer, the movable body can be driven continuously even at the time of abnormality in one of the measurement devices used for control of the movable body.

According to a tenth aspect of the present invention, there is provided a second position control method of a movable body in which a position of a movable body is controlled in at least a uniaxial direction wherein when starting position control of the movable body using an output from an encoder that generates information corresponding to the position in the uniaxial direction of the movable body, after controlling the position of the movable body using an output from a laser interferometer that irradiates a laser beam to the movable body in the uniaxial direction and generates a signal corresponding to an optical path length of the laser beam in the uniaxial direction to the movable body, positional information based on the output from the encoder is adjusted using positional information based on the output from the laser interferometer.

According to this method, after the position of the movable body has been controlled using the output from the laser interferometer, when starting the position control of the movable body using the output from the encoder, the positional information based on the output from the encoder is adjusted using the positional information based on the output from the laser interferometer.

According to an eleventh aspect of the present invention, there is provided a first movable body drive system in which a movable body is driven at least in a uniaxial direction, the system comprising: a laser interferometer which measures positional information of the movable body in the uniaxial direction at a first sampling interval; an encoder which measures positional information of the movable body in the uniaxial direction at a second sampling interval; a drive device which drives the movable body; and a controller which drives the movable body in the uniaxial direction via the drive device based on measurement results of the encoder, and when detecting abnormality occurring in the encoder output, switches a measurement device used in position control of the movable body in the uniaxial direction from the encoder to the laser interferometer whose output coordinate has been corrected to be successive to an output of the encoder just before.

According to this system, when the controller detects abnormality occurring in the encoder output which measures the position of the movable body in the uniaxial direction during the drive of the movable body in the uniaxial direction, the measurement device used for position control of the movable body in the uniaxial direction is switched from the encoder to the laser interferometer whose output coordinate is corrected to be successive to the output coordinate of the encoder just before. By this switching, the movable body can be driven continuously even at the time of abnormality of the encoder.

According to a twelfth aspect of the present invention, there is provided a second movable body drive system in which a movable body is driven in directions of three degree of freedom in a predetermined plane, the system comprising: an interferometer system that measures positional information of the movable body in the directions of three degrees of freedom; an encoder system that measures positional information of the movable body in the directions of three degrees of freedom; a drive device which drives the movable body; and a controller which performs a switching from servo control via the drive device of the position in the directions of three degrees of freedom of the movable body using the interferometer system to servo control via the drive device of the position in the directions of three degrees of freedom of the movable body using an encoder system by a phase linkage, where an output coordinate of the encoder system at the time of the switching is computed using an offset of a measurement unit computed based on the output coordinate of the interferometer system and an offset of the encoder system equal to or less than the measurement unit that has already been set for at least a rotational direction in the predetermined plane.

According to this method, when the controller switches from the servo control of the position of the movable body in directions of three degrees of freedom using the interferometer system to the servo control of the position of the movable body in directions of three degrees of freedom using the encoder system, the switching of the control is performed by the phase linkage described above for the rotational direction within the predetermined plane. By this switching, the offset (the measurement error of the interferometer system) equal to or less than the measurement unit computed based on the output coordinate of the interferometer system can suppress the increase of the rotational error of the movable body which is caused due to being amplified by a predetermined cause.

According to a thirteenth aspect of the present invention, there is provided a third movable body drive system in which a movable body is driven at least in a uniaxial direction, the system comprising: a laser interferometer which measures positional information of the movable body in the uniaxial direction; an encoder which measures positional information of the movable body in the uniaxial direction; a drive device which drives the movable body; and a controller which performs switching from servo control via the drive device of the position of the movable body using the encoder to a control via the drive device of the position of the movable body using the laser interferometer at a point when the movable body stops or becomes stationary.

According to this system, in the case the controller switches from the servo control via the drive device of the position of the movable body using the encoder to the servo control via the drive device of the position of the movable body using the laser interferometer, the switching of the control is performed at the point when the movable body stops or becomes stationary. By this switching, even if the difference between the position of the movable body computed based on the measurement values of the encoder and the position of movable body computed based on the measurement values of the laser interferometer grows large, the difference can be canceled by setting the position coordinate of the movable body again to an uncorrected position coordinate obtained from the laser interferometer.

According to a fourteenth aspect of the present invention, there is provided a fourth movable body drive system in which a movable body is driven at least in a uniaxial direction, the system comprising: a laser interferometer which measures positional information of the movable body in the uniaxial direction; an encoder which measures positional information of the movable body in the uniaxial direction; a drive device which drives the movable body; and a controller which performs a coordinate linkage in the case of switching from servo control via the drive device of the position of the movable body using the encoder to control via the drive device of the position of the movable body using the laser interferometer, when abnormality occurring in the encoder output is detected, where an initial value of the output of the laser interferometer is set to coincide with the output coordinate of the encoder just before.

According to this method, in the case the controller switches from the servo control via the drive device of the position of the movable body using the encoder to the servo control via the drive device of the position of the movable body using the laser interferometer, when abnormality occurring in the encoder output is detected, the coordinate linkage is performed where the initial value of the output of the laser interferometer is set to coincide with the output coordinate of the encoder just before. By this linkage, it becomes possible to perform control switching while keeping the position of the movable body in the control before and after the switching, and it becomes possible to drive the movable body smoothly and continuously also at the time of abnormality of the encoder.

According to a fifteenth aspect of the present invention, there is provided a first pattern formation apparatus that forms a pattern on an object, the apparatus comprising: a patterning device which generates a pattern on the object; and any one of first to fourth movable body drive systems of the present invention, whereby a movable body on which the object is mounted is driven by the movable body drive system drives for pattern formation on the object.

According to this apparatus, because a pattern is generated on an object mounted on the movable body driven with good precision by any one of the first to fourth movable body drive systems of the present invention with a patterning device, it becomes possible to form a pattern on the object with good precision.

According to a sixteenth aspect of the present invention, there is provided an exposure apparatus that forms a pattern on an object by an irradiation of an energy beam, the apparatus comprising: a patterning device that irradiates the energy beam on the object; and any one of the first to fourth movable body drive systems of the present invention, whereby the movable body drive system drives the movable body on which the object is mounted for relative movement of the energy beam and the object.

According to this apparatus, for relative movement of the energy beam irradiated on the object from the patterning device and the object, the movable body on which the object is mounted is driven with good precision by one of the first to fourth movable body drive systems of the present invention. Accordingly, it becomes possible to form a pattern on the object with good precision by scanning exposure.

According to a seventeenth aspect of the present invention, there is provided a first position control system of a movable body in which a position of a movable body is controlled in at least a uniaxial direction, the system further comprising: a first measurement device which includes an encoder that generates information according to a position of the movable body in the uniaxial direction, and outputs a first positional information using an output from the encoder; a second measurement device which includes a laser interferometer that irradiates a laser beam to the movable body in the uniaxial direction and generates a signal corresponding to an optical path length of the laser beam to the movable body in the uniaxial direction, and outputs a second positional information using an output from the laser interferometer; a computing unit which obtains relation information between the first positional information and the second positional information; and a controller which controls a position of the movable body using at least one of the first positional information and the second positional information, and when abnormality occurs in one of the first positional information and the second positional information used for the control of the movable body, the other positional information and the relation information obtained by the computing unit are used to control the position of the movable body.

According to this system, when abnormality occurs in one of the output from the encoder and the output from the laser interferometer used for the control of the movable body, the controller controls the position of the movable body using the other output and the relation information. By this control, of the encoder and the laser interferometer, the movable body can be driven continuously even at the time of abnormality in one of the measurement devices used for control of the movable body.

According to an eighteenth aspect of the present invention, there is provided a second position control system of a movable body in which a position of a movable body is controlled in at least a uniaxial direction, the system comprising: a first measurement device which includes an encoder that generates information according to a position of the movable body in the uniaxial direction, and outputs positional information using an output from the encoder; a second measurement device which includes a laser interferometer that irradiates a laser beam to the movable body in the uniaxial direction and generates a signal corresponding to an optical path length of the laser beam to the movable body in the uniaxial direction, and outputs positional information using an output from the laser interferometer; and a controller which controls the position of the movable body using positional information output from the first measurement device, after having controlled the position of the movable body using positional information output from the second measurement device, whereby when starting the position control of the movable body using the positional information output form the first measurement device, the controller adjusts the positional information output by the first measurement device using the positional information output from the second measurement device.

According to this system, after the controller controls the position of the movable body using the positional information output from the second measurement device, when starting the position control of the movable body using the positional information output by the first measurement device, the positional information output from the first measurement device is adjusted using the positional information output by the second measurement device.

According to a nineteenth aspect of the present invention, there is provided an exposure method in which an object is exposed with an energy beam, the method comprising: moving a movable body that can hold the object, while measuring positional information of the movable body using one of a first measurement device including an encoder and a second measurement device including an interferometer; and deciding positional information of the other of the first and second measurement devices based on positional information of the one of the measurement devices, in order to control the movement by switching the one of the measurement devices to the other of the measurement devices during the movement.

According to a twentieth aspect of the present invention, there is provided an exposure apparatus that exposes an object held by a movable body with an energy beam, the apparatus comprising: a first measurement device including an encoder, which measures positional information of the movable body; a second measurement device including an interferometer, which measures positional information of the movable body; and a controller that moves the movable body using one of the first and second measurement devices, and also decides positional information of the other of the measurement devices based on positional information of the one of the measurement devices, in order to control the movement by switching the one of the measurement devices to the other of the measurement devices during the movement.

BRIEF DESCRIPTION OF THE DRAWINGS

In the accompanying drawings.

DESCRIPTION OF THE EMBODIMENTS

An embodiment of the present invention will be described below, with reference to FIGS. 1 to 22.

Figure 1:
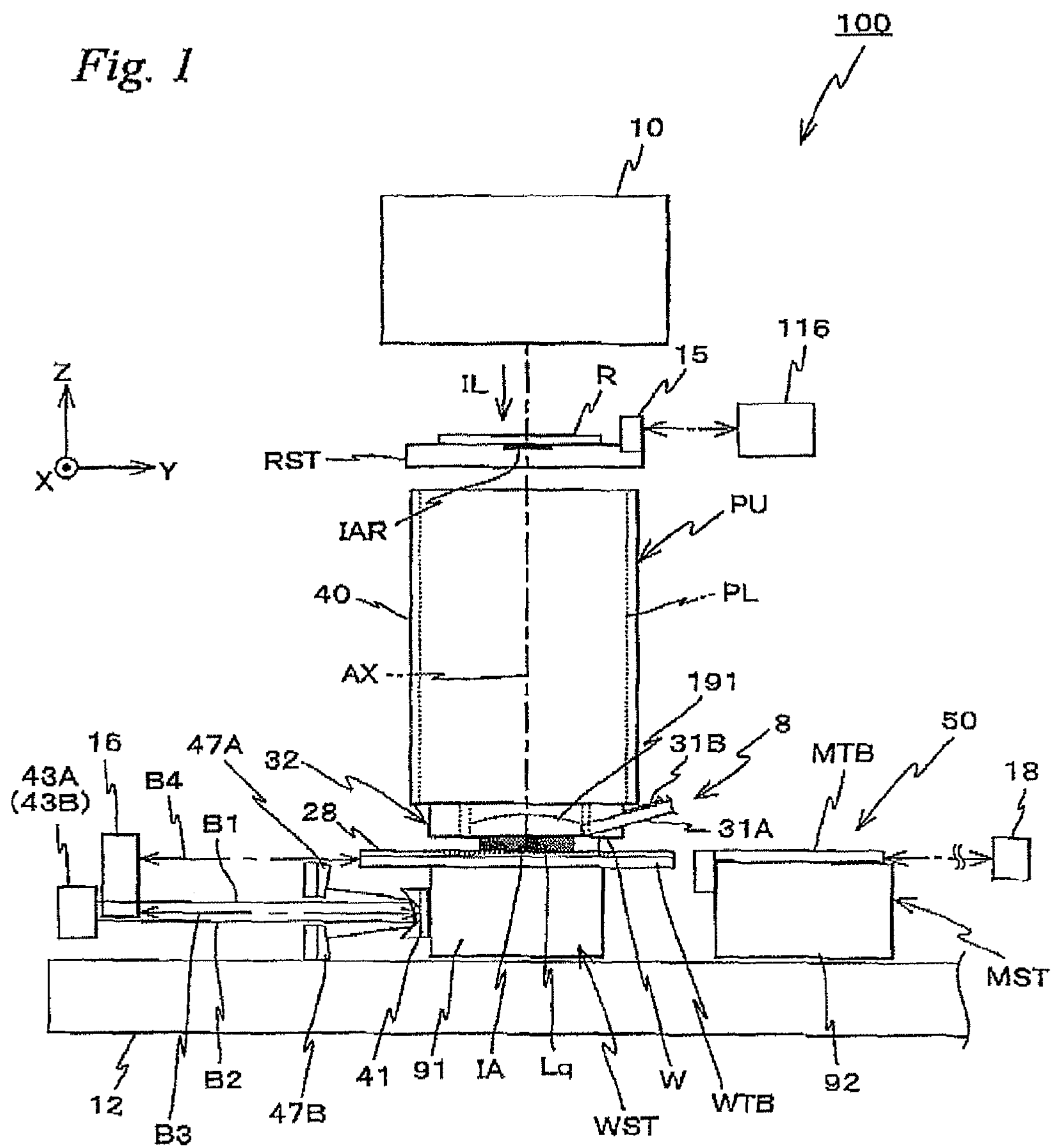
FIG. 1 is a view schematically showing the configuration of an exposure apparatus related to an embodiment.

FIG. 1 shows a schematic configuration of an exposure apparatus 100 in the embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST that holds a reticle R that is illuminated by an illumination light for exposure (hereinafter, referred to as illumination light, or exposure light) IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 description and the like. Illumination system 10 illuminates a slit-shaped illumination area IAR which is set on reticle R with a reticle blind (a masking system) by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable or movable in within an XY plane by a reticle stage drive section 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a designated scanning speed.

The positional information (including rotation information in the θz direction) of reticle stage RST in the XY plane (movement plane) is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis and an X movable mirror that has a reflection surface orthogonal to the X-axis). The measurement values of reticle interferometer 116 are sent to a main controller 20 (not shown in FIG. 1, refer to FIG. 6). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive section 11 based on the computation results. Incidentally, instead of movable mirror 15, the edge surface of reticle stage RSV can be mirror polished so as to form a reflection surface (corresponding to the reflection surface of movable mirror 15). Further, reticle interferometer 116 can measure positional information of reticle stage RST related to at least one of the Z-axis, θx, or θy directions.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, a reduced image of the circuit pattern (a reduced image of a part of the circuit pattern) of the reticle is formed within illumination area IAR, with illumination light IL that has passed through reticle R which is placed so that its pattern surface substantially coincides with a first plane (an object plane) of projection optical system PL, in an area conjugate to illumination area IAR on wafer W (exposure area) whose surface is coated with a resist (a sensitive agent) and is placed on a second plane (an image plane) side, via projection optical system PL (projection unit PU). And by reticle stage RST and wafer stage WST being synchronously driven, the reticle is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W.

Incidentally, although it is not shown, projection unit PU is installed in a barrel platform supported by three struts via a vibration isolation mechanism. However, as well as such a structure, as is disclosed in, for example, the pamphlet of International Publication WO2006/038952 and the like, projection unit PU can be supported by suspension with respect to a mainframe member (not shown) placed above projection unit PU or with respect to a base member on which reticle stage RST is placed.

Incidentally, in exposure apparatus 100 of the embodiment, because exposure is performed applying a liquid immersion method, an opening on the reticle side becomes larger with the substantial increase of the numerical aperture NA. Therefore, in order to satisfy Petzval's condition and to avoid an increase in size of the projection optical system, a reflection/refraction system (a catodioptric system) which is configured including a mirror and a lens can be employed as a projection optical system. Further, in wafer W, in addition to a sensitive layer (a resist layer), for example, a protection film (a topcoat film) which protects the wafer or the sensitive layer can also be formed.

Figure 3:
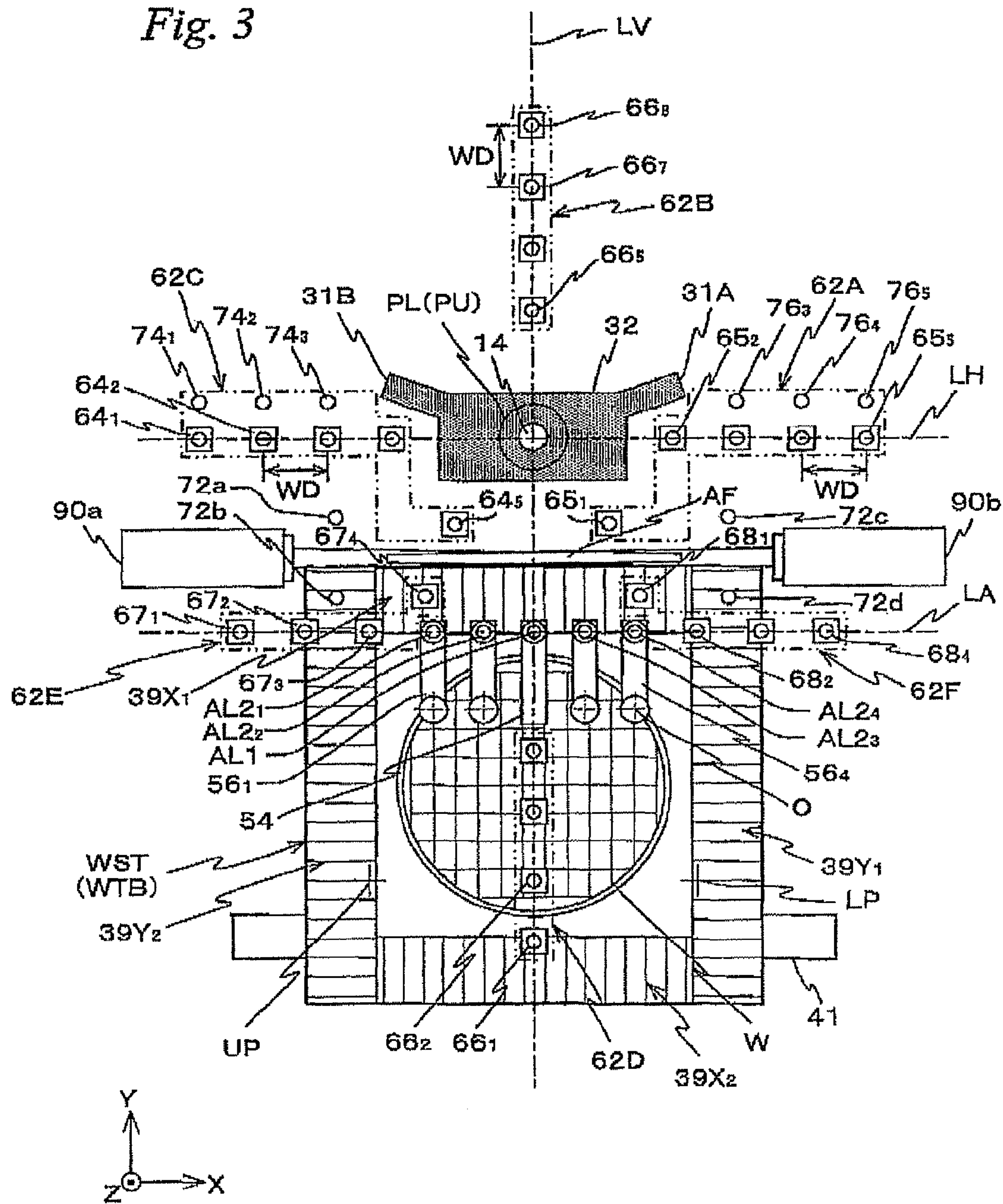
FIG. 3 is a planar view showing the placement of various measuring apparatuses (such as encoders, alignment systems, a multipoint AF system, and Z heads) that are equipped in the exposure apparatus in FIG. 1.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be on a substantially flush surface with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to an X-axis direction and Y-axis direction in a planar view (when viewed from above) as shown in FIG. 3, and are placed symmetric to a straight line (a reference axis) LV which passes through the center (optical axis AX of projection optical system PL, coinciding with the center of exposure area IA previously described in the embodiment) of projection unit PU and is also parallel to the Y-axis.

Figure 6:
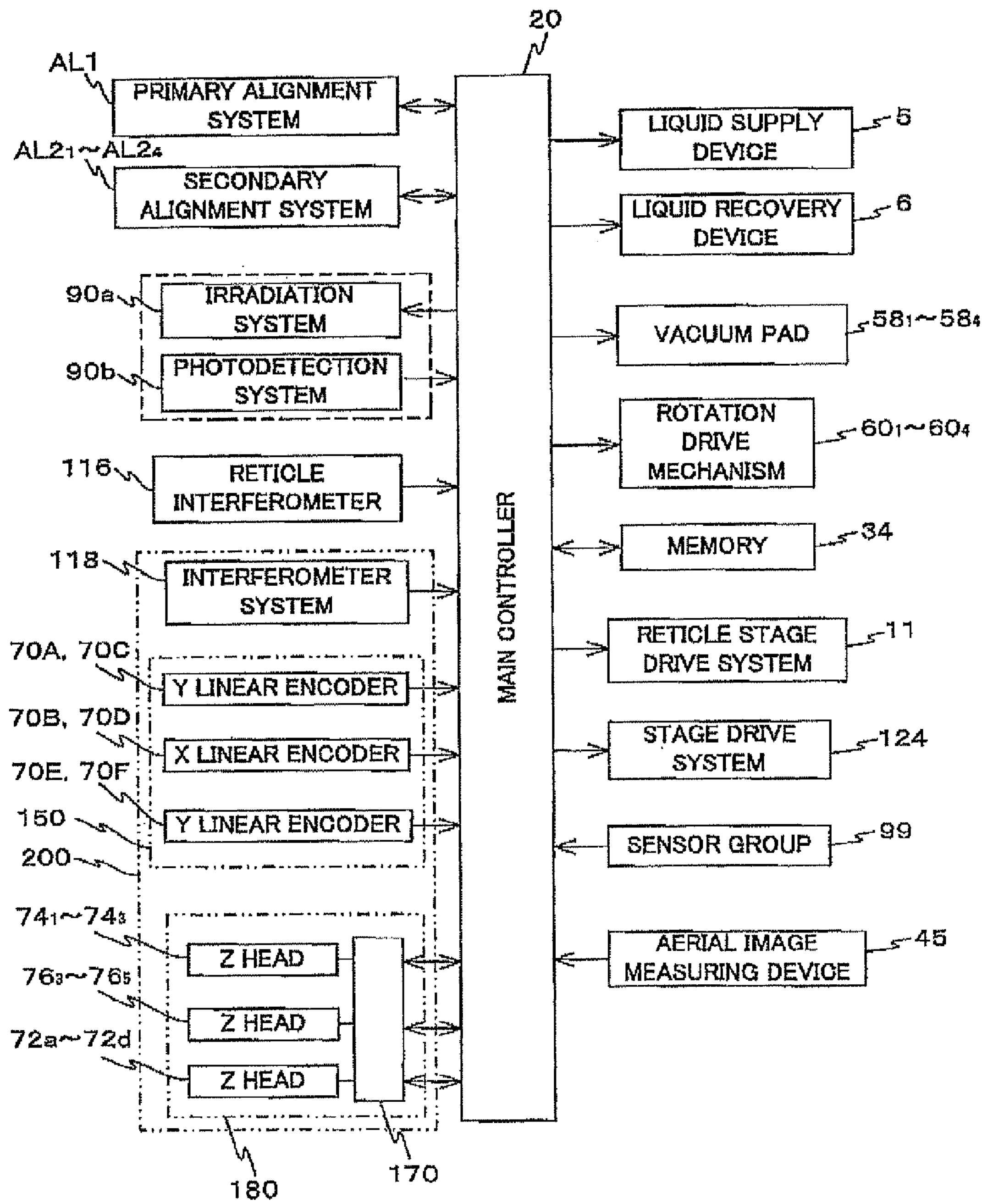
FIG. 6 is a block diagram showing a configuration of a control system of the exposure apparatus related to an embodiment.

One end of a supply pipe (not shown) is connected to liquid supply pipe 31A while the other end of the supply pipe is connected to a liquid supply unit 5 (not shown in FIG. 1, refer to FIG. 6), and one end of a recovery pipe (not shown) is connected to liquid recovery pipe 31B while the other end of the recovery pipe is connected to a liquid recovery device 6 (not shown in FIG. 1, refer to FIG. 6).

Liquid supply device 5 includes a liquid tank for supplying liquid, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the tank, for example, to nearly the same temperature as the temperature within the chamber (not shown) where the exposure apparatus is housed. Incidentally, the tank, the compression pump, the temperature controller, the valve, and the like do not all have to be equipped in exposure apparatus 100, and at least part of them can also be substituted by the equipment or the like available in the plant where exposure apparatus 100 is installed.

Liquid recovery device 6 includes a liquid tank for collecting liquid, a suction pump, a valve for controlling recovery/stop of the liquid via liquid recovery pipe 31B, and the like. As the valve, it is desirable to use a flow control valve similar to the valve of liquid supply device 5. Incidentally, the tank, the suction pump, the valve, and the like do not all have to be equipped in exposure apparatus 100, and at least part of them can also be substituted by the equipment or the like available in the plant where exposure apparatus 100 is installed.

In the embodiment, as liquid Lq described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply device 5 and liquid recovery device 6 each have a controller and the respective controllers are controlled by main controller 20 (refer to FIG. 6). According to instructions from main controller 20, the controller of liquid supply device 5 opens the valve connected to liquid supply pipe 31A to a predetermined degree to supply liquid (water) to the space between tip lens 191 and wafer W via liquid supply pipe 31A, the supply flow channel and the supply opening. Further, when the water is supplied, according to instructions from main controller 20, the controller of liquid recovery device 6 opens the valve connected to liquid recovery pipe 31B to a predetermined degree to recover the liquid (water) from the space between tip lens 191 and wafer W into liquid recovery device 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, part of local liquid immersion device 8, for example, at least nozzle unit 32 may also be supported in a suspended state by a main frame (including the barrel platform) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in the similar manner to the manner described above.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, the pamphlet of International Publication No. 99/49504, may also be employed, in the case such an arrangement is possible taking into consideration a relation with adjacent members. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, or the liquid immersion mechanism disclosed in the EP Patent Application Publication No. 1420298 description can also be applied to the exposure apparatus of the embodiment.

Referring back to FIG. 1, stage device 50 is equipped with a wafer stage WST and a measurement stage MST placed above a base board 12, a measurement system 200 (refer to FIG. 6) which measures positional information of the stages WST and MST, a stage drive system 124 (refer to FIG. 6) which drives stages WST and MST and the like. Measurement system 200 includes an interferometer system 118, an encoder system 150, and a surface position measurement system 180 as shown in FIG. 6. Incidentally, details on interferometer system 118, encoder system 150 and the like will be described later in the description.

Referring back to FIG. 1, on the bottom surface of each of wafer stage WST and measurement stage MST, a noncontact bearing (not shown), for example, a vacuum preload type hydrostatic air bearing (hereinafter, referred to as an "air pad") is arranged at a plurality of points, and wafer stage WST and measurement stage MST are supported in a noncontact manner via a clearance of around several μm above base board 12, by static pressure of pressurized air that is blown out from the air pad toward the upper surface of base board 12. Further, stages WST and MST are both drivable independently within the XY plane, by stage drive system 124 (refer to FIG. 6) which includes a linear motor and the like.

Wafer stage WST includes a stage main section 91 and a wafer table WTB that is mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (e.g., including a voice coil motor and the like).

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has a surface (liquid repellent surface) on a substantially flush surface with the surface of wafer W mounted on the wafer holder to which liquid repellent processing with respect to liquid Lq is performed, has a rectangular outer shape (contour), and also has a circular opening slightly larger than the wafer holder (a mounting area of the wafer) which is formed in the center portion. Plate 28 is made of materials with a low coefficient of thermal expansion, such as glass or ceramics (e.g., such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as shown in a planer view of wafer table WTB (wafer stage WST) in FIG. 4A, plate 28 has a first liquid repellent area 28*a* whose outer shape (contour) is rectangular enclosing a circular opening, and a second liquid repellent area 28*b* that has a rectangular frame (annular) shape placed around the first liquid repellent area 28*a*. On first liquid repellent area 28*a*, for example, at the time of an exposure operation, at least part of a liquid immersion area 14 (refer to FIG. 8) that is protruded from the surface of the wafer is formed, and on second liquid repellent area 28*b*, scales for an encoder system (to be described later) are formed. Incidentally, at least part of the surface of plate 28 does not have to be on a flush surface with the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to the first liquid repellent area 28*a* and the second liquid repellent area 28*b* respectively. In the embodiment, water is used as liquid Lq as is described above, and therefore, hereinafter the first liquid repellent area 28*a* and the second liquid repellent area 28*b* are also referred to as a first water repellent plate 28*a* and a second water repellent plate 28*b*.

In this case, exposure light IL is irradiated to the first water repellent plate 28*a* on the inner side, while exposure light IL is hardly irradiated to the second water repellent plate 28*b* on the outer side. Taking this fact into consideration, in the embodiment, a first liquid repellent area to which water repellent coat having sufficient resistance to exposure light IL (light in a vacuum ultraviolet region, in this case) is applied is formed on the surface of the first water repellent plate 28*a*, and a second liquid repellent area to which water repellent coat having resistance to exposure light IL inferior to the first liquid repellent area is applied is formed on the surface of the second water repellent plate 28*b*. In general, since it is difficult to apply water repellent coat having sufficient resistance to exposure light IL (in this case, light in a vacuum ultraviolet region) to a glass plate, it is effective to separate the water repellent plate into two sections, the first water repellent plate 28*a* and the second water repellent plate 28*b* which is the periphery of the first water repellent plate, in the manner described above. Incidentally, the present invention is not limited to this, and two types of water repellent coat that have different resistance to exposure light IL may also be applied on the upper surface of the same plate in order to form the first liquid repellent area and the second liquid repellent area. Further, the same kind of water repellent coat may be applied to the first and second liquid repellent areas. For example, only one liquid repellent area may also be formed on the same plate.

Figure 4A:
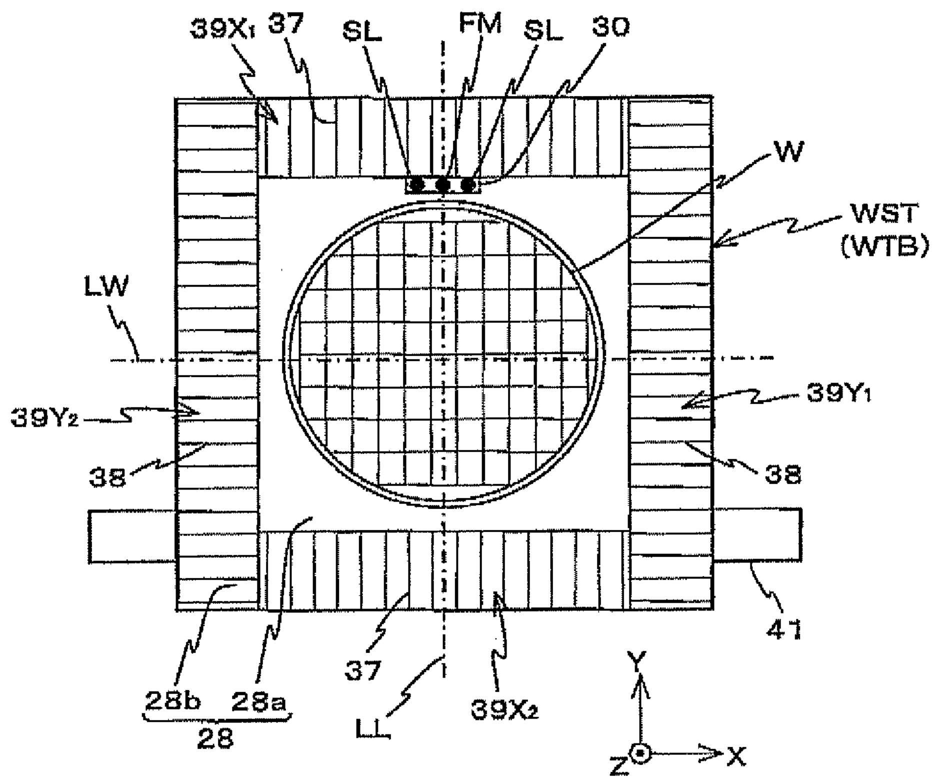
FIG. 4A is a planar view showing a wafer stage.

Further, as is obvious from FIG. 4A, at the end portion on the +Y side of the first water repellent plate 28*a*, a rectangular cutout is formed in the center portion in the X-axis direction, and a measurement plate 30 is embedded inside the rectangular space (inside the cutout) that is enclosed by the cutout and the second water repellent plate 28*b*. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of fiducial mark FM on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis and Y-axis directions respectively can be used, as an example.

Figure 4B:
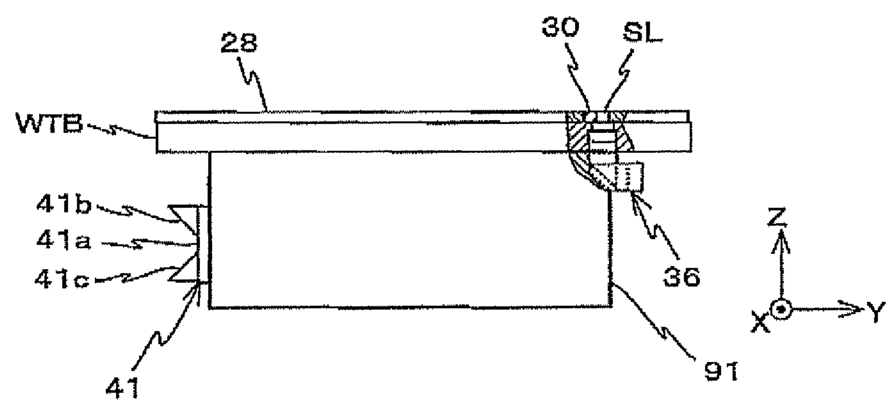
FIG. 4B is a schematic side view of a partially sectioned wafer stage WST.

Further, as is shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of the second water repellent plate 28*b*, multiple grid lines are directly formed in a predetermined pitch along each of four sides. More specifically, in areas on one side and the other side in the X-axis direction of second water repellent plate 28*b* (both sides in the horizontal direction in FIG. 4A), Y scales 39$Y_1$ and 39$Y_2$ are formed respectively, and Y scales 39$Y_1$ and 39$Y_2$ are each composed of a reflective grating (for example, a diffraction grating) having a periodic direction in the Y-axis direction in which grid lines 38 having the longitudinal direction in the X-axis direction are formed in a predetermined pitch along a direction parallel to the Y-axis (the Y-axis direction).

Similarly, in areas on one side and the other side in the Y-axis direction of second water repellent plate 28*b* (both sides in the vertical direction in FIG. 4A), X scales 39$X_1$ and 39$X_2$ are formed respectively in a state where the scales are placed between Y scales 39$Y_1$ and 39$Y_2$ and X scales 39$X_1$ and 39$X_2$ are each composed of a reflective grating (for example, a diffraction grating) having a periodic direction in the X-axis direction in which grid lines 37 having the longitudinal direction in the Y-axis direction are formed in a predetermined pitch along a direction parallel to the X-axis (the X-axis direction). As each of the scales, the scale made up of a reflective diffraction grating RG (refer to FIG. 7A) that is created by, for example, hologram or the like on the surface of the second water repellent plate 28*b* is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since the second water repellent plate 28*b* itself constitutes the scales, a glass plate with low-thermal expansion is to be used as the second water repellent plate 28*b*. However, the present invention is not limited to this, and a scale member made up of a glass plate or the like with low-thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Incidentally, in order to protect the diffraction grating, it is also effective to cover the grating with a glass plate with low thermal expansion that has water repellency (liquid repellency). In this case, as the glass plate, a plate whose thickness is the same level as the wafer, such as for example, a plate 1 mm thick, can be used, and the plate is set on the upper surface of wafer table WST so that the surface of the glass plate becomes the same height (a flush surface) as the wafer surface.

Incidentally, a lay out pattern is arranged for deciding the relative position between an encoder head and a scale near the edge of each scale (to be described later). The lay out pattern is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Figure 2:
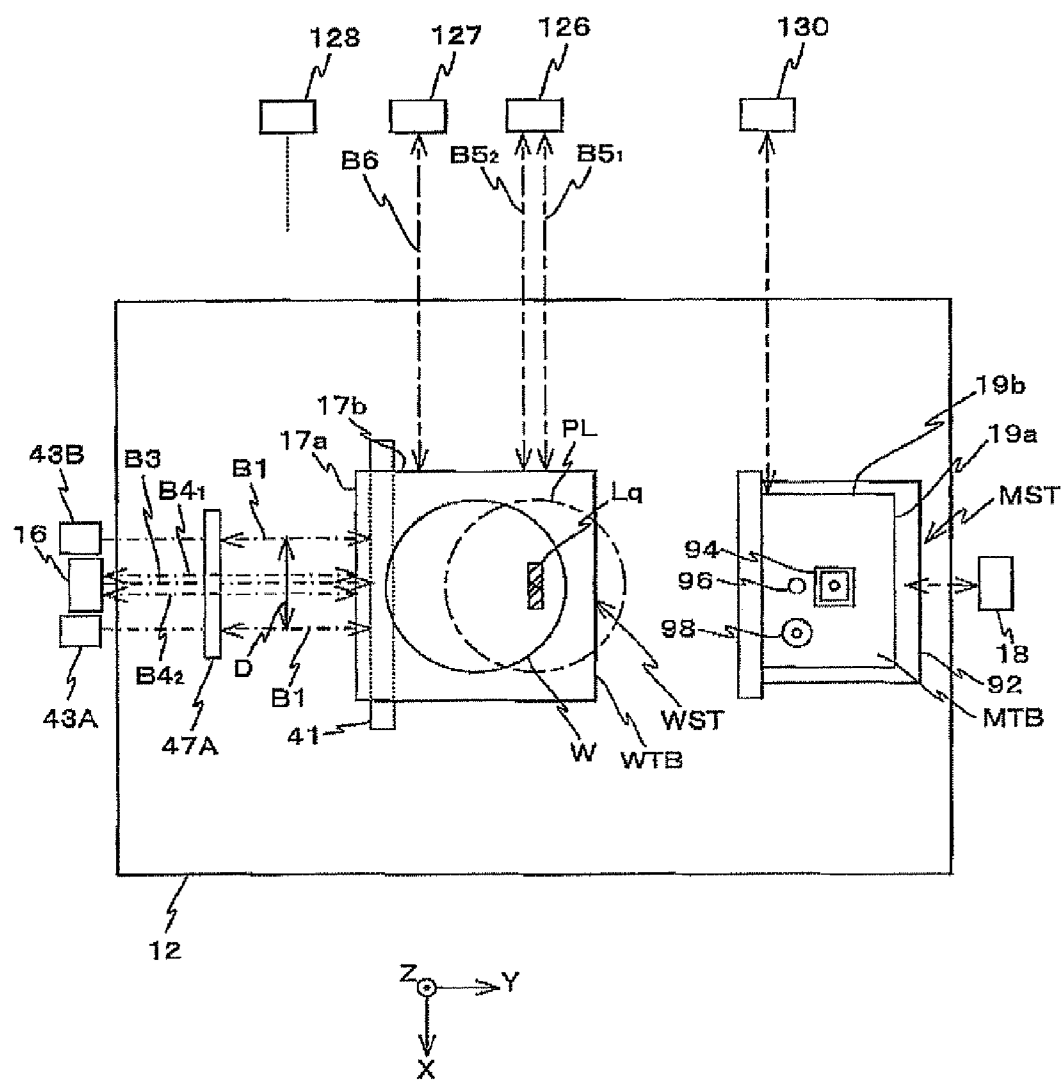
FIG. 2 is a planar view showing a stage unit in FIG. 1.

To the −Y edge surface and the −X edge surface of wafer table WTB, mirror-polishing is applied, respectively, and as shown in FIG. 2, a reflection surface 17*a* and a reflection surface 17*b* are formed for interferometer system 118 which will be described later in the description.

As shown in FIG. 1, measurement stage MST includes a stage main section 92, and a measurement table MTB mounted on stage main section 92. Measurement stage MST is configured drivable in at least directions of three degrees of freedom (X, Y, and θz) with respect to base board 12 by a drive system (not shown). However, the present invention is not limited to this, and for example, measurement stage MST can employ the so-called coarse and fine movement structure in which measurement table MTB can be finely driven in the X-axis direction, the Y-axis direction, and the θz direction with respect to stage main section 92, or measurement table MTB can be configured drivable in directions of three degrees of freedom, which are Z, θx, and θy, on stage main section 92.

Incidentally, the drive system of wafer stage WST and the drive system of measurement stage MST are included in FIG. 6, and are shown as stage drive system 124.

Figure 5A:
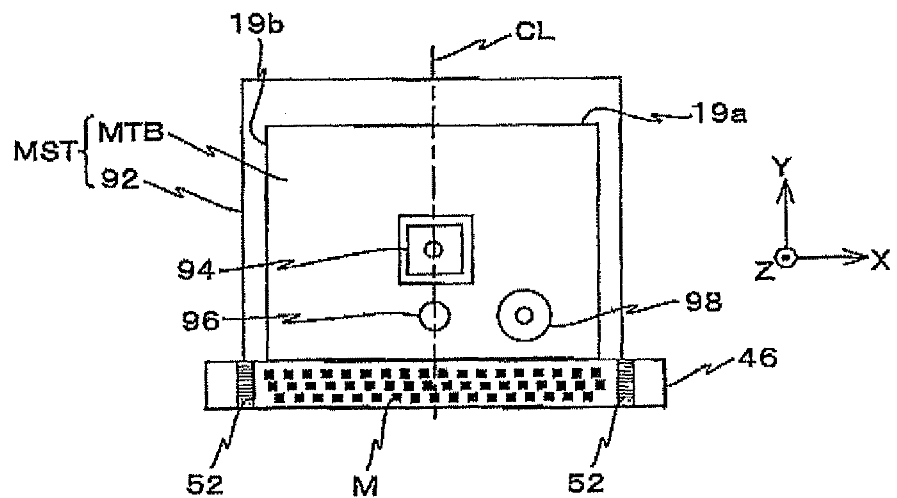
FIG. 5A is a planar view that shows a measurement stage MST.

Various measurement members are arranged at measurement table MTB (and stage main section 92). As such measurement members, for example, as shown in FIGS. 2 and 5A, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. 03/065428 and the like are employed. As wavefront aberration measuring instrument 98, the one disclosed in, for example, the pamphlet of International Publication No. 99/60361 (the corresponding EP Patent No. 1,079,223 description) can also be used.

As irregular illuminance sensor 94, the configuration similar to the one that is disclosed in, for example, U.S. Pat. No. 4,465,368 description and the like can be used. Further, as aerial image measuring instrument 96, the configuration similar to the one that is disclosed in, for example, U.S. Patent Application Publication No. 2002/0041377 description and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as irregular illuminance sensor 94 and aerial image measuring instrument 96 are placed on a centerline CL (Y-axis passing through the center) of measurement stage MST. Therefore, in the embodiment, measurement using theses sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, U.S. Patent Application Publication No. 2002/0061469 description and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

Further, on the +Y edge surface and the −X edge surface of measurement table MTB, reflection surfaces 19*a* and 19*b* are formed similar to wafer table WTB previously described (refer to FIGS. 2 and 5A).

Figure 5B:
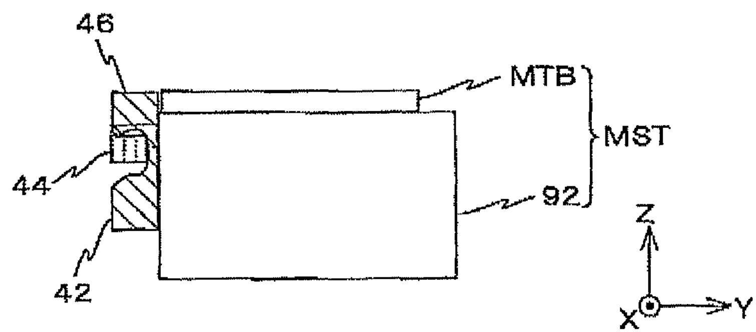
FIG. 5B is a partially sectioned schematic side view that shows measurement stage MST.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light receiving element such as a photomultiplier tube, and a housing that houses them. As is obvious from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measuring unit 45 (refer to FIG. 6), which is similar to the one disclosed in, U.S. Patent Application Publication No. 2002/0041377 description referred to previously, and the like.

On attachment member 42, a fiducial bar (hereinafter, shortly referred to as an "FD bar") which is made up of a bar-shaped member having a rectangular sectional shape is arranged extending in the X-axis direction. FD bar 46 is kinematically supported on measurement stage MST by a full-kinematic mount structure.

Since FD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of FD bar 46 is set high to be around the same level as a so-called datum plane plate. Further, as shown in FIG. 5A, a reference grating (for example, a diffraction grating) 52 whose periodic direction is the Y-axis direction is respectively formed in the vicinity of the end portions on one side and the other side in the longitudinal direction of FD bar 46. The pair of reference gratings 52 is formed placed apart from each other at a predetermined distance symmetric to the center in the X-axis direction of FD bar 46, or more specifically, formed in a symmetric placement to centerline CL previously described.

Further, on the upper surface of FD bar 46, a plurality of reference marks M are formed in a placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of FD bar 46 and the surface of measurement table MTB (which may include the measurement members described above) are also covered with a liquid repellent film (water repellent film) severally.

In exposure apparatus 100 of the embodiment, although it is omitted in FIG. 1 from the viewpoint of avoiding intricacy of the drawing, as shown in FIG. 3, a primary alignment system AL1 having a detection center at a position spaced apart from optical axis AX of projection optical system PL at a predetermined distance on the −Y side is actually placed on reference axis LV. Primary alignment system AL1 is fixed to the lower surface of a main frame (not shown) via a support member 54. On one side and the other side in the X-axis direction with primary alignment system AU in between, secondary alignment systems AL$\mathbf{2}_1$ and AL$\mathbf{2}_2$, and AL$\mathbf{2}_3$ and AL$\mathbf{2}_4$ whose detection centers are substantially symmetrically placed with respect to straight line LV are severally arranged. That is, five alignment systems AL1 and AL$\mathbf{2}_1$ to AL$\mathbf{2}_4$ are placed so that their detection centers are placed at different positions in the X-axis direction, that is, placed along the X-axis direction.

As is representatively shown by secondary alignment system AL$\mathbf{2}_4$, each secondary alignment system AL$\mathbf{2}_n$ (n=1 to 4) is fixed to a tip (turning end) of an arm $\mathbf{56}_n$ (n=1 to 4) that can turn around a rotation center O as the center in a predetermined angle range in clockwise and anticlockwise directions in FIG. 3. In the embodiment, a part of each secondary alignment system AL$\mathbf{2}_n$ (e.g., including at least an optical system that irradiates an alignment light to a detection area and also leads the light that is generated from a subject mark within the detection area to a light-receiving element) is fixed to arm 56 and the remaining section is arranged at the main frame that holds projection unit PU. The X-positions of secondary alignment systems AL$\mathbf{2}_1$, AL$\mathbf{2}_2$, AL$\mathbf{2}_3$ and AL$\mathbf{2}_4$ are severally adjusted by rotating around rotation center O as the center. In other words, the detection areas (or the detection centers) of secondary alignment systems AL$\mathbf{2}_1$, AL$\mathbf{2}_2$, AL$\mathbf{2}_3$ and AL$\mathbf{2}_4$ are independently movable in the X-axis direction. Accordingly, the relative positions of the detection areas of primary alignment system AL1 and secondary alignment systems AL$\mathbf{2}_1$, AL$\mathbf{2}_2$, AL$\mathbf{2}_3$ and AL$\mathbf{2}_4$ are adjustable in the X-axis direction. Incidentally, in the embodiment, the X-positions of secondary alignment systems AL$\mathbf{2}_1$, AL$\mathbf{2}_2$, AL$\mathbf{2}_3$ and AL$\mathbf{2}_4$ are to be adjusted by the rotation of the arms. However, the present invention is not limited to this, and a drive mechanism that drives secondary alignment systems AL$\mathbf{2}_1$, AL$\mathbf{2}_2$, AL$\mathbf{2}_3$ and AL$\mathbf{2}_4$ back and forth in the X-axis direction may also be arranged. Further, at least one of secondary alignment systems AL$\mathbf{2}_1$, AL$\mathbf{2}_2$, AL$\mathbf{2}_3$ and AL$\mathbf{2}_4$ can be moved not only in the X-axis direction but also in the Y-axis direction. Incidentally, since part of each secondary alignment system AL$\mathbf{2}_n$ is moved by arm $\mathbf{56}_n$, positional information of the part that is fixed to arm $\mathbf{56}_n$ is measurable by a sensor (not shown) such as, for example, an interferometer or an encoder. The sensor may only measure position information in the X-axis direction of secondary alignment system AL$\mathbf{2}_n$, or may also be capable of measuring position information in another direction, for example, the Y-axis direction and/or the rotation direction (including at least one of the θx and θy directions).

On the upper surface of each arm $\mathbf{56}_n$, a vacuum pad $\mathbf{58}_n$ (n=1 to 4, not shown in FIG. 3, refer to FIG. 6) that is composed of a differential evacuation type air bearing is arranged. Further, arm $\mathbf{56}_n$ can be turned by a rotation drive mechanism $\mathbf{60}_n$ (n=1 to 4, not shown in FIG. 3, refer to FIG. 6) that includes, for example, a motor or the like, in response to instructions of main controller 20. Main controller 20 activates each vacuum pad $\mathbf{58}_n$ to fix each arm $\mathbf{56}_n$ to a main frame (not shown) by suction after rotation adjustment of arm $\mathbf{56}_n$. Thus, the state of each arm $\mathbf{56}_n$ after rotation angle adjustment, that is, a desired positional relation between primary alignment system AU and four secondary alignment systems AL$\mathbf{2}_1$ to AL$\mathbf{2}_4$ is maintained.

Incidentally, in the case a portion of the main frame facing arm $\mathbf{56}_n$ is a magnetic body, an electromagnet may also be employed instead of vacuum pad 58.

In the embodiment, as each of primary alignment system AL1 and four secondary alignment systems AL$\mathbf{2}_1$ to AL$\mathbf{2}_4$, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems AL$\mathbf{2}_1$ to AL$\mathbf{2}_4$ is supplied to main controller 20 in FIG. 6, via an alignment signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, in the embodiment, five alignment systems AL1 and AL$\mathbf{2}_1$ to AL$\mathbf{2}_4$ are to be fixed to the lower surface of the main frame that holds projection unit PU, via support member 54 or arm $\mathbf{56}_n$. However, the present invention is not limited to this, and for example, the five alignment systems may also be arranged on the measurement frame described earlier.

Next, a configuration of interferometer system 118 (refer to FIG. 6), which measures the positional information of wafer stage WST and measurement stage MST, will be described.

Interferometer system 118 includes a Y interferometer 16, X interferometers 126, 127, and 128, and Z interferometers 43A and 43B for position measurement of wafer stage WST, and a Y interferometer 18 and an X interferometer 130 for position measurement of measurement stage MST, as shown in FIG. 2. By severally irradiating a measurement beam on reflection surface 17*a* and reflection surface 17*b* of wafer table WTB and receiving a reflected light of each beam, Y interferometer 16 and X interferometers 126, 127, and 128 (X interferometers 126 to 128 are not shown in FIG. 1, refer to FIG. 2) measure a displacement of each reflection surface from a reference position (for example, a fixed mirror is placed on the side surface of projection unit PU, and the surface is used as a reference surface), or more specifically, measure the positional information of wafer stage WST within the XY plane, and the positional information that has been measured is supplied to main controller 20. In the embodiment, as it will be described later on, as each interferometer a multiaxial interferometer that has a plurality of measurement axes is used with an exception for a part of the interferometers.

Meanwhile, to the side surface on the −Y side of stage main section 91, a movable mirror 41 having the longitudinal direction in the X-axis direction is attached via a kinematic support mechanism (not shown), as shown in FIGS. 4A and 4B. Movable mirror 41 is made of a member which is like a rectangular solid member integrated with a pair of triangular prisms adhered to a surface (the surface on the −Y side) of the rectangular solid member. As it can be seen from FIG. 2, movable mirror 41 is designed so that the length in the X-axis direction is longer than reflection surface 17*a* of wafer table WTB by at least the spacing between the two Z interferometers which will be described later.

To the surface on the −Y side of movable mirror 41, mirror-polishing is applied, and three reflection surfaces 41*b*, 41*a*, and 41*c* are formed, as shown in FIG. 4B. Reflection surface 41*a* configures a part of the edge surface on the −Y side of movable mirror 41, and reflection surface 41*a* is parallel with the XZ plane and also extends in the X-axis direction. Reflection surface 41*b* configures a surface adjacent to reflection surface 41*a* on the +Z side, forming an obtuse angle to reflection surface 41*a*, and spreading in the X-axis direction. Reflection surface 41*c* configures a surface adjacent to the −Z side of reflection surface 41*a*, and is arranged symmetrically with reflection surface 41*b*, with reflection surface 41*b* in between.

A pair of Z interferometers 43A and 43B (refer to FIGS. 1 and 2) that irradiates measurement beams on movable mirror 41 is arranged facing movable mirror 41.

As it can be seen when viewing FIGS. 1 and 2 together, Z interferometers 43A and 43B are placed apart on one side and the other side of Y interferometer 16 in the X-axis direction at a substantially equal distance and at positions slightly lower than Y interferometer 16, respectively.

From each of the Z interferometers 43A and 43B, as shown in FIG. 1, measurement beam B1 along the Y-axis direction is irradiated toward reflection surface 41*b*, and measurement beam B2 along the Y-axis direction is irradiated toward reflection surface 41*c* (refer to FIG. 4B). In the embodiment, fixed mirror 47B having a reflection surface orthogonal to measurement beam B1 reflected off reflection surface 41*b* and a fixed mirror 47A having a reflection surface orthogonal to measurement beam B2 reflected off reflection surface 41*c* are arranged, each extending in the X-axis direction at a position distanced apart from movable mirror 41 in the −Y-direction by a predetermined distance in a state where the fixed mirrors do not interfere with measurement beams B1 and B2.

Fixed mirrors 47A and 47B are supported, for example, by the same support body (not shown) arranged in the frame (not shown) which supports projection unit PU.

Figure 8:
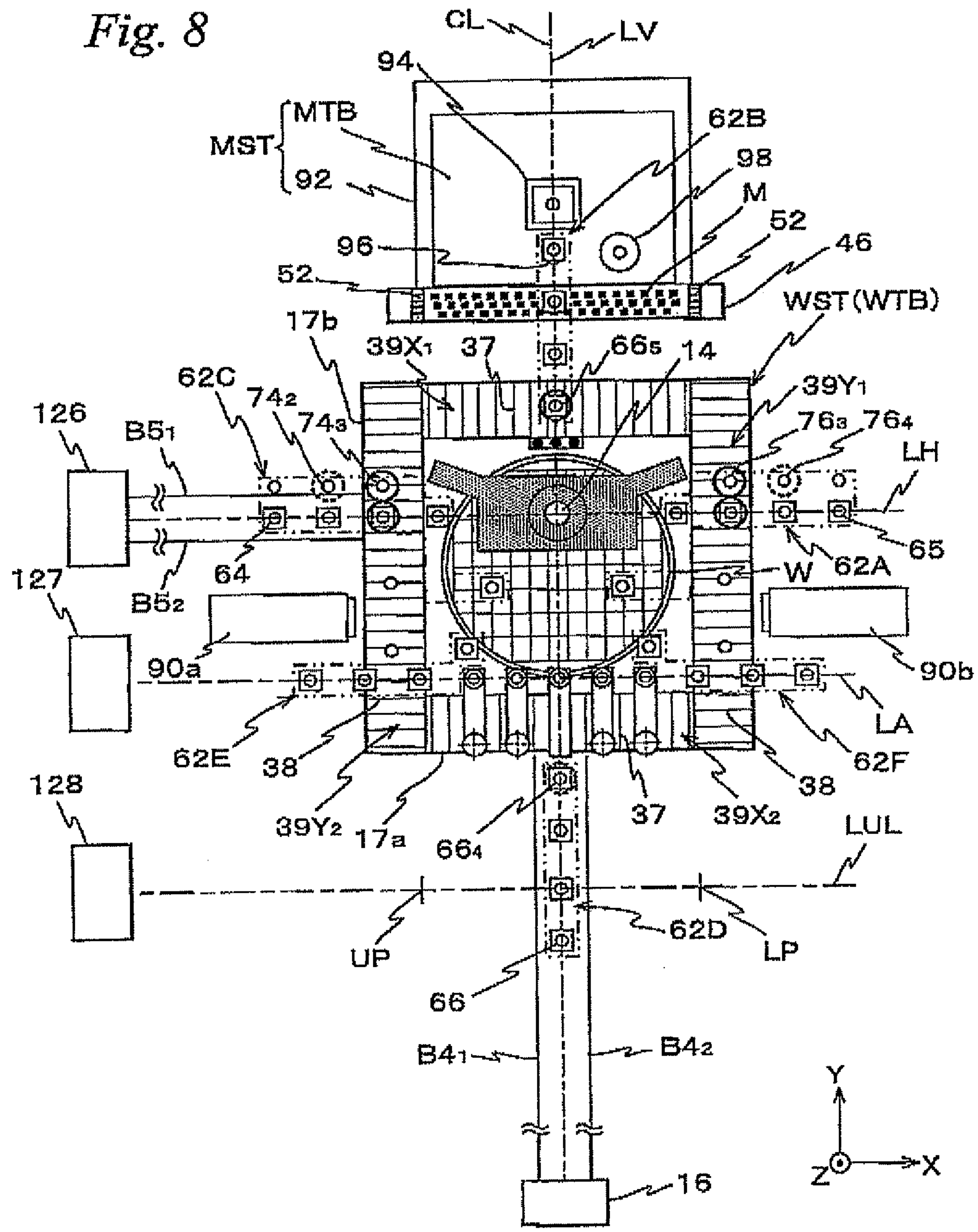
FIG. 8 is a view for explaining the placement of interferometers and position measurement of wafer stage WST by the interferometers at the time of exposure.

Y interferometer 16, as shown in FIG. 8 (and FIG. 2), irradiates measurement beams B$\mathbf{4}_1$ and B$\mathbf{4}_2$ on reflection surface 17*a* of wafer table WTB along a measurement axis in the Y-axis direction spaced apart by an equal distance to the −X side and the +X side from reference axis LV previously described, and by receiving each reflected light, detects the position of wafer table WTB in the Y-axis direction (a Y position) at the irradiation point of measurement beams B$\mathbf{4}_1$ and B$\mathbf{4}_2$. Incidentally, in FIG. 1, measurement beams B$\mathbf{4}_1$ and B$\mathbf{4}_2$ are representatively shown as measurement beam B4.

Further, Y interferometer 16 irradiates a measurement beam B3 toward reflection surface 41*a* along a measurement axis in the Y-axis direction with a predetermined distance in the Z-axis direction spaced between measurement beams B$\mathbf{4}_1$ and B$\mathbf{4}_2$, and by receiving measurement beam B3 reflected off reflection surface 41*a*, detects the Y position of reflection surface 41*a* (more specifically wafer stage WST) of movable mirror 41.

Main controller 20 computes the Y position (or to be more precise, displacement $\Delta Y$ in the Y-axis direction) of reflection surface 17*a*, or more specifically, wafer table WTB (wafer stage WST), based on an average value of the measurement values of the measurement axes corresponding to measurement beams B$\mathbf{4}_1$ and B$\mathbf{4}_2$ of Y interferometer 16. Further, main controller 20 computes displacement (yawing amount) $\Delta\theta z^{(Y)}$ in the θz direction of wafer table WTB, based on a difference of the measurement values of the measurement axes corresponding to measurement beams B$\mathbf{4}_1$ and B$\mathbf{4}_2$. Further, main controller 20 computes displacement (pitching amount) $\Delta\theta x$ in the θx direction of wafer stage WST, based on the Y position (displacement $\Delta Y$ in the Y-axis direction) of reflection surface 17*a* and reflection surface 41*a*.

Further, as shown in FIGS. 8 and 2, X interferometer 126 irradiates measurement beams B$\mathbf{5}_1$ and B$\mathbf{5}_2$ on wafer table WTB along the dual measurement axes spaced apart from a straight line (a reference axis) LH in the X-axis direction that passes the optical axis of projection optical system PL by the same distance. And, based on the measurement values of the measurement axes corresponding to measurement beams B$\mathbf{5}_1$ and B$\mathbf{5}_2$, main controller 20 computes a position (an X position, or to be more precise, displacement AX in the X-axis direction) of wafer table WTB in the X-axis direction. Further, main controller 20 computes displacement (yawing amount) $\Delta\theta z^{(X)}$ of wafer table WTB in the θz direction from a difference of the measurement values of the measurement axes corresponding to measurement beams B$\mathbf{5}_1$ and B$\mathbf{5}_2$. Incidentally, $\Delta\theta z^{(X)}$ obtained from X interferometer 126 and $\Delta\theta z^{(Y)}$ obtained from Y interferometer 16 are equal to each other, and represents displacement (yawing amount) $\Delta\theta z$ of wafer table WTB in the θz direction.

Figure 9:
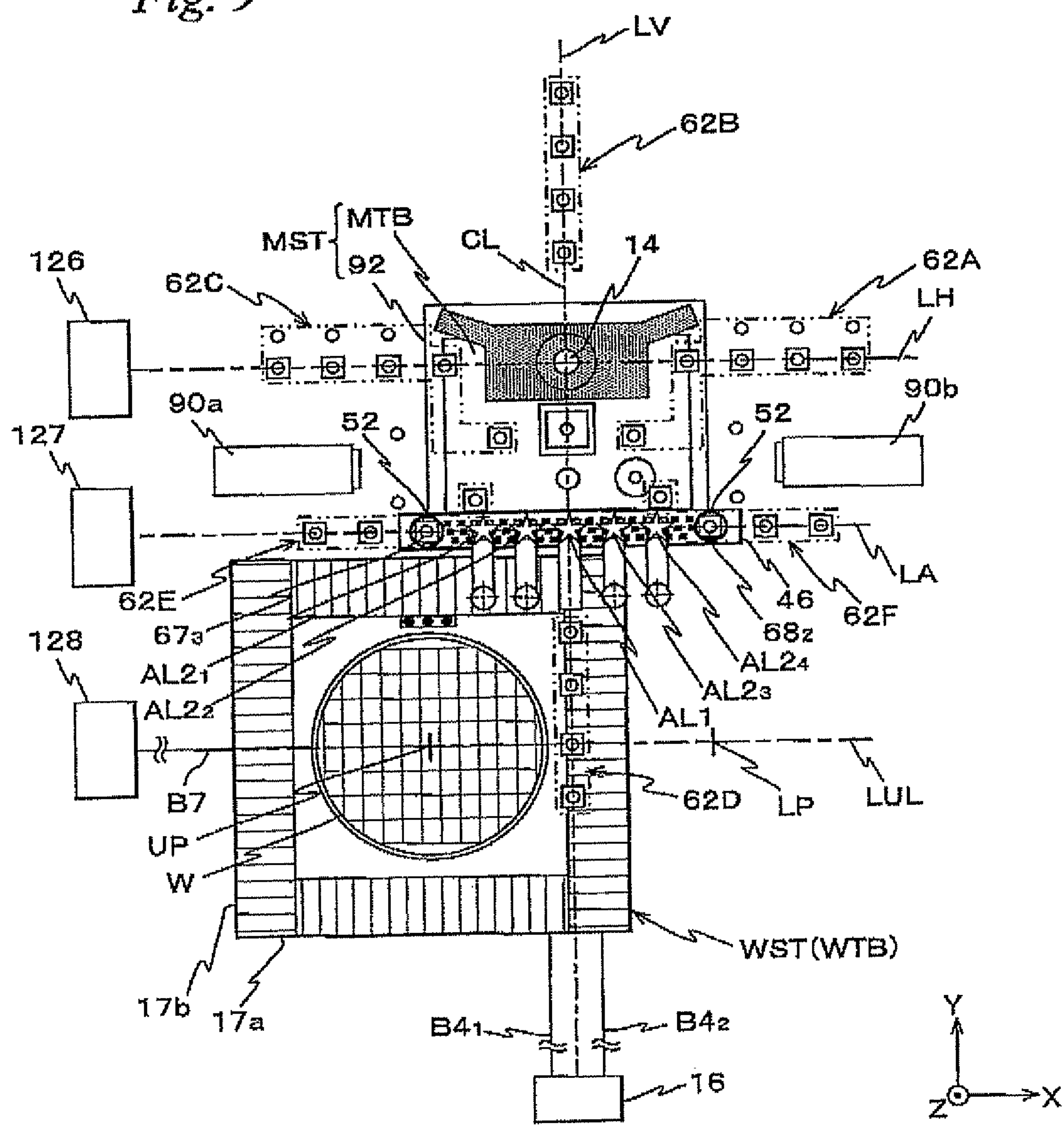
FIG. 9 is a view for explaining position measurement of wafer stage WST by the interferometers at the time of unloading of a wafer.
Figure 10:
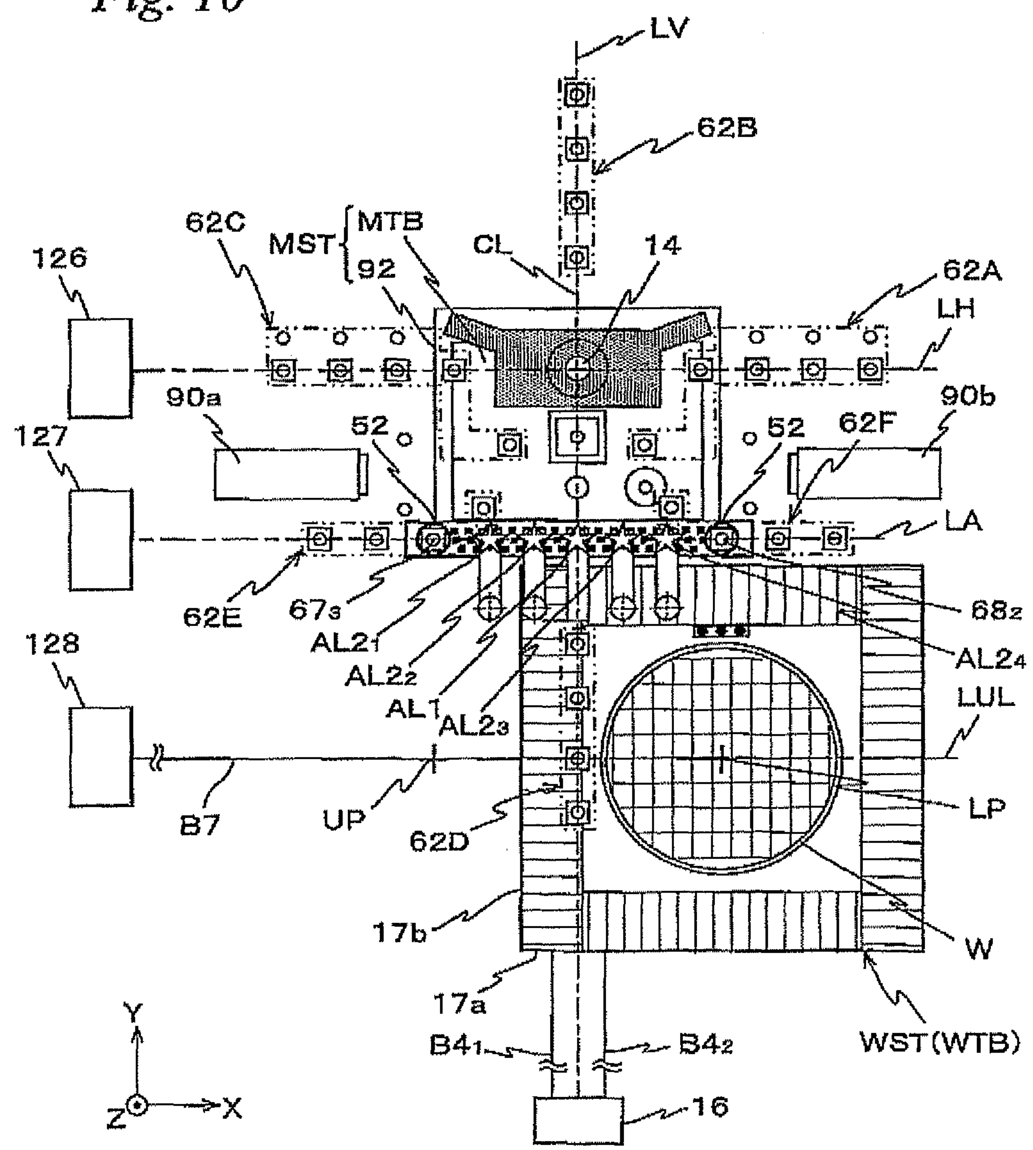
FIG. 10 is a view for explaining position measurement of wafer stage WST by the interferometers at the time of loading of a wafer.
Figure 11:
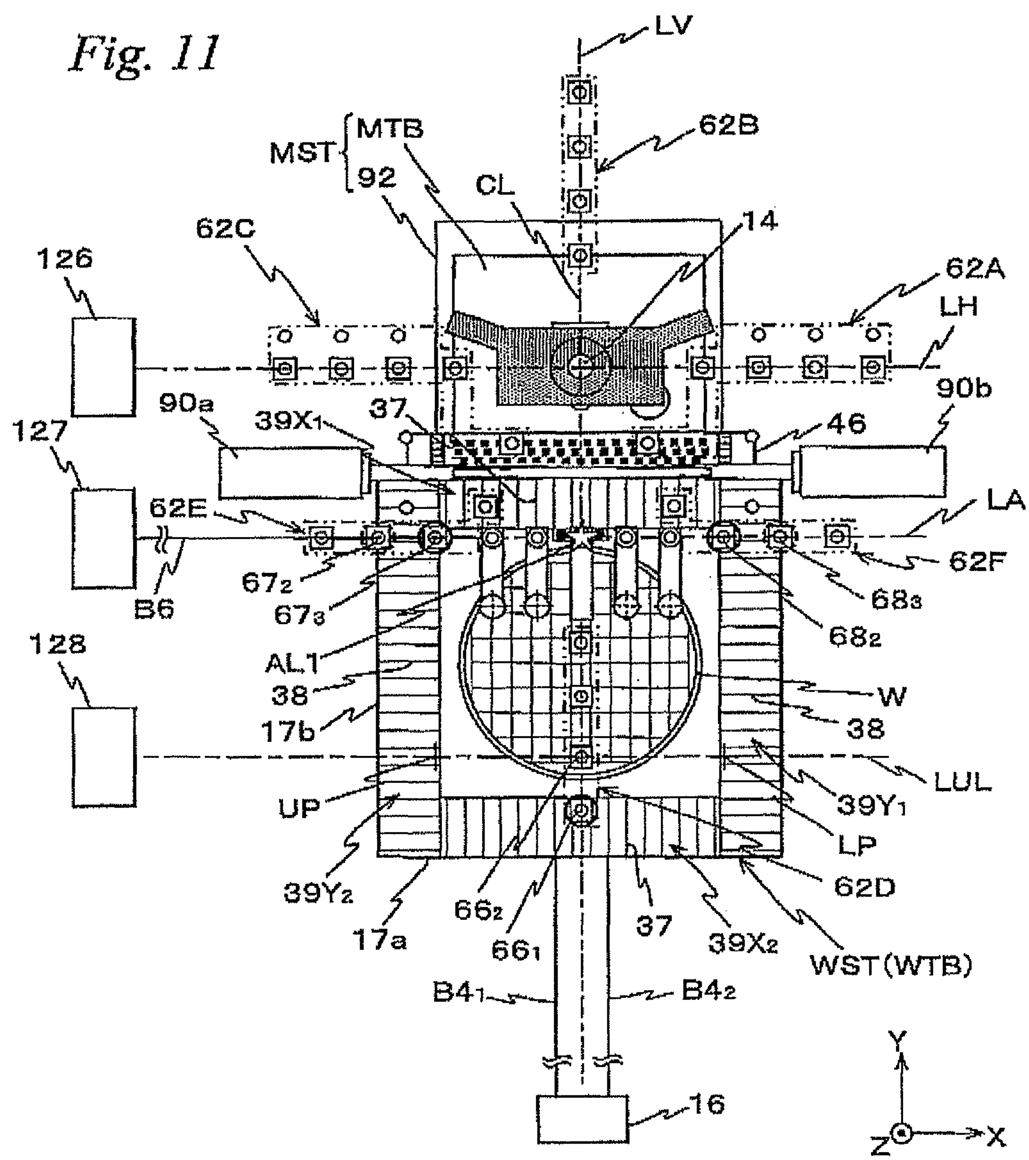
FIG. 11 is a view showing a relation between encoder heads and wafer stage WST at the time of switching from stage servo control by interferometers to stage servo control by encoders.
Figure 12:
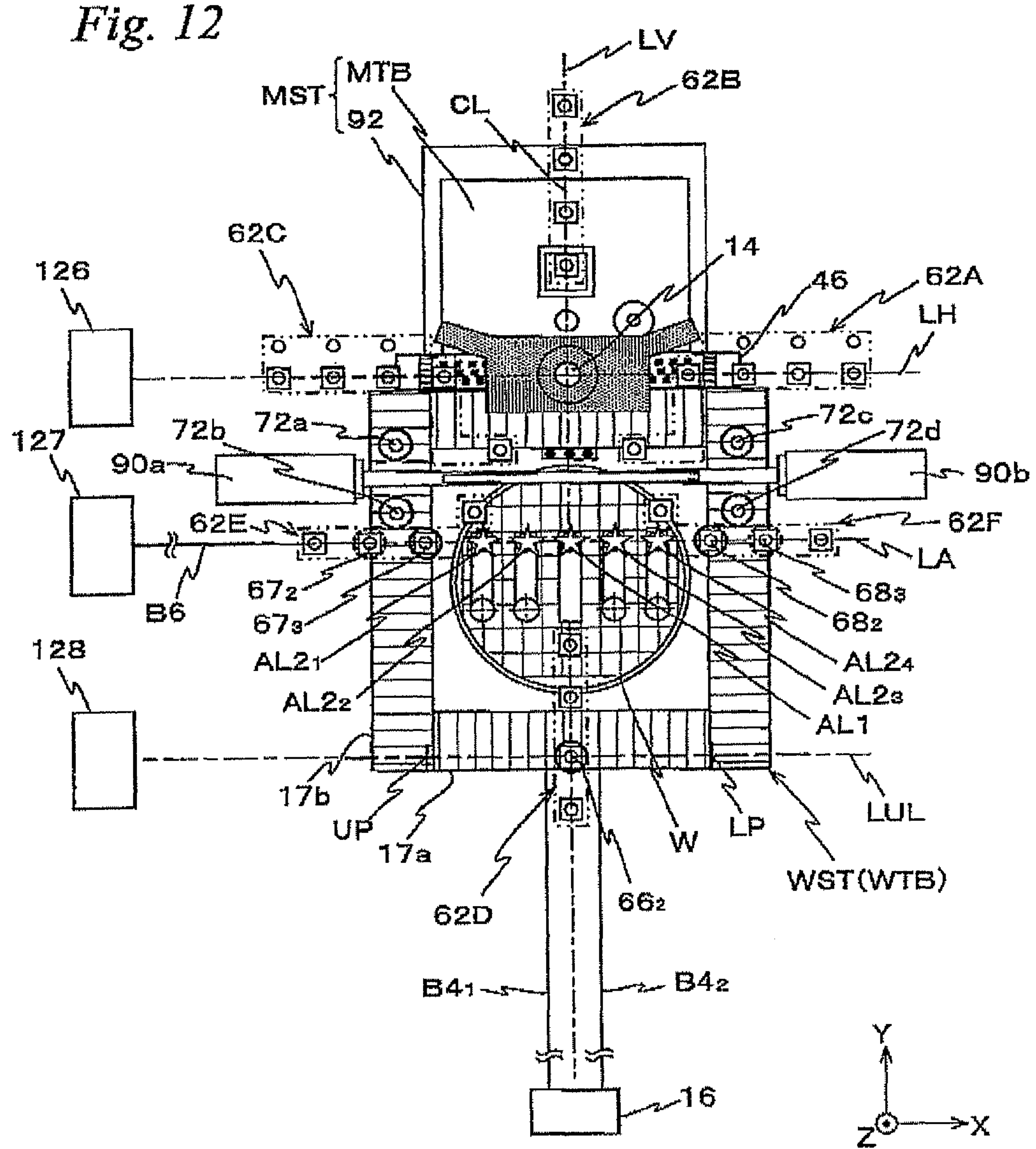
FIG. 12 is a view for explaining position measurement of wafer stage WST by the interferometers at the time of wafer alignment.

Further, as shown in FIGS. 9 and 10, a measurement beam B7 from X interferometer 128 is irradiated on reflection surface 17*b* of wafer table WTB along a straight line LUL, which is a line connecting an unloading position UP where unloading of the wafer on wafer table WTB is performed and a loading position LP where loading of the wafer onto wafer table WTB is performed and is parallel to the X-axis. Further, as shown in FIGS. 11 and 12, a measurement beam B6 from X interferometer 127 is irradiated on reflection surface 17*b* of wafer table WTB along a straight line (a reference axis) LA, which passes through the detection center of primary alignment system AL1 and is parallel to the X-axis.

Main controller 20 can obtain displacement $\Delta x$ of wafer table WTB in the X-axis direction from the measurement values of X interferometer 127 and the measurement values of X interferometer 128. However, the three X interferometers 126, 127, and 128 are placed differently regarding the Y-axis direction, and X interferometer 126 is used at the time of exposure as shown in FIG. 8, X interferometer 127 is used at the time of wafer alignment as shown in FIG. 12, and X interferometer 128 is used at the time of wafer unloading shown in FIG. 9 and wafer loading shown in FIG. 10.

From Z interferometers 43A and 43B previously described, measurement beams B1 and B2 that proceed along the Y-axis are irradiated toward movable mirror 41, respectively, as shown in FIG. 1. These measurement beams B1 and B2 are incident on reflection surfaces 41*b* and 41*c* of movable mirror 41, respectively, at a predetermined angle of incidence (the angle is to be θ/2). Then, measurement beam B1 is sequentially reflected by reflection surfaces 41*b* and 41*c*, and then is incident perpendicularly on the reflection surface of fixed mirror 47B, whereas measurement beam B2 is sequentially reflected by reflection surfaces 41*c* and 41*b* and is incident perpendicularly on the reflection surface of fixed mirror 47A. Then, measurement beams B2 and B1 reflected off the reflection surface of fixed mirrors 47A and 47B are sequentially reflected by reflection surfaces 41*b* and 41*c* again, or are sequentially reflected by reflection surfaces 41*c* and 41*b* again (returning the optical path at the time of incidence oppositely), and then are received by Z interferometers 43A and 43B.

In this case, when displacement of movable mirror 41 (more specifically, wafer stage WST) in the Z-axis direction is $\Delta Zo$ and displacement in the Y-axis direction is $\Delta Yo$, an optical path length change $\Delta L1$ of measurement beam B1 and an optical path length change $\Delta L2$ of measurement beam B2 can respectively be expressed as in formulas (1) and (2) below.

$$\Delta L1=\Delta YoX(1+\cos\theta)+\Delta ZoX\sin\theta \quad (1)$$

$$\Delta L2=\Delta YoX(1+\cos\theta)-\Delta ZoX\sin\theta \quad (2)$$

Accordingly, from formulas (1) and (2), $\Delta Zo$ and $\Delta Yo$ can be obtained using the following formulas (3) and (4).

$$\Delta Zo=(\Delta L1-\Delta L2)/2\sin\theta \quad (3)$$

$$\Delta Yo=(\Delta L1+\Delta L2)/\{2(1+\cos\theta)\} \quad (4)$$

Displacements $\Delta Zo$ and $\Delta Yo$ above can be obtained with Z interferometers 43A and 43B. Therefore, displacement which is obtained using Z interferometer 43A is to be $\Delta ZoR$ and $\Delta YoR$, and displacement which is obtained using Z interferometer 43B is to be $\Delta ZoL$ and $\Delta YoL$. And the distance between measurement beams B1 and B2 of Z interferometers 43A and 43B, respectively, in the X-axis direction, is to be expressed as D (refer to FIG. 2). Under such premises, displacement (yawing amount) $\Delta\theta z$ of movable mirror 41 (more specifically, wafer stage WST) in the θz direction and displacement (rolling amount) 40*y* in the θy direction can be obtained by the following formulas (5) and (6).

$$\Delta\theta z=\tan^{-1}\{(\Delta YoR-\Delta YoL)/D\} \quad (5)$$

$$\Delta\theta y=\tan^{-1}\{(\Delta ZoL-\Delta ZoR)/D\} \quad (6)$$

Accordingly, by using the formulas (3) to (6) above, main controller 20 can compute displacement of wafer stage WST in four degrees of freedom, $\Delta Zo$, $\Delta Yo$, $\Delta\theta z$, and $\Delta\theta y$, based on the measurement results of Z interferometers 43A and 43B.

In the manner described above, from the measurement results of interferometer system 118, main controller 20 can obtain displacement of wafer stage WST in directions of six degrees of freedom (Z, X, Y, θz, θx, and θy directions).

Incidentally, in the embodiment, the case has been described where wafer stage WST is configured of a single stage that can move in six degrees of freedom which includes stage main section 91 and wafer table WTB mounted on stage main section 91, however, the present invention is not limited to this, and wafer stage WST can be configured including stage main section 91 which can move freely in the XY plane, and wafer table WTB that can be finely driven relative to the stage main section at least in the Z-axis direction, the θx direction, and the θy direction. Further, instead of reflection surface 17*a* and reflection surface 17*b*, a movable mirror consisting of a plane mirror can be arranged in wafer table WTB. Furthermore, positional information of wafer stage WST was to be measured with a reflection surface of a fixed mirror arranged in projection unit PU serving as a reference surface, however, the position to place the reference surface at is not limited to projection unit PU, and the fixed mirror does not always have to be used to measure the positional information of wafer stage WST.

In the embodiment, however, position information within the XY plane (including the rotation information in the Δz direction) for position control of wafer stage WST (wafer table WTB) is mainly measured by an encoder system (to be described later), and the measurement values of interferometers 16, 126, and 127 are secondarily used in cases such as when long-term fluctuation (for example, by temporal deformation or the like of the scales) of the measurement values of the encoder system is corrected (calibrated).

Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Further, in the embodiment, positional information of wafer stage WST measured by interferometer system 118 is not used in the exposure operation and the alignment operation which will be described later on, and was mainly to be used in calibration operations (more specifically, calibration of measurement values) of the encoder system, however, the measurement information (more specifically, at least one of the positional information in directions of six degrees of freedom) of interferometer system 118 can be used in the exposure operation and/or the alignment operation. Further, using interferometer system 118 as a backup of an encoder system can also be considered, which will be explained in detail later on. In the embodiment, the encoder system measures positional information of wafer stage WST in directions of three degrees of freedom, or more specifically, the X-axis, the Y-axis, and the θz direction. Therefore, in the exposure operation and the like, of the measurement information of interferometer system 118, positional information related to a direction that is different from the measurement direction (the X-axis, the Y-axis, and the θz direction) of wafer stage WST by the encoder system, such as, for example, only the positional information related to at least one direction among the Z-axis direction, the θx direction, and the θy direction can be used, or in addition to the positional information in the different direction, positional information related to the same direction (more specifically, at least one of the X-axis, the Y-axis, and the θz directions) as the measurement direction of the encoder system can also be used. Further, in the exposure operation and the like, the positional information of wafer stage WST in the Z-axis direction measured using interferometer system 118 can be used.

In addition, interferometer system 118 (refer to FIG. 6) includes a Y interferometer 18 and an X interferometer 130 for measuring the two-dimensional position coordinates of measurement table MTB. Y interferometer 18 and X interferometer 130 (X interferometer 130 is not shown in FIG. 1, refer to FIG. 2) irradiate measurement beams on reflection surfaces 19*a* and 19*b* as shown in FIG. 2, and measure the displacement from a reference position of each reflection surface by receiving the respective reflected lights. Main controller 20 receives the measurement values of Y interferometer 18 and X interferometer 130, and computes the positional information (for example, including at least the positional information in the X-axis and the Y-axis directions and rotation information in the θz direction) of measurement stage MST.

Incidentally, as the Y interferometer used for measuring measurement table MTB, a multiaxial interferometer which is similar to Y interferometer 16 used for measuring wafer table WTB can be used. Further, as the X interferometer used for measuring measurement table MTB, a two-axis interferometer which is similar to X interferometer 126 used for measuring wafer table WTB can be used. Further, in order to measure Z displacement, Y displacement, yawing amount, and rolling amount of measurement stage MST, interferometers similar to Z interferometers 43A and 43B used for measuring wafer table WTB can be introduced.

Next, the structure and the like of encoder system 150 (refer to FIG. 6) which measures positional information (including rotation information in the θz direction) of wafer table WTB in the XY plane will be described.

In exposure apparatus 100 of the embodiment, as shown in FIG. 3, four head units 62A to 62D of encoder system 150 are placed in a state of surrounding nozzle unit 32 on all four sides. In actual, head units 62A to 62D are fixed to the foregoing main frame that holds projection unit PU in a suspended state via a support member, although omitted in the drawings such as FIG. 3 from the viewpoint of avoiding intricacy of the drawings.

As shown in FIG. 3, head units 62A and 62C are placed on the +X side and the −X side of projection unit PU, with the X-axis direction serving as a longitudinal direction. Head units 62A and 62C are each equipped with a plurality of (five, in this case) Y heads $\mathbf{65}_1$ to $\mathbf{65}_5$ and $\mathbf{64}_1$ to $\mathbf{64}_5$ that are placed at a distance WD in the X-axis direction. More particularly, head units 62A and 62C are each equipped with a plurality of (four, in this case) Y heads ($\mathbf{65}_2$ to $\mathbf{65}_5$ or $\mathbf{64}_1$ to $\mathbf{64}_4$) that are placed on reference axis LH previously described at distance WD except for the periphery of projection unit PU, and a Y head ($\mathbf{65}_1$ or $\mathbf{64}_5$) which is placed at a position a predetermined distance away in the −Y-direction from reference axis LH in the periphery of projection unit PU, or more specifically, on the −Y side of nozzle unit 32. Head units 62A and 62C are each also equipped with three Z heads which will be described later on. Hereinafter, Y heads $\mathbf{65}_1$ to $\mathbf{65}_5$ and $\mathbf{64}_1$ to $\mathbf{64}_5$ will also be described as Y heads 65 and 64, respectively, as necessary.

Head unit 62A constitutes a multiple-lens (five-lens, in this case) Y linear encoder (hereinafter appropriately shortened to "Y encoder" or "encoder") 70A (refer to FIG. 6) that measures the position of wafer stage WST (wafer table WTB) in the Y-axis direction (the Y-position) using Y scale $\mathbf{39}\mathrm{Y}_1$ previously described. Similarly, head unit 62C constitutes a multiple-lens (five-lens, in this case) Y linear encoder 70C (refer to FIG. 6) that measures the Y-position of wafer stage WST (wafer table WTB) using Y scale $\mathbf{39}\mathrm{Y}_2$ described above. In this case, distance WD in the X-axis direction of the five Y heads (64 or 65) (more specifically, measurement beams) that head units 62A and 62C are each equipped with, is set slightly narrower than the width (to be more precise, the length of grid line 38) of Y scales $\mathbf{39}\mathrm{Y}_1$ and $\mathbf{39}\mathrm{Y}_2$ in the X-axis direction.

As shown in FIG. 3, head unit 62B is placed on the +Y side of nozzle unit 32 (projection unit PU), and is equipped with a plurality of, in this case, four X heads $\mathbf{66}_5$-$\mathbf{66}_8$ that are placed on reference axis LV along Y-axis direction at distance WD. Further, head unit 62D is placed on the −Y side of primary alignment system AL1, on the opposite side of head unit 62B via nozzle unit 32 (projection unit PU), and is equipped with a plurality of, in this case, four X heads $\mathbf{66}_1$-$\mathbf{66}_4$ that are placed on reference axis LV at distance WD. Hereinafter, X heads $\mathbf{66}_1$ to $\mathbf{66}_8$ will also be described as X head 66, as necessary.

Head unit 62B constitutes a multiple-lens (four-lens, in this case) X linear encoder (hereinafter, shortly referred to as an "X encoder" or an "encoder" as needed) 70B (refer to FIG. 6) that measures the position in the X-axis direction (the X-position) of wafer stage WST (wafer table WTB) using X scale $\mathbf{39}\mathrm{X}_1$ described above. Further, head unit 62D constitutes a multiple-lens (four-lens, in this case) X encoder 70D (refer to FIG. 6) that measures the X-position of wafer stage WST (wafer table WTB) using X scale $\mathbf{39}\mathrm{X}_2$ described above.

Here, the distance between adjacent X heads 66 (measurement beams) that are equipped in each of head units 62B and 62D is set shorter than a width in the Y-axis direction of X scales $\mathbf{39}\mathrm{X}_1$ and $\mathbf{39}\mathrm{X}_2$ (to be more accurate, the length of grid line 37). Further, the distance between X head $\mathbf{66}_5$ of head unit 62B farthest to the −Y side and X head $\mathbf{66}_4$ of head unit 62D farthest to the +Y side is set slightly narrower than the width of wafer stage WST in the Y-axis direction so that switching (linkage described below) becomes possible between the two X heads by the movement of wafer stage WST in the Y-axis direction.

In the embodiment, furthermore, head units 62F and 62E are respectively arranged a predetermined distance away on the −Y side of head units 62A and 62C. Although illustration of head units 62E and 62F is omitted in FIG. 3 and the like from the viewpoint of avoiding intricacy of the drawings, in actual practice, head units 62E and 62F are fixed to the foregoing main frame that holds projection unit PU in a suspended state via a support member. Incidentally, for example, in the case projection unit PU is supported in a suspended state, head units 62E and 62F, and head units 62A to 62D which are previously described can be supported in a suspended state integrally with projection unit PU, or can be arranged at the measurement frame described above.

Head unit 62E is equipped with four Y heads $\mathbf{67}_1$ to $\mathbf{67}_4$ whose positions in the X-axis direction are different. More particularly, head unit 62E is equipped with three Y heads $\mathbf{67}_1$ to $\mathbf{67}_3$ placed on the −X side of the secondary alignment system $\mathrm{AL}\mathbf{2}_1$ on reference axis LA previously described at substantially the same distance as distance WD previously described, and one Y head $67_4$ which is placed at a position a predetermined distance (a distance slightly shorter than WD) away on the +X side from the innermost (the +X side) Y head $67_3$ and is also on the +Y side of the secondary alignment system AL$2_1$ a predetermined distance away to the +Y side of reference axis LA.

Head unit 62F is symmetrical to head unit 62E with respect to reference axis LV, and is equipped with four Y heads $68_1$ to $68_4$ which are placed in symmetry to four Y heads $67_1$ to $67_4$ with respect to reference axis LV. Hereinafter, Y heads $67_1$ to $67_4$ and $68_1$ to $68_4$ will also be described as Y heads 67 and 68, respectively, as necessary. In the case of an alignment operation and the like which will be described later on, at least one each of Y heads 67 and 68 faces Y scale 39$Y_2$ and 39$Y_1$, respectively, and by such Y heads 67 and 68 (more specifically, Y encoders 70E and 70F which are configured by these Y heads 67 and 68) (refer to FIG. 6), the Y position (and the θz rotation) of wafer stage WST is measured.

Further, in the embodiment, at the time of baseline measurement (Sec-BCHK (interval)) and the like of the secondary alignment system AL$2_1$ which will be described later on, Y head $67_3$ and $68_2$ which are adjacent to the secondary alignment systems AL$2_1$ and AL$2_4$ in the X-axis direction face the pair of reference gratings 52 of FD bar 46, respectively, and by Y heads $67_2$ and $68_2$ that face the pair of reference gratings 52, the Y position of FD bar 46 is measured at the position of each reference grating 52. In the description below, the encoders configured by Y heads $67_3$ and $68_2$ which face a pair of reference gratings 52, respectively, are referred to as Y linear encoders (also shortly referred to as a "Y encoder" or an "encoder" as needed) 70$E_2$ and 70$F_2$. Further, for identification, Y encoders 70E and 70F configured by Y heads 67 and 68 that face Y scales 39$Y_2$ and 39$Y_1$ described above, respectively, will be referred to as Y encoders 70$E_1$ and 70$F_1$.

The linear encoders 70A to 70F described above measure the position coordinates of wafer stage WST at a resolution of, for example, around 0.1 nm, and the measurement values are supplied to main controller 20. Main controller 20 controls the position within the XY plane of wafer table WTB based on three measurement values of linear encoders 70A to 70D or on three measurement values of encoders 70B, 70D, 70$E_1$ and 70$F_1$, and also controls the rotation in the θz direction of FD bar 46 based on the measurement values of linear encoders 70$E_2$ and 70$F_2$. Incidentally, the configuration and the like of the linear encoder will be described further later in the description.

In exposure apparatus 100 of the embodiment, as shown in FIG. 3, a multipoint focal position detecting system (hereinafter, shortly referred to as a "multipoint AF system") by an oblique incident method is arranged, which is composed of an irradiation system 90*a* and a photodetection system 90*b*, having a configuration similar to the one disclosed in, for example, U.S. Pat. No. 5,448,332 description and the like. In the embodiment, as an example, irradiation system 90*a* is placed on the +Y side of the −X end portion of head unit 62E previously described, and photodetection system 90*b* is placed on the +Y side of the +X end portion of head unit 62F previously described in a state opposing irradiation system 90*a*.

A plurality of detection points of the multipoint AF system (90*a*, 90*b*) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90*a* and photodetection system 90*b*. Since the length of detection area AF in the X-axis direction is set to around the same as the diameter of wafer W, position information (surface position information) in the Z-axis direction across the entire surface of wafer W can be measured by only scanning wafer W in the Y-axis direction once. Further, since detection area AF is placed between liquid immersion area 14 (exposure area IA) and the detection areas of the alignment systems (AL1, AL$2_1$ to AL$2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, the plurality of detection points are to be placed in one row and M columns, or two rows and N columns, but the number(s) of rows and/or columns is/are not limited to these numbers. However, in the case the number of rows is two or more, the positions in the X-axis direction of detection points are preferably made to be different between the different rows. Moreover, the plurality of detection points is to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the vicinity of detection points located at both ends out of a plurality of detection points of the multipoint AF system (90*a*, 90*b*), that is, in the vicinity of both end portions of beam area AF, heads 72*a* and 72*b*, and 72*c* and 72*d* of surface position sensors for Z position measurement (hereinafter, shortly referred to as "Z heads") are arranged each in a pair, in symmetrical placement with respect to reference axis LV. Z heads 72*a* to 72*d* are fixed to the lower surface of a main frame (not shown). Incidentally, Z heads 72*a* to 72*d* may also be arranged on the measurement frame described above or the like.

As Z heads 72*a* to 72*d*, a sensor head that irradiates a light to wafer table WTB from above, receives the reflected light and measures position information of the wafer table WTB surface in the Z-axis direction orthogonal to the XY plane at the irradiation point of the light, as an example, a head of an optical displacement sensor (a sensor head by an optical pickup method), which has a configuration like an optical pickup used in a CD drive device, is used.

In the embodiment, as each Z head, a configuration is employed where the diffraction grating surfaces of Y scales 39$Y_1$, 39$Y_2$ and the like are observed from above (the +Z direction) as in the encoder. Accordingly, by measuring the surface position information of the upper surface of wafer table WTB at different positions with the plurality of Z heads, the position of wafer table WTB in the Z-axis direction and at least the θy rotation (rolling) can be measured.

Furthermore, head units 62A and 62C previously described are equipped with Z heads $76_j$ (j=3-5) and $74_i$ (i=1-3), which are three heads each, respectively, at the same X position as Y heads $65_j$ (j=3-5) and $64_i$ (i=1-3) that head units 62A and 62C are respectively equipped with, with the Y position shifted. In this case, Z heads $76_j$ and $74_i$, which are three heads each, belonging to head units 62A and 62C, respectively, are placed parallel to reference axis LH a predetermined distance away in the +Y direction from reference axis LH and also symmetric to each other with respect to reference axis LV. Incidentally, as each of the Z heads $76_j$ and $74_j$, an optical displacement sensor head similar to Z heads 72*a* to 72*d* described above is employed.

In this case, Z heads $74_3$ is on a straight line parallel to the Y-axis, the same as is with Z heads 72*a* and 72*b* previously described. Similarly, Z head $76_3$ is on a straight line parallel to the Y-axis, the same as is with Z heads 72*c* and 72*d* previously described.

Z heads 72*a* to 72*d*, Z heads $74_1$ to $74_3$, and Z heads $76_3$ to $76_5$ connect to main controller 20 via a signal processing/selection device 170 as shown in FIG. 6, and main controller 20 selects an arbitrary Z head from Z heads 72*a* to 72*d*, Z heads $74_1$ to $74_3$, and Z heads $76_3$ to $76_5$ via signal processing/selection device 170 and makes the head move into an operating state, and then receives the surface position information detected by the Z head which is in an operating state via signal processing/selection device 170. In the embodiment, a surface position measurement system 180 (a part of measurement system 200) that measures positional information of wafer table WTB in the Z-axis direction and the direction of inclination with respect to the XY plane is configured, including Z heads 72*a* to 72*d*, Z heads $74_1$ to $74_3$, and Z heads $76_3$ to $76_5$, and signal processing/selection device 170.

Incidentally, in FIG. 3, measurement stage MST is omitted and a liquid immersion area that is formed by water Lq held in the space between measurement stage MST and tip lens 191 is shown by a reference code 14. Further, as shown in FIG. 3, in the embodiment, unloading position UP and loading position LP are set symmetrically with respect to reference axis LV. However, as well as this, unloading position UP and loading position LP can be at the same position.

FIG. 6 shows the main configuration of the control system of exposure apparatus 100. The control system is mainly configured of main controller 20 composed of a microcomputer (or workstation) that performs overall control of the entire apparatus. In memory 34 which is an external memory connected to main controller 20, correction information is stored of measurement instrument systems such as interferometer system 118, encoder system 150 (encoders 70A to 70F), Z heads 72*a* to 72*d*, $74_1$ to $74_3$, $76_3$ to $76_5$ and the like. Incidentally, in FIG. 6, various sensors such as irregular illuminance sensor 94, aerial image measuring instrument 96 and wavefront aberration measuring instrument 98 that are arranged at measurement stage MST are collectively shown as a sensor group 99.

Figure 7A:
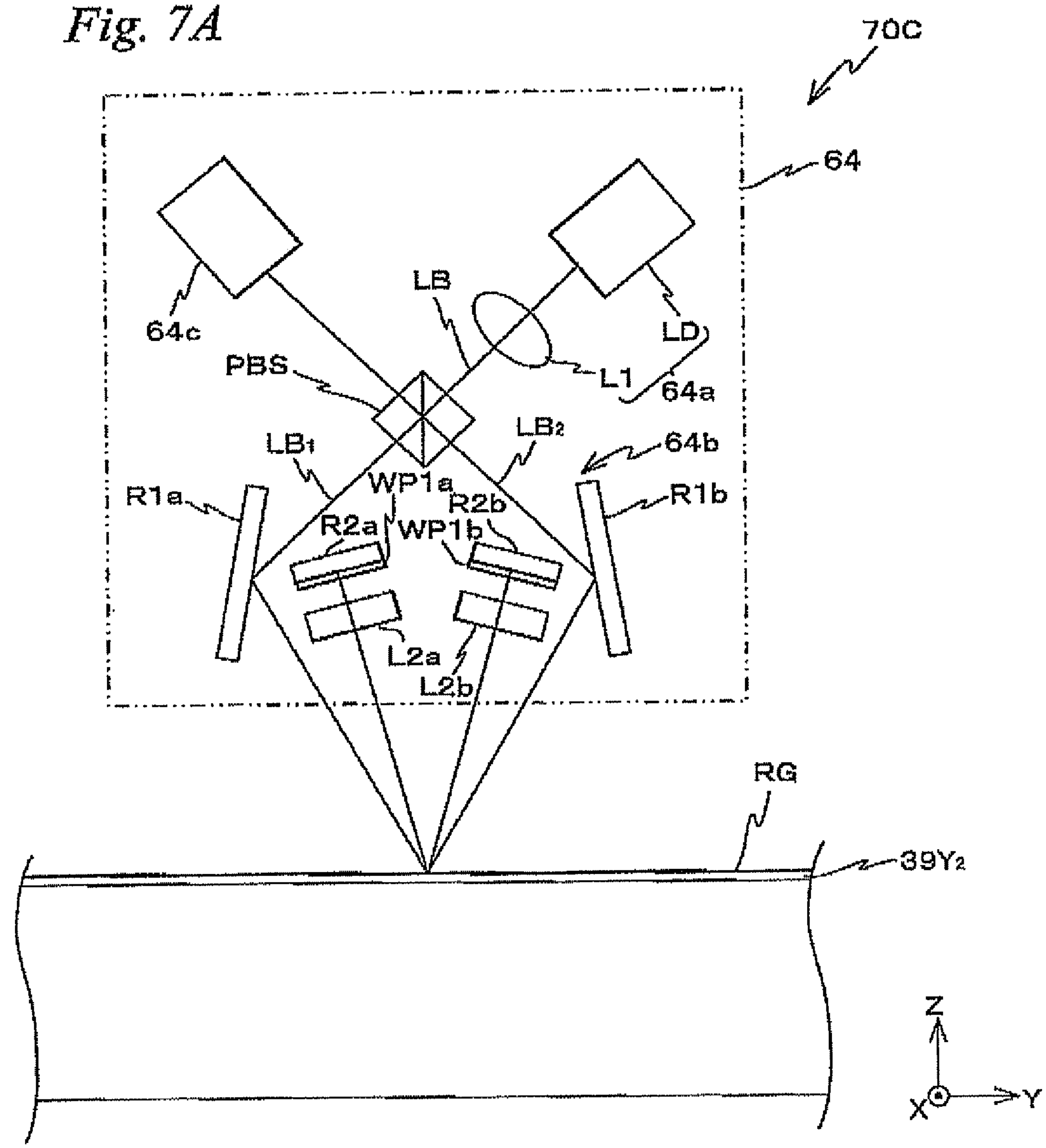
FIG. 7A is a view showing an example of a configuration of an encoder.

Next, the configuration and the like of encoders 70A to 70F will be described, focusing on Y encoder 70C that is enlargedly shown in FIG. 7A as a representative. FIG. 7A shows one Y head 64 of head unit 62C that irradiates a detection light (measurement beam) to Y scale $\mathbf{39}Y_2$.

Y head 64 is mainly composed of three sections, which are an irradiation system 64*a*, an optical system 64*b* and a photodetection system 64*c*.

Irradiation system 64*a* includes a light source that emits a laser beam LB in a direction inclined at an angel of 45 degrees with respect to the Y-axis and Z-axis, for example, a semiconductor laser LD, and a lens L1 that is placed on the optical path of laser beam LB emitted from semiconductor laser LD.

Optical system 64*b* is equipped with a polarization beam splitter PBS whose separation plane is parallel to an XZ plane, a pair of reflection mirrors R1*a* and R1*b*, lenses L2*a* and L2*b*, quarter wavelength plates (hereinafter, referred to as a λ/4 plate) WP1*a* and WP1*b*, refection mirrors R2*a* and R2*b*, and the like. In this case, reflection mirror R1*b* is placed at position symmetric to reflection mirror R1*a*, with a separation plane of polarization beam splitter PBS serving as a reference. Similarly, converging lens L2*a* and L2*b*, λ/4 plates WP1*a* and WP1*b*, and reflection mirrors R2*a* and R2*b* are also placed at positions symmetric to each other, with the separation plane of polarization beam splitter PBS serving as a reference.

Photodetection system 64*c* includes a polarizer (analyzer), a photodetector, and the like. Photodetection system 64*c* is placed on a return optical path of the reflection diffraction light of laser beam LB via the separation plane of polarization beam splitter PBS.

In Y encoder 70C, laser beam LB emitted from semiconductor laser LD is incident on polarization beam splitter PBS via lens L1, and is split by polarization into two beams $LB_1$ and $LB_2$. In this case, a P-polarization component of laser beam LB passes through polarization beam splitter PBS and becomes beam $LB_1$, and an S-polarization component is reflected off the separation plane of polarization beam splitter PBS and becomes beam $LB_2$, Beam $LB_1$ and $LB_2$ are reflected off reflecting mirrors R1*a* and R1*b*, respectively, and are incident on reflection grating RG.

Diffraction light is generated by beams $LB_1$ and $LB_2$ being irradiated on reflection grating RG. Of diffraction lights equal to or less than the −1st order generated by the irradiation of beam $LB_1$, for example, a diffraction light of the −1st order passes through converging lens L2*a* and λ/4 plate WP1*a*, and reaches reflection mirror R2*a*. However, the sign of the order of the diffraction light is defined so that the diffraction light diffracting in the +Y direction (−Y direction) is positive (negative), with a zero-order diffraction light reflected by the same angle as the incoming light serving as a reference, as it will be described later on. Then, the diffraction light is reflected by reflecting mirror R2*a*, and by tracing the same optical path as the outward path in the opposite direction, the light reaches reflection grating RG. In this case, by passing through λ/4 plate WP1*a* twice in the outward path and the return path, the polarization direction of the diffraction light rotates by 90 degrees, and the diffraction light is converted into S-polarization. Meanwhile, of the diffraction light equal to or more than the +1st order generated by the irradiation of beam $LB_2$ for example, a diffraction light of the +1st order passes through converging lens L2*b* and λ/4 plate WP1*b*, and reaches reflection mirror R2*b*. Then, the diffraction light is reflected by reflecting mirror R2*b*, and by tracing the same optical path as the outward path in the opposite direction, the light reaches reflection grating RG. In this case, by passing through λ/4 plate WP1*b* twice in the outward path and the return path, the polarization direction of the diffraction light rotates by 90 degrees, and the diffraction light is converted into P-polarization.

By the irradiation of the return diffraction light from reflection mirrors R2*a* and R2*b* on reflection grating RG, a diffraction light is generated again. Of the diffraction lights deriving from the return light from reflection mirror R2*a*, diffraction light of the same order as the return light is reflected by reflection mirror R1*a* and then reaches polarization beam splitter PBS. Meanwhile, of the diffraction lights deriving from the return light from reflection mirror R2*b*, diffraction light of the same order as the return light is reflected by reflection mirror R1*b* and then reaches polarization beam splitter PBS.

Return beams $LB_1$ and $LB_2$ that reach polarization beam splitter PBS are converted into S-polarization and P-polarization, respectively. Therefore, return beam $LB_1$ is reflected by the separation plane of polarization beam splitter PBS, and return beam $LB_2$ passes through polarization beam splitter PBS. Accordingly, return beams $LB_1$ and $LB_2$ are synthesized coaxially, and are incident on photodetection system 64*c*.

In the inside of photodetection system 64*c*, the polarization direction of return beams $LB_1$ and $LB_2$ is arranged by the analyzer and the beams overlap each other so as to form an interference light. This interference light is detected by the photodetector. In this case, when Y scale 39$Y_2$ (more specifically wafer stage WST) moves in the measurement direction (in this case, the Y-axis direction), phase difference between the two beams $LB_1$ and $LB_2$ changes as it will be described later on, which causes the intensity of the interference light to change. From this intensity change of the interference light, the positional relation between Y head 64 and Y scale 39$Y_2$ more specifically, the Y-coordinate of wafer stage WST is computed and is output as a measurement value of Y encoder 70C.

Incidentally, other Y heads 64 of head unit 62C, and each of the Y heads 65 belonging to head unit 62A are configured similarly as in the description above, and the heads face Y scale 39$Y_2$ or 39$Y_1$ and make up Y encoder 70C or 70A.

Further each of the X heads 66 belonging to head units 62B and 62D, respectively, are configured similarly to Y head 64 described above, and the heads face X scale 39$X_1$ or 39$X_2$ and make up X encoder 70B or 70D.

Further, each of the Y heads 67 and 68 belonging to head units 62E and 62F, respectively, are configured similarly to Y head 64 described above, and the heads face Y scale 39$Y_2$ or 39$Y_1$ and make up Y encoder 70$E_1$ or 70$F_1$. Further, Y heads 67$_3$ and 68$_3$ face the pair of reference gratings 52 on measurement stage MST, respectively, and make up Y encoders 70$E_2$ and 70$F_2$.

Figure 7B:
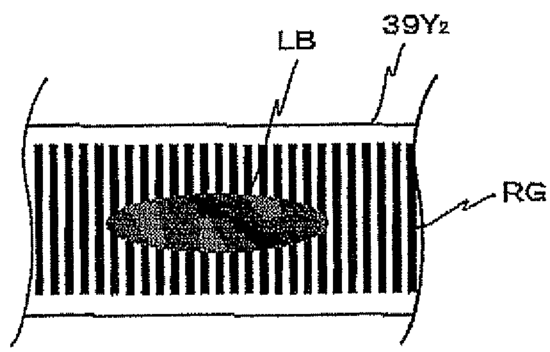
FIG. 7B is a view showing the case when a laser beam LB having a sectional shape extending narrowly in the periodic direction of grating RG is used as a detection light.

As each encoder, an encoder having a resolution of, for example, around 0.1 nm is used. Incidentally, in the encoders of the embodiment, as shown in FIG. 7B, laser beam LB having a sectional shape that is elongated in the periodic direction of diffraction grating RG may also be used, as a detection light. In FIG. 7B, beam LB is overdrawn largely compared to grating RG.

Incidentally, as another form of the encoder head, there is a type in which only optical system 64*b* is included in the encoder head and irradiation system 64*a* and photodetection system 64*c* are physically separate from optical system 64*b*. In the case of such a type, the laser beam is guided between these three sections, for example, via an optical fiber.

Next, a parallel processing operation that uses wafer stage WST and measurement stage MST in exposure apparatus 100 of the embodiment will be described, based on FIGS. 8 to 12. Incidentally, during the operation below, main controller 20 performs the open/close control of each valve of liquid supply unit 5 of local liquid immersion unit 8 and liquid recovery unit 6 in the manner previously described, and water is constantly filled on the outgoing surface side of tip lens 191 of projection optical system PL. However, in the description below, for the sake of simplicity, the explanation related to the control of liquid supply unit 5 and liquid recovery unit 6 will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used in the description so far. Further, in FIGS. 8 to 12, in order to avoid complication in the drawings, Z interferometers 43A and 43B, fixed mirrors 47A and 47B, and movable mirror 41 are omitted.

This exposure is performed by alternately repeating a movement between shots in which wafer stage WST is moved to a scanning starting position (acceleration staring position) to expose each shot area on wafer W and scanning exposure in which the pattern formed on reticle R is transferred onto each shot area by the scanning exposure method, based on results of wafer alignment (e.g., Enhanced Global Alignment (EGA)) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed in between projection unit PU and wafer W.

During the exposure described above, the position (including rotation in the θz direction) of wafer stage WST (wafer table WTB) in the XY plane is controlled by main controller 20, based on measurement results of a total of three encoders which are the two Y encoders 70A and 70C, and one of the two X encoders 70B and 70D. In this case, the two X encoders 70B and 70D are made up of two X heads 66 that face X scale 39$X_1$ and 39$X_2$, respectively, and the two Y encoders 70A and 70C are made up of Y heads 65 and 64 that face Y scales 39$Y_1$ and 39$Y_2$, respectively. Further, the Z position and rotation (rolling) in the θy direction of wafer stage WST are controlled, based on measurement results of a pair of Z heads 74$_i$ and 76$_j$ that respectively faces the end section on one side and the other side of the surface of wafer table WTB in the X-axis direction. The θx rotation (pitching) of wafer stage WST is controlled based on measurement results of Y interferometer 16. Incidentally, the control (more specifically, the focus leveling control of wafer W) of the position of wafer table WTB in the Z-axis direction, the rotation in the θy direction, and the rotation in the θx direction is performed, based on results of a focus mapping performed beforehand.

At the position of wafer stage WST shown in FIG. 8, while X head 66$_5$ (shown circled in FIG. 8) faces X scale 39$X_1$, there are no X heads 66 that face X scale 39$X_2$. Therefore, main controller 20 uses one X encoder 70B and two Y encoders 70A and 70C so as to perform position (X, Y, θz) control (hereinafter shortly referred to as stage control, as appropriate) of wafer stage WST. In this case, when wafer stage WST moves from the position shown in FIG. 8 to the −Y direction, X 66$_5$ moves off of (no longer faces) X scale 39$X_1$, and X head 66$_4$ (shown circled in a broken line in FIG. 8) faces X scale 39$X_2$ instead. Therefore, main controller 20 switches the stage control to a control that uses one X encoder 70D and two Y encoders 70A and 70C.

As is described, main controller 20 performs stage control by consistently switching the encoder to use depending on the position coordinate of wafer stage WST.

Incidentally, independent from the position measurement of wafer stage WST described above using the encoders, position (X, Y, Z, θx, θy, θz) measurement of wafer stage WST using interferometer system 118 is constantly performed. In this case, the X position and θz rotation (yawing) of wafer stage WST or the X position are measured using X interferometers 126, 127, or 128, the Y position, the θx rotation, and the θz rotation are measured using Y interferometer 16, and the Y position, the Z position, the θy rotation, and the θz rotation are measured using Z interferometers 43A and 43B (not shown in FIG. 8, refer to FIG. 1 or 2) that constitute interferometer system 118. Of X interferometers 126, 127, and 128, one interferometer is used according to the Y position of wafer stage WST. As indicated in FIG. 8, X interferometer 126 is used during exposure. The measurement results of interferometer system 118 are used for position control of wafer stage WST secondarily, or in the case of backup which will be described later on, or when measurement using encoder system 150 cannot be performed.

When exposure of wafer W has been completed, main controller 20 drives wafer stage WST toward unload position UP. On this drive, wafer stage WST and measurement stage MST which were apart during exposure come into contact or move close to each other with a clearance of around 300 μm in between, and shift to a scrum state. In this case, the −Y side surface of CD bar 46 on measurement table MTB and the +Y side surface of wafer table WTB come into contact or move close together. And by moving both stages WST and MST in the −Y direction while maintaining the scrum condition, liquid immersion area 14 formed under projection unit PU moves to the area above measurement stage MST. For example, FIGS. 9 and 10 show the state after the movement.

When wafer stage WST moves further to the −Y direction and moves off from the effective stroke area (the area in which wafer stage WST moves at the time of exposure and wafer alignment) after the drive of wafer stage WST toward unload position UP has been started, all the X heads and Y heads, and all the Z heads that constitute encoder 70A to 70D move off from the corresponding scale on wafer table WTB. Therefore, stage control based on the measurement results of encoders 70A to 70D and the Z heads is no longer possible. Just before this, main controller 20 switches the stage control to a control based on the measurement results of interferometer system 118. In this case, of the three X interferometers 126, 127, and 128, X interferometer 128 is used.

Then, wafer stage WST releases the scrum state with measurement stage MST, and then moves to unload position UP as shown in FIG. 9. After the movement, main controller 20 unloads wafer W on wafer table WTB. And then, main controller 20 drives wafer stage WST in the +X direction to loading position LP, and the next wafer W is loaded on wafer table WTB as shown in FIG. 10.

In parallel with these operations, main controller 20 performs Sec-BCHK (a secondary base line check) in which position adjustment of FD bar 46 supported by measurement stage MST in the XY plane and baseline measurement of the four secondary alignment system AL2$_1$ to AL2$_4$ are performed. Sec-BCHK is performed on an interval basis for every wafer exchange. In this case, in order to measure the position (the θz rotation) in the XY plane, Y encoders 70E$_2$ and 70F$_2$ previously described are used.

Next, as shown in FIG. 11, main controller 20 drives wafer stage WST and positions reference mark FM on measurement plate 30 within a detection field of primary alignment system AL1, and performs the former process of Pri-BCHK (a primary baseline check) in which the reference position is decided for baseline measurement of alignment systems AL1, and AL2$_1$ to AL2$_4$.

On this process, as shown in FIG. 11, two Y heads 68$_2$ and 67$_3$ and one X head 66 (shown circled in the drawing) come to face Y scales 39Y$_1$ and 39Y$_2$, and X scale 39X$_2$, respectively. Then, main controller 20 switches the stage control from a control using interferometer system 118, to a control using encoder system 150 (encoders 70A, 70C, and 70D). Interferometer system 118 is used secondarily again. Incidentally, of the three X interferometers 126, 127, and 128, X interferometer 127 is used.

Then, main controller 20 performs wafer alignment (EGA), using primary alignment system AL1 and secondary alignment systems AL2$_1$ to AL2$_4$ (refer to the star mark in FIG. 12).

Incidentally, in the embodiment, as shown in FIG. 12, wafer stage WST and measurement stage MST are to be shifted to the scrum state by the time wafer alignment shown begins. Main controller 20 drives both stages WST and MST in the +Y direction, while maintaining the scrum state. Then, the water of liquid immersion area 14 is moved from above measurement table MTB to an area on wafer table WTB.

In parallel with a wafer alignment (EGA), main controller 20 performs focus calibration and focus mapping using Z heads (70*a* to 70*d*) and multipoint AF system (90*a*, 90*b*), and furthermore performs the latter process of Pri-BCHK in which intensity distribution of a projection image of wafer table WTB with respect to the XY position is measured using aerial image measurement device 45.

When the operation described above has been completed, main controller 20 releases the scrum state of both stages WST and MST. And, as shown in FIG. 8, exposure by the step-and-scan method is performed, and a reticle pattern is transferred on to a new wafer W. Hereinafter, a similar operation is executed repeatedly.

In the embodiment, as previously described, main controller 20 can measure the displacement of wafer stage WST in directions of six degree of freedom (X, Y, Z, θx, θy, θz) in the entire stroke area, by using X interferometers 126, 127, and 128 of interferometer system 118, Y interferometer 16, and Z interferometers 43A and 43B.

The measurement principle of the interferometer will now be briefly described. The interferometer irradiates a measurement beam (measurement light) toward a reflection surface provided in a measurement object, synthesizes the reflected light with a reference beam and receives the beam, and measures the synthesized light, or more specifically, measures the intensity of the interference light. In this case, due to optical path difference ΔL of the reflected light and the reference beam, the relative phase (phase difference) between the reflected light and the reference beam changes by KΔL. Accordingly, the intensity of the interference light changes in proportion to $1+a\cdot\cos(K\Delta L)$. In this case, homodyne detection is to be employed, and the wave number of the measurement light and the reference beam is the same, expressed as K. Constant a is decided by the intensity ratio of the measurement light and the reference beam. In this case, the reflection surface to the reference beam is arranged generally on the projection unit PU side surface (in some cases, inside the interferometer device). The reflection surface of this reference beam becomes the reference position of the measurement. Accordingly, in optical path difference ΔL, the distance from the reference position to the reflection surface is reflected. Therefore, if the number of times (the number of fringes) of intensity change of the interference light with respect to the change of distance to the reflection surface is measured, displacement of the reflection surface provided in the measurement object can be computed by the product of the counter value and the measurement unit. The measurement unit, in the case of an interferometer of a single-pass method is half the wavelength of the measurement light, and in the case of an interferometer of the double-pass method, one-fourth of the wavelength.

Now, in the case an interferometer of the heterodyne detection method is employed, wave number $K_1$ of the measurement light and wave number $K_2$ of the reference beam are slightly different. In this case, when the optical path length of the measurement light and the reference beam is $L_1$ and $L_2$, respectively, the phase difference between the measurement beam and the reference beam is given K $\Delta L+\Delta KL_1$, and the intensity of the interference light changes in proportion to 1+a/cos $\Delta K\Delta L+\Delta KL_1$). In this case, optical path difference $\Delta L=L_1-L_2$, $\Delta K=K_1-K_2$, and $K=K_2$. When optical path length $L_2$ of the reference beam is sufficiently short, and approximate $\Delta L\approx L_1$ stands, the intensity of the interference light changes in proportion to 1+a·cos [(K+ΔK)ΔL]. As it can be seen from above, the intensity of the interference light periodically vibrates at a wavelength 2π/K of the reference beam along with the change of optical path difference AL, and the envelope curve of the periodic vibration vibrates (beats) at a long cycle 2π/ΔK. Accordingly, in the heterodyne detection method, the changing direction of optical path difference ΔL, or more specifically, the displacement direction of the measurement object can be learned from the long-period beat.

Incidentally, as a major cause of error of the interferometer, temperature fluctuation (air fluctuation) of the atmosphere on the beam optical path can be considered. For example, supposing that wavelength λ of the light changes to λ+Δλ by air fluctuation. Because the change of phase difference KΔL by minimal change Δλ of the wavelength is wave number K=2π/λ, $2\pi\Delta L\Delta\lambda/\lambda^2$ can be obtained. In this case, when wavelength of light λ=1 μm and minimal change Δλ=1 nm, the phase, change becomes 2π×100 with respect to an optical path difference ΔL=100 mm. This phase change corresponds to displacement which is 100 times the measurement unit. In the case the optical path length which is set is long as is described, the interferometer is greatly affected by the air fluctuation which occurs in a short time, and is inferior in short-term stability. In such a case, it is desirable to use an encoder.

Next, a computation method of the position coordinate (X, Y) of wafer table WTB based on the measurement results of X interferometer 126 (127 or 128) and Y interferometer 16 by main controller 20 will be described.

In FIG. 13, the three X interferometers will be collectively referred to as IntX, and the Y interferometer will be referred to as IntY. For the sake of simplicity, these interferometers will have one measurement axis. The X and Y coordinate axes are defined by a measurement axis LX of X interferometer IntX and a measurement axis LY of Y interferometer IntY, respectively. The reference position of X interferometer IntX will be $O_X$=(px, qx), the reference position of Y interferometer IntY will be $O_Y$=(py,qy), and the origin of the XY coordinate system will be O=(py, qx). Irradiation points of measurement beams LX and LY on reflection surfaces 17*a* and 17*b* will be $O_X$ and $Q_Y$.

Figure 13A:
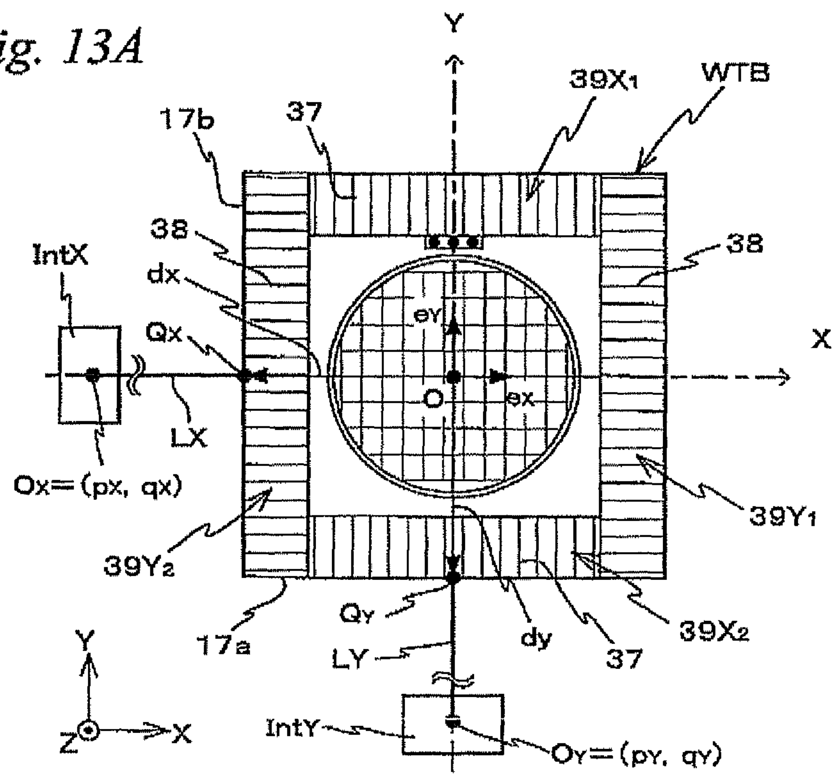
FIGS. 13A and 13B are views for explaining a method to compute XY position coordinates of the wafer stage based on measurement results of the interferometers.

In a reference state shown in FIG. 13A, the center of wafer table WTB is located at origin of coordinates O. Further, X reflection surface 17*b* is parallel to the Y-axis and is orthogonal to measurement axis LX (hereinafter, the measurement beam of X interferometer IntX will be described as measurement beam LX as necessary), and X reflection surface 17*a* is parallel to the X-axis and is orthogonal to measurement axis LY (hereinafter, the measurement beam of Y interferometer IntY will be described as measurement beam LY as necessary). In this reference state, nearest-neighbor vectors to reflection surfaces 17*b* and 17*a* from origin of coordinates O, are dx=−dXex and dy=−dYey, respectively. In this case, ex and ey are X and Y unit vectors, respectively.

The points on reflection surfaces 17*b* and 17*a* indicated by nearest-neighbor vectors dx and dy coincide with irradiation points $Q_X$ and $Q_Y$ of measurement beams LX and LY on reflection surfaces 17*b* and 17*a*, respectively. Incidentally, the distance of measurement beams LX and LY of XY interferometers IntX and IntY to irradiation points $O_X$ and $O_Y$, is $|(dx-O_X)\cdot ex|=|dX+px|$, $|(dy-O_Y)\cdot ey|=|dY+qy|$, respectively.

Figure 13B:
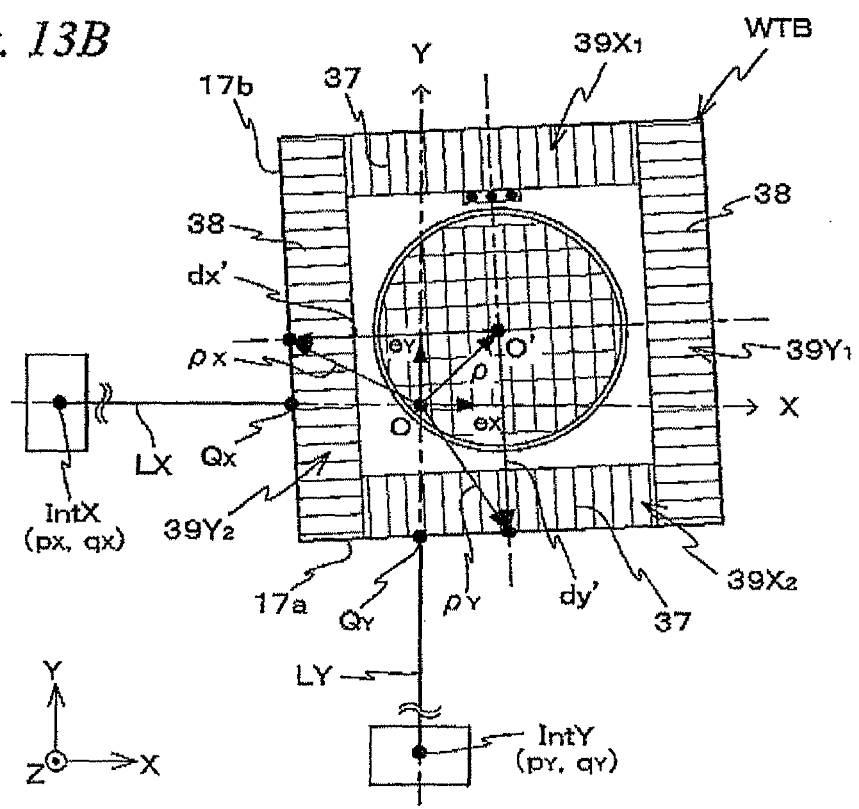

As shown in FIG. 13B, assuming that wafer table WTB moves to position O'=(X+py, Y+qx) from the reference state and rotates by θz. In this case, assuming that a displacement vector of wafer stage WST is ρ=O'−O=(X, Y), and nearest-neighbor vectors from the stage center to reflection surfaces 17*b* and 17*a* are dx' and dy'. However, dx' and dy' are expressed as dx'=R(θz)·dx, dy'=R(θz)·dy, with R(θz) serving as a rotation matrix. In this condition, the distance of measurement beams LX and LY to irradiation points QX and QY, or more specifically, measurement values Lx and Ly of X and Y interferometers IntX and IntY are given by the following formulas (7a) and (7b), respectively.

$$Lx=\rho x\cdot(ex+ey\tan\theta z)-Ox\cdot ex \quad (7a)$$

$$Ly=\rho y\cdot(ey-ex\tan\theta z)-Oy\cdot ey \quad (7b)$$

However, ρx=dx'−ρ, and ρy=dy'−ρ. The unknown variables in simultaneous equations (7a) and (7b) are two, which are X and Y, and are obtained as in the following formula (8a) and (8b), respectively.

$$X=py+[(Lx+px)\cos\theta z+dx]\cos\theta z-[(Ly+qy)\cos\theta z+dy]\sin\theta z \quad (8a)$$

$$Y=qx+[(Lx+px)\cos\theta z+dx]\sin\theta z+[(Ly+qy)\cos\theta z+dy]\cos\theta z \quad (8b)$$

Accordingly, from measurement results Lx and Ly of X and Y interferometers IntX and IntY, and from rotation angle θz obtained, for example, from Z interferometers 43A and 43B previously described, position coordinate (X, Y) of wafer stage WST is computed using above formulas (8a) and (8b).

By main controller 20, the X interferometer which is used to measure the position coordinates of wafer stage WST is switched, according to the Y position coordinate of wafer stage WST. As shown in FIG. 8, X interferometer 126 is used at the time of exposure. As shown in FIG. 12, X interferometer 127 is used at the time of wafer alignment. At the time of unloading the wafer shown in FIG. 9 and loading the wafer shown FIG. 10, X interferometer 128 is used. At this point, the X interferometers which are not used to measure the position coordinates are stopped by main controller 20. For example, at the time of the exposure shown in FIG. 8, X interferometers 127 and 128 are stopped, at the time of wafer alignment shown in FIG. 12, X interferometers 126 and 128 are stopped, and at the time of loading/unloading of the wafer shown in FIGS. 10 and 9, X interferometers 126 and 127 are stopped, respectively.

Further, by main controller 20, initial setting of measurement values is performed at the time of restoration of an X interferometer so that the position coordinates of wafer table WTB (wafer stage WST) computed before and after the switching of the X interferometer become continuous. By using measurement value Lx of a first X interferometer, measurement value Ly of Y interferometer 16, and rotation angle θz obtained by the Z interferometer before the switching, position coordinate (X, Y) of wafer stage WST can be obtained from above formulas (8a) and (8b). Main controller 20 substitutes position coordinate (X, Y) obtained here into formula (7a) to obtain Lx. Because the measurement values of a second X interferometer after the switching also follows formula (7a), main controller 20 initializes Lx that has been obtained as a measurement value of the second X interferometer. After the initialization has been completed, main controller 20 switches the X interferometer whose measurement values are to be monitored from the first X interferometer to the second X interferometer at a predetermined timing, based on the position coordinate of wafer stage WST.

Next, a measurement principle of an encoder, or more specifically, the relation between the phase difference of the two beams $LB_1$ and $LB_2$ detected by the encoder and the displacement of the scale, will be briefly explained, with the previous Y encoder 70C serving as an example.

As is previously described, in the inside of photodetection system 64*c* configuring Y encoder 70C, the polarization direction of return beams $LB_1$ and $LB_2$ is arranged by the analyzer and the beams overlap each other so as to form an interference light. This interference light is detected by photodetector 64*c*. In this case, when Y scale 39$Y_2$ (more specifically, wafer stage WST) is displaced, phase difference $\phi$ between the two beams $LB_I$ and $LB_2$ changes, and intensity I of the interference light changes as in $I \propto 1+\cos\phi$. However, the intensity of the two beams $LB_1$ and $LB_2$ was to be equal to each other.

In this case, phase difference $\phi$ between the two beams $LB_1$ and $LB_2$ can be obtained as in the following formula (9), as a sum of a phase difference ($k\Delta L$) due to optical path difference $\Delta L$ of beams $LB_1$ and $LB_2$ and a phase shift difference of the two beams $LB_1$ and $LB_2$ due to displacements $\Delta Y$ and $\Delta Z$ of Y scale 39$Y_2$ in the Y and Z-axis directions.

$$\phi = L \times L + 4\pi(n_b - n_a)\Delta Y/p + 2K\Delta Z f(\theta_{a0}, \theta_{a1}, \theta_{b0}, \theta_{b1}) + \phi_0 \quad (9)$$

Figure 14:
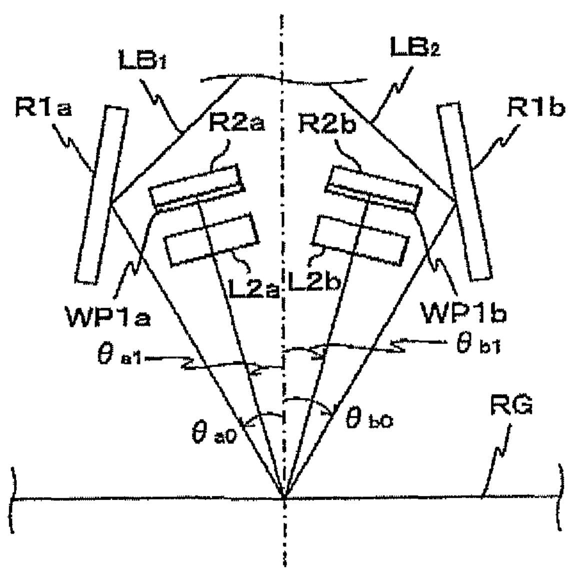
FIG. 14 is a view showing a configuration of an encoder head section, and an incidence angle and a scattering angle of the detection light to a grating.

In this case, diffraction conditions of each of the two beams $LB_1$ and $LB_2$ expressed as in the following formulas (10) and (11), or more specifically, the relation between incidence angle $\theta_{a0}$ to reflection grating RG of beam $LB_1$ and scattering angle $\theta_{a1}$ shown in FIG. 14 and the relation between incidence angle $\theta_{b0}$ to reflection grating RG of beam $LB_2$ and scattering angle $\theta_{b1}$, were applied.

$$\sin\theta_{a1} + \sin\theta_{a0} = n_a\lambda/p \quad (10)$$

$$\sin\theta_{b1} + \sin\theta_{b0} = n_b\lambda/p \quad (11)$$

However, the order of diffraction of beams $LB_1$ and $LB_2$ was expressed as $n_a$ and $n_{b1}$, the wavelength was expressed as $\lambda_1=\lambda_2=\lambda$, and the pitch of the diffraction grating was expressed as p. Incidentally, the order of diffraction was defined so that a diffraction light scattered in the +Y direction is positive, and a diffraction light scattered in the −Y direction is negative, with a zero order diffraction light of scattering angle $-\theta_{a0}$ or $\theta_{b0}$ serving as a reference (refer to FIG. 14). Further, a geometric factor, which is to be decided from the placement of reflection mirrors R1*a*, R1*b*, R2*a*, and R2*b* and diffraction conditions (10) and (11) in formula (9), is to be expressed as in the following formula (12).

$$f(\theta_{a0}, \theta_{a1}, \theta_{b0}, \theta_{b1}) = \cos\theta_{b1} + \cos\theta_{b0} - \cos\theta_{a1} - \cos\theta_{a0} \quad (12)$$

Further, a constant phase term, which is to be decided by other factors (e.g., a definition of the reference position of displacements $\Delta L$, $\Delta Y$, and $\Delta Z$), was expressed as $\phi$0. Incidentally, phase difference $\phi$ can be dependent on displacement in the X-axis direction in principle, however, it will not be considered here.

Assume that Y encoder 70C is configured so as to satisfy the symmetrical property expressed by optical path difference $\Delta L=0$ and the following formula (13).

$$\theta_{a0} = \theta_{b0}, \theta_{a1} = \theta_{b14} \quad (13)$$

In such a case, the third term on the right-hand side of formula (9) becomes zero, and also at the same time $n_b=-n_a$ (=n), therefore, the following formula (14) can be obtained.

$$\phi_{sym}(\Delta Y) = 2\pi\Delta Y/(p/4n) + \phi_0 \quad (14)$$

From formula (14) above, it can be seen that phase difference $\phi_{sym}$ is not dependent on wavelength $\lambda$ of beams $LB_1$ and $LB_2$. And, it can be seen that intensity I of the interference light repeats strong and weak intensities each time displacement $\Delta Y$ is increased or decreased by a measurement unit (also referred to as a measurement pitch) of p/4n. Therefore, the number of times is measured of the strong and weak intensities of the interference light that accompanies displacement $\Delta Y$ from a predetermined reference position. And, from discrete value (count value) $c\Delta Y$, measurement value $C\Delta Y$ of displacement $\Delta Y$ is obtained as in the following formula (15).

$$C\Delta Y = (p/4n) X c\Delta Y \quad (15)$$

Furthermore, by splitting a sinusoidal intensity change of the interference light using interpolation instrument (an interpolator), its phase $\phi'$ (i.e. a remainder left when $\phi_{sym}$ is divided by $2\pi$) can be measured. In this case, measurement value $C\Delta Y$ of displacement $\Delta Y$ is computed according to the following formula (16).

$$C\Delta Y = (p/4n) X\{c\Delta Y + (\phi' - \phi_0)/2\pi\} \quad (16)$$

In this case, constant phase term $\phi$ is to be a phase offset (however, $0 \le \phi 0 < 2\pi$), and phase $\phi_{sym}$ ($\Delta Y=0$) at the reference position of displacement $\Delta Y$ is to be kept.

As it can be seen from the description so far above, by using an interpolation instrument together, displacement $\Delta Y$ can be measured at a measurement resolution whose measurement unit is (p/4n) or under. The measurement resolution in this case is decided from an interpolation error or the like, due to a shift of an intensity change $I(\Delta Y)=I(\phi_{sym}(\Delta Y))$ of the interference light from an ideal sinusoidal waveform according to displacement $\Delta Y$, which is a discretization error (also referred to as a quantization error) determined from a split unit of phase $\phi'$. Incidentally, because the discretization unit of displacement $\Delta Y$ is, for example, one in several thousand of measurement unit (p/4n), which is sufficiently small about 0.1 nm, measurement value $C\Delta Y$ of the encoder will be regarded as a continuous quantity unless it is noted otherwise.

Meanwhile, when wafer stage WST moves in a direction different from the Y-axis direction and a relative displacement occurs between Y head 64 and Y scale 39$Y_2$ in a direction besides the measurement direction, a measurement error occurs in Y encoder 70C. In the description below, a generation mechanism of a measurement error will be considered, based on the measurement principle of the encoder described above.

Figure 15A:
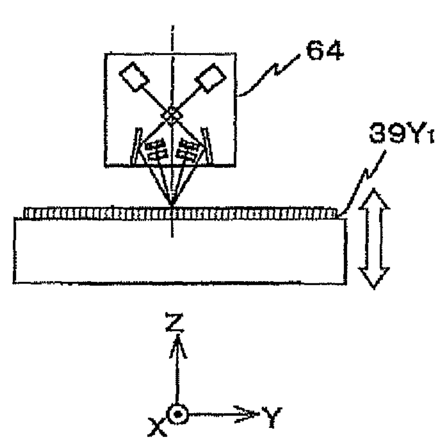
FIG. 15A is a view showing a case when a measurement value does not change even if a relative movement in a direction besides the measurement direction occurs between a head of an encoder and a scale.
Figure 15B:
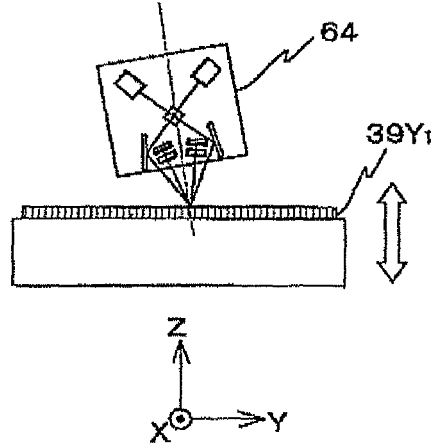
FIG. 15B is a view showing a case when a measurement value changes when a relative movement in a direction besides the measurement direction occurs between a head of an encoder and a scale.

As a simple example, the change of phase difference $\phi$ indicated by formula (9) above in the two cases shown in FIGS. 15A and 15B will be considered. In both FIGS. 15A and 15B, wafer stage WST is to maintain a parallel attitude in the XY plane. First of all, in the case of FIG. 15A, the optical axis of head 64 coincides with the Z-axis direction (head 64 is not inclined). Assuming that wafer stage WST is displaced in the Z-axis direction ($\Delta Z\neq0$, $\Delta Y=0$). In this case, because there are no changes in optical path difference $\Delta L$, there are no changes in the first term on the right-hand side of formula (9). The second term becomes zero, according to a supposition $\Delta Y=0$. And, the third term becomes zero because it satisfies the symmetry of formula (13). Accordingly, no change occurs in phase difference $\phi$, and further no intensity change of the interference light occurs. As a result, the count value of the encoder also does not change.

Meanwhile, in the case of FIG. 15B, the optical axis of head 64 is inclined (head 64 is inclined) with respect to the Z-axis. Assuming that wafer stage WST was displaced in the Z-axis direction from this state ($\Delta Z\neq0$, $\Delta Y=0$). In this case as well, because there are no changes in optical path difference ΔL, there are no changes in the first term on the right-hand side of formula (9). And, the second term becomes zero, according to supposition ΔY=0. However, because the head is inclined the symmetry of formula (13) will be lost, and the third term will not become zero and will change in proportion to Z displacement ΔZ. Accordingly, a change occurs in phase difference ϕ, and as a consequence, the count value changes.

Further, although it is omitted in the drawings, in the case wafer stage WST is displaced in a direction (the X-axis direction) perpendicular to the measurement direction (the Y-axis direction) and the optical axis direction (the Z-axis direction), (ΔX≠0, ΔY=0, ΔZ=0), the measurement values do not change as long as the direction in which the grid line of diffraction grating RG faces is orthogonal to the measurement direction, however, in the case the direction is not orthogonal, sensitivity occurs with a gain proportional to the angle.

Next, a case will be considered in which wafer stage WST rotates (the inclination changes), using FIGS. 16A to 16D. In FIGS. 16A to 16D, the optical axis of head 64 is to coincide with the Z-axis direction (head 64 is not inclined).

Figure 16A:
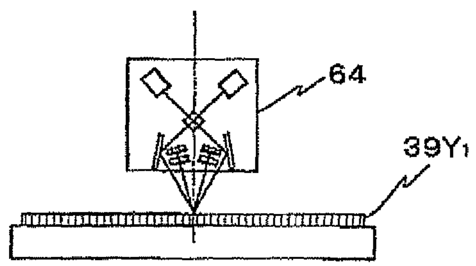
FIGS. 16A to 16D are views used for describing the case when the measurement value of the encoder changes and the case when the measurement value does not change, when a relative movement in a direction besides the measurement direction occurs between the head and the scale.

In the state shown in FIG. 16A, wafer stage WST is parallel to the XY plane. Even if wafer stage WST is displaced in the +Z direction and moves to a condition shown in FIG. 16B from this state, the measurement value of the encoder does not change since the case is the same as in FIG. 15A previously described.

Figure 16B:
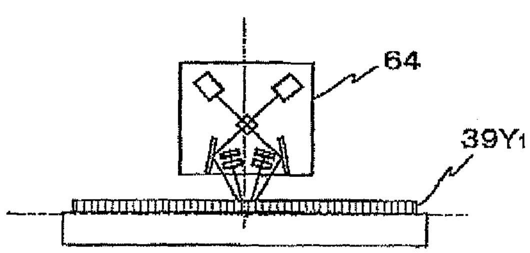
Figure 16C:
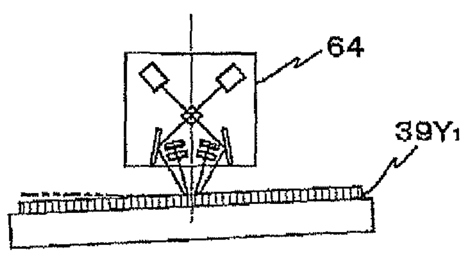

Next, assume that wafer stage WST rotates around the X-axis from the state shown in FIG. 16B and moves into a state shown in FIG. 16C. In this case, since the head and the scale do not perform relative motion, or more specifically, because a change occurs in optical path difference ΔL due to the rotation of wafer stage WST even though ΔY=ΔZ=0, the measurement values of the encoder change.

Figure 16D:
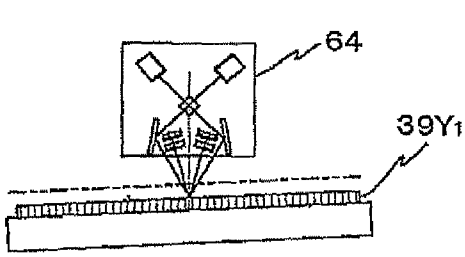

Next, suppose that wafer stage WST moves downward from a state shown in FIG. 16C and moves into a state shown in FIG. 16D. In this case, a change in optical path difference ΔL does not occur because wafer stage WST does not rotate. However, because the symmetry of formula (13) has been lost, phase difference ϕ changes by Z displacement AZ through the third term on the right-hand side of formula (9). And due to the change, the measurement value of the encoder changes.

As other generation factors of measurement errors, temperature fluctuation (air fluctuation) of the atmosphere on the beam path can be considered. Phase difference ϕ between the two return beams $LB_1$ and $LB_2$ depend on optical path difference ΔL of the two beams, according to the first term on the right-hand side of formula (9). In this case, assume that wavelength λ of the light changes to λ+Δλ by air fluctuation. By minute change Δλ of this wavelength, the phase difference changes by minute amount $\Delta\phi=2\pi\Delta L\Delta\lambda/\lambda^2$. In this case, when the wavelength of light λ=1 μm and minute change Δλ=1 nm, then phase change Δϕ=2π with respect to optical path difference ΔL=1 mm. This phase change is equivalent to 1 when it is converted into a count value of the encoder. Further, when it is converted into displacement, it is equivalent to $p/2\ (n_b-n_a)$. Accordingly, if $n_b=-n_a=1$, in the case of p=1 μm, a measurement error of 0.25 μm will occur.

In the actual encoder, because the optical path length of the two beams which are made to interfere is extremely short, wavelength change Δλ due to the air fluctuation is extremely small. Furthermore, optical path difference ΔL is designed to be approximately 0, in an ideal state where the optical axis is orthogonal to the reflection surface. Therefore, the measurement errors due to the air fluctuation can be substantially ignored. The fluctuation is remarkably small when compared with the interferometer, and is superior in short-term stability.

As key factors of measurement errors of the encoder, errors which are caused by an uneven scale surface, mechanical deformation of the diffraction grating and the like can be given. With the passage of use time and also thermal expansion or the like, the surface is deformed in the scale of the encoder, or the pitch of the diffraction grating is changed partially or entirely. Therefore, the encoder has a tendency in which measurement errors grow larger with the passage of use time, and lacks in long-term stability.

Therefore, after having performed pre-processing to correct these main errors beforehand, the encoder is used in position measurement of wafer stage WST which is executed during the actual processing of a lot.

Main controller 20 by all means monitors the measurement values of a total of three encoders, which are encoders 70A and 70C, and at least one of encoders 70B and 70D (or Y encoders $\mathbf{70}E_1$ and $\mathbf{70}F_1$, and at least one of encoders 70B and 70D) in the effective stroke range of wafer stage WST, and computes the position coordinate of wafer stage WST. Then, by controlling each motor that configures stage drive system 124 according to the position coordinate which has been calculated, wafer stage WST can be driven with high precision.

Now, a method to compute the position coordinate of wafer stage WST from the measurement values of the three encoders which are monitored will be described, referring to FIGS. 17A and 17B. In this case, for the sake of simplicity, the degrees of freedom of the movement of wafer stage WST will be three (X, Y, θz).

Figures 17A, 17B:
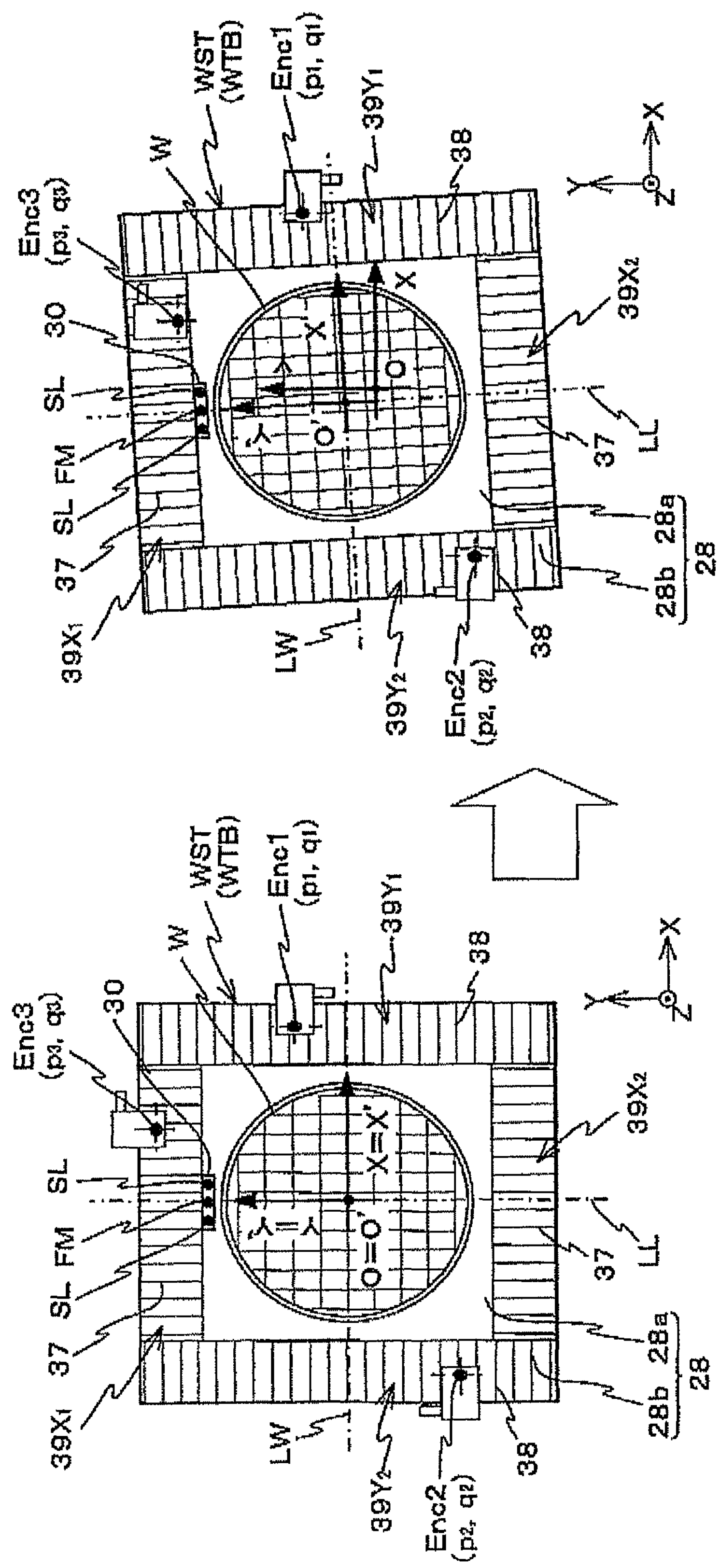
FIGS. 17A and 17B are views for explaining a concrete method to convert a measurement value of the encoder into a position of wafer stage WST.

FIG. 17A shows a reference state where wafer stage WST is at the origin of coordinates (X, Y, θz)=(0, 0, 0). From this reference state, wafer stage WST is driven within a range where encoders (Y heads) Enc1 and Enc2 and encoder (X head) Enc3 do not move away from the scanning areas of their opposing scales $\mathbf{39}Y_1$ and $\mathbf{39}Y_2$ and $\mathbf{39}X_1$. The state where wafer stage WST is moved to position (X, Y, θz) in the manner described above is shown in FIG. 17B. However, the position (X, Y) of encoders Enc1, Enc2, and Enc3 on the XY coordinate system are to be $(p_1, q_1)$, $(p_2, q_2)$, and $(p_3, q_3)$, respectively.

The X head and the Y head respectively measure the relative distance from central axes LL and LW of wafer stage WST. Accordingly, measurement values $C_X$ and $C_Y$ of the X head and the Y head can be expressed, respectively, as in the following formulas (17a) and (17b).

$$C_X=r'\cdot ex' \tag{17a}$$

$$C_Y=r'\cdot ey' \tag{17b}$$

In this case, ex' and ey' are X' and Y' unit vectors in a relative coordinate system (X',Y',θz') set on wafer stage WST, and have a relation as in the following Y formula (18) with X and Y unit vectors ex and ey in the reference coordinate system (X, Y, θz).

[Equation 1]

$$\begin{pmatrix} ex' \\ ey' \end{pmatrix} = \begin{pmatrix} \cos\theta z & \sin\theta z \\ -\sin\theta z & \cos\theta z \end{pmatrix} \begin{pmatrix} ex \\ ey \end{pmatrix} \tag{18}$$

Further, r' is a position vector of the encoder in the relative coordinate system, and r' is given r'=r−(O'−O), using position vector r=(p, q) in the reference coordinate system. Accordingly, formulas (17a) and (17b) can be rewritten as in the next formulas (19a) and (19b).

$$C_X=(p-X)\cos\theta z+(q-Y)\sin\theta z \quad (19a)$$

$$C_Y=-(p-X)\sin\theta z+(q-Y)\cos\theta z \quad (19b)$$

Accordingly, when wafer stage WST is located at the coordinate (X, Y, θz) as shown in FIG. 17B, the measurement values of three encoders can be expressed theoretically as in the next formulas (20a) to (20c).

$$C_1=-(p_1-X)\sin\theta z+(q_1-Y)\cos\theta z \quad (20a)$$

$$C_2=-(p_2-X)\sin\theta z+(q_2-Y)\cos\theta z \quad (20b)$$

$$C_3=(p_3-X)\cos\theta z+(q_3-Y)\sin\theta z \quad (20c)$$

Incidentally, in the reference state shown in FIG. 17A, according to simultaneous equations (20a) to (20c), then $C_1=q_1$, $C_2=q_2$, and $C_3=p_3$. Accordingly, in the reference state, if the measurement values of the three encoders Enc1, Enc2, and Enc3 are initialized to $q_1$, $q_2$, and $p_3$ respectively, then the three encoders will show theoretical values given by formulas (20a) to (20c) with respect to displacement (X, Y, θz) of wafer stage WST from then onward.

In simultaneous equations (20a) to (20c), three formulas are given to the three variables (X, Y, θz). Accordingly, on the contrary, if dependent variables $C_1$, $C_2$, and $C_3$ are given in the simultaneous equations (20a) to (20c), variables X, Y, and θz can be obtained. In this case, when approximation sin θz≈θz is applied, or even if an approximation of a higher order is applied, the equations can be solved easily. Accordingly, the position of wafer stage WST (X, Y, θz) can be computed from measurement values $C_1$, $C_2$, and $C_3$ of the encoder.

Figure 18A:
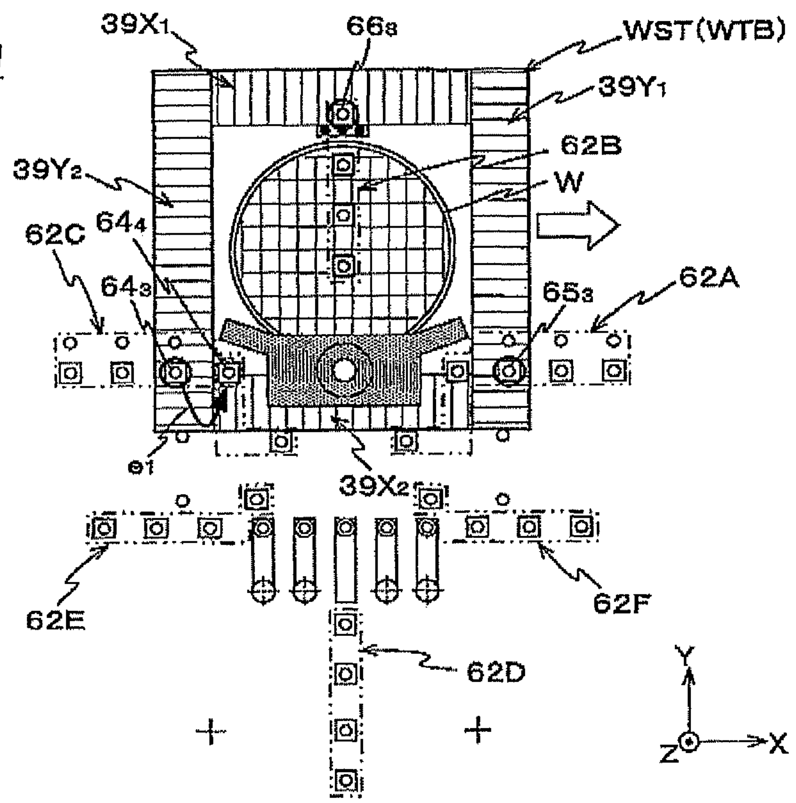
FIGS. 18A and 18B are views for explaining position measurement of a wafer table in an XY plane by an encoder configured of a plurality of heads placed in the shape of an array and a switching between the heads.
Figure 18B:
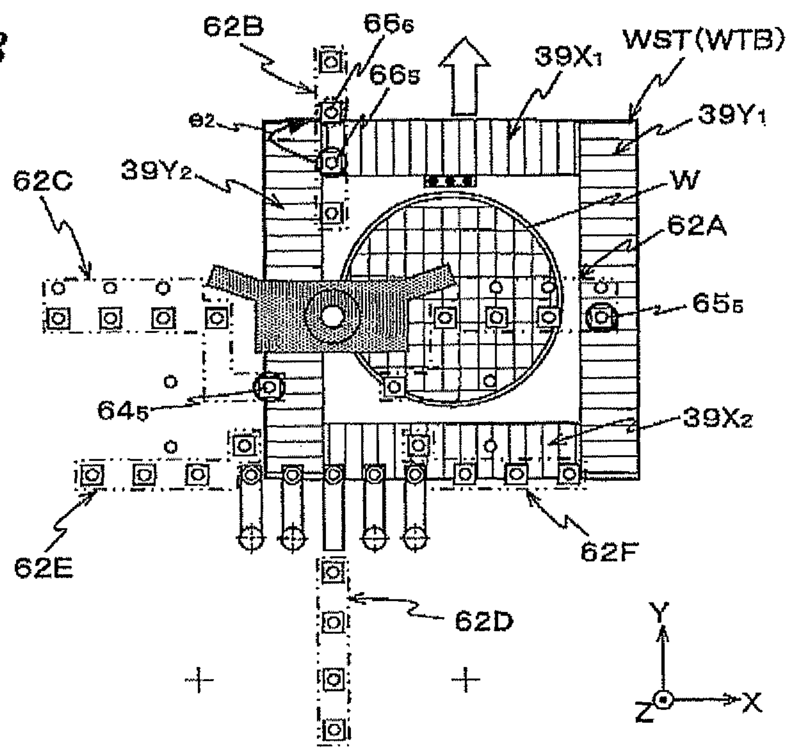

In exposure apparatus 100 of the embodiment, as exemplified in FIGS. 18A and 18B, in the effective stroke range (a range where the stage moves for alignment and exposure operation) of wafer stage WST, Y scales and Y heads are placed so that Y scales 39$Y_1$ and 39$Y_2$ each have at least one Y head (65, 64, 68 or 67) facing the scales without fail. And, X scales and X heads are placed so that at least one X scale 39$X_1$ and 39$X_2$ has at least one X head 66 facing the scale. Accordingly, at least three heads are placed to simultaneously face the corresponding X scales and Y scales. Incidentally, in FIGS. 18A and 18B, the heads which face the corresponding X scales and Y scales are shown surrounded in a circle.

In this case, when main controller 20 drives wafer stage WST in the +X direction as is shown by an outlined arrow in FIG. 18A, main controller 20 switches Y head 64, for example, as shown by an arrow $e_1$ in the drawing, from Y head 64$_3$ surrounded in a circle with a solid line to head 64$_4$ surrounded in a circle with a dotted line. As is described, Y head 64 is sequentially switched to the next head, with the movement of wafer stage WST in the X-axis direction. Incidentally, because the encoder detects relative displacement, in order to compute absolute displacement (more specifically, the position) a position which will be a reference has to be set. Therefore, on the switching of the heads, the position of an operating head (which will be activated) is computed and is initialized as a reference position. The initial setting will be explained in detail later in the description.

Further, in the case main controller 20 drives wafer stage WST in the +Y direction as is shown by an outlined arrow in FIG. 18B, main controller 20 switches X head 66, for example, as shown by an arrow $e_2$ in the drawing, from head 66$_5$ surrounded in a circle with a solid line to head 66$_6$ surrounded in a circle with a dotted line. As is described, X head 66 is sequentially switched to the next head, with the movement of wafer stage WST in the Y-axis direction. On this head switching, the position of an operating head (which will be activated) is computed and is initialized as a reference position.

The switching procedure of the encoder heads will now be described here, based on FIGS. 19A to 19E, with the switching from Y heads 64$_3$ to 64$_4$ shown by arrow $e_1$ in FIG. 18A serving as an example.

Figure 19A:
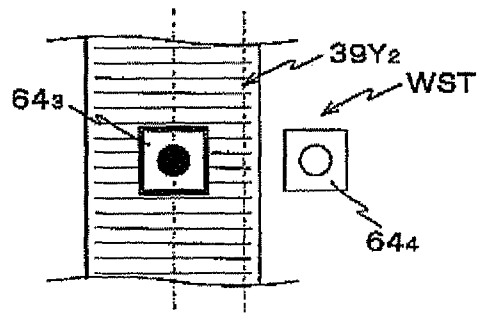
FIGS. 19A to 19E are views for explaining a procedure of an encoder switching.

In FIG. 19A, a state before the switching is shown. In this state, Y head 64$_3$ facing the scanning area (the area where the diffraction grating is arranged) on Y scale 39$Y_2$ is operating, and Y head 64$_4$ which has moved away from the scanning area is suspended. In FIGS. 19A to 19E, the operating head is indicated by a solid black circle, and the suspended head is indicated by an outlined circle. Then, main controller 20 monitors the measurement values of Y head 64$_3$ which is operating. In FIGS. 19A to 19E, the head whose measurement values are monitored is shown in a double rectangular frame.

Figure 19B:
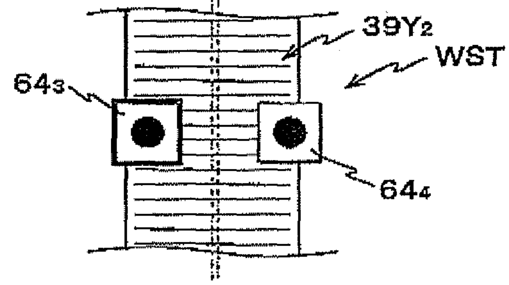

Then, when wafer stage WST moves in the +X direction, Y scale 39$Y_2$ is displaced in a direction to the right. In this case, in the embodiment, as is previously described, the distance between the Y heads is set smaller than the effective width (width of the scanning area) of Y scale 39$Y_2$ in the X-axis direction. Accordingly, as shown in FIG. 19B, a state occurs where Y heads 64$_3$ and 64$_4$ simultaneously face the scanning area of Y scale 39$Y_2$. Therefore, main controller 20 makes sure that Y head 64$_4$, which is suspended, has faced the scanning area along with Y head 64$_3$ that is operating, and then activates the suspended Y head 64$_4$. However, main controller 20 does not yet start monitoring the measurement values of Y head 64$_4$ at this point.

Figure 19C:
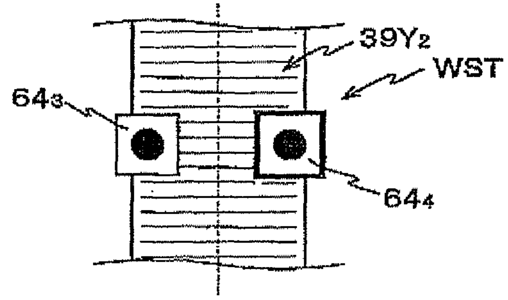

Next, as shown in FIG. 19C, while Y head 64$_3$, which will be suspended later, faces the scanning area, main controller 20 computes a reference position of Y head 64$_4$, which has been restored, from the measurement values of the active encoder heads including Y head 64$_3$. Then, main controller 20 sets up the reference position as an initial value of the measurement values of Y head 64$_4$. Incidentally, details on the computation of the reference position and the setting of the initial value will be described later in the description.

Figure 19D:
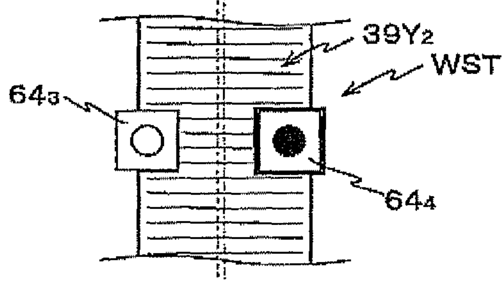
Figure 19E:
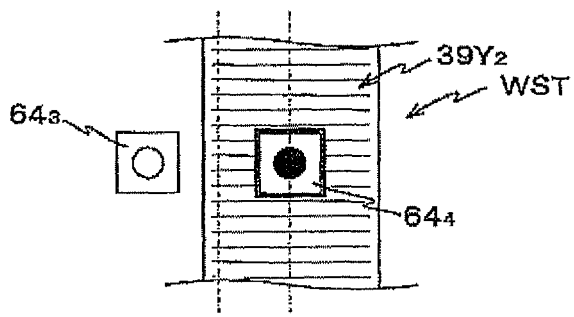

Main controller 20 switches the encoder head whose measurement values are monitored from Y head 64$_3$ to Y head 64$_4$ simultaneously with the setting of the initial value above. After the switching has been completed, main controller 20 suspends the operation of Y head 64$_3$ before it moves off the scanning area as shown in FIG. 19D. By the operation described above, all the operations of switching the encoder heads are completed, and hereinafter, as shown in FIG. 19E, the measurement values of Y head 64$_4$ are monitored by main controller 20.

In the embodiment, the distance between adjacent Y heads 64 that head units 62A and 62C have is, for example, 70 mm (with some exceptions), and is set smaller than the effective width (e.g., 76 mm) of the scanning area of Y scales 39$Y_1$ and 39$Y_2$ in the X-axis direction. Further, for example, the distance between adjacent X heads 66 that head units 62B and 62D have is, for example, 70 mm (with some exceptions), and is set smaller than the effective width (e.g. 76 mm) of the scanning area of X scales 39$X_1$ and 39$X_2$ in the Y-axis direction. Accordingly, the switching operation of Y heads 65 or 64 and X heads 66 can be performed smoothly as in the description above.

Incidentally, the range in which both adjacent heads face the scale, or more specifically, the moving distance of wafer stage WST from a state shown in FIG. 19B to a state shown in FIG. 19D, for example, is 6 mm. And at the center, or more specifically, when wafer stage WST is located at the position shown in FIG. 19C, the head that monitors the measurement values is switched. This switching operation is completed by the time the head which is to be suspended moves off the scanning area, or more specifically, while wafer stage WST moves in an area by a distance of 3 mm during the state shown in FIG. 19C until the state shown in FIG. 19D. For example, in the case the movement speed of the stage is 1 m/sec, then, the switching operation of the head is to be completed within 3 msec.

Next, the linkage process when the encoder head is switched, or more specifically, the initial setting of the measurement values will be described, focusing mainly on the operation of main controller 20.

In the embodiment, as is previously described, in the effective stroke range of wafer stage WST, three encoders (the X heads and the Y heads) constantly observe the movement of the stage so as to detect positional information of wafer stage WST within the XY plane. Accordingly, when the switching process of the encoder is performed, four encoders Enc1 to Enc4, to which a fourth encoder (a Y head) Enc4 is added, will be made to observe wafer stage WST as shown in FIG. 20.

Figure 20:
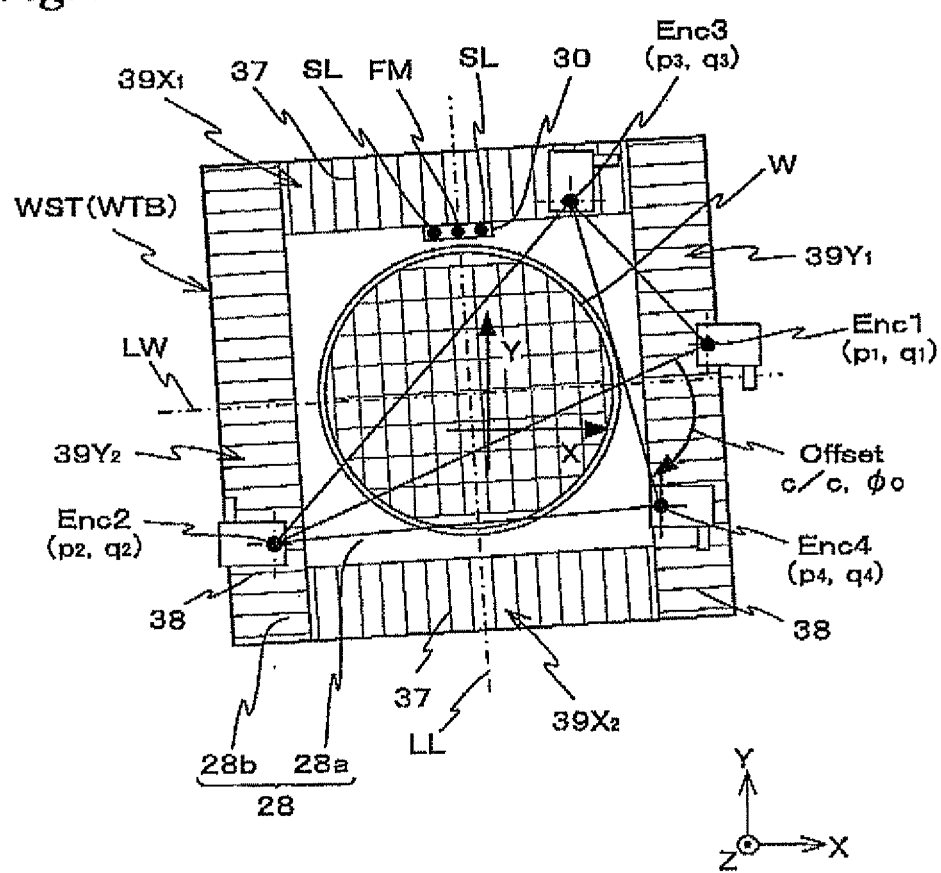
FIG. 20 is a view for explaining a switching process of the encoder used for the position control in the XY plane of wafer stage WST.

In the switching state of the encoder shown in FIG. 20, encoders Enc1, Enc2, Enc3 and Enc4 are located on scales 39$Y_1$, 39$Y_2$, 39$X_1$, and 39$Y_1$, respectively. When having a look, it looks as though the encoder is going to be switched from encoder Enc1 to encoder Enc4. However, as is obvious from the fact that the position in the Y-axis direction, which is the measurement direction, is different in encoder Enc1 and encoder Enc4, it does not have any meaning even if the measurement values (count values) of encoder Enc1 are set without any changes as the initial value of the measurement values of encoder Enc4 at the timing when the switching is performed.

Therefore, in the embodiment, main controller 20 is made to switch from position measurement of wafer stage WST by the three encoders Enc1, Enc2 and Enc3 to position measurement by the three encoders Enc2, Enc3 and Enc4, as shown in FIG. 20. In this switching method, the switching is performed not from switching from one head to another head, but from switching from a combination of three heads (encoders) to a combination of another three heads (encoders).

On the switching, first of all, main controller 20 solves the simultaneous equations (20a) to (20c) using measurement values $C_1$, $C_2$, and $C_3$ of encoders Enc1, Enc2, and Enc3, and computes the position coordinate (X, Y, θz) of wafer stage WST within the XY plane. Next, by using the position coordinate calculated here, main controller 20 obtains theoretical value $C_4$ from the following theoretical formula (20d) which the measurement value of encoder (Y head) Enc4 follows.

$$C_4=-(p_4-X)\sin\theta z+(q_4-Y)\cos\theta z \tag{20d}$$

In this case, $p_4$ and $q_4$ are the X and Y setting positions of encoder Enc4. Then, theoretical value $C_4$ is set as an initial value of encoder Enc4. However, as is had been explained earlier (when explaining formula (14)), because the measurement values of the encoder is discretized, theoretical value $C_4$ is converted into a discrete value by a unit of measurement unit δ, or more specifically, into count value $c_4=\mathrm{int}(C_4/\delta)$, and is set as the initial value of encoder Enc4. However, int(x) is a function that makes x be an integer. The handling of remainder C4%δ will be described later on.

By the linkage process described above, the switching operation of the encoder is completed while having maintained the results (X, Y, θz) of position measurement of wafer stage WST. From then onward, the following simultaneous equations (20b) to (20d) are solved, using the measurement values $C_2$, $C_3$, and $C_4$ of encoders Enc2, Enc3, and Enc4 which are used after the switching, and a position coordinate (X, Y, θz) of wafer stage WST is computed.

$$C_2=-(p_2-X)\sin\theta z+(q_2-Y)\cos\theta z \tag{20b}$$

$$C_3=(p_3-X)\cos\theta z+(q_3-Y)\sin\theta z \tag{20c}$$

$$C_4=-(p_4-X)\sin\theta z+(q_4-Y)\cos\theta z \tag{20d}$$

Incidentally, in the case the fourth encoder is an X head, instead of using theoretical formula (20d), a simultaneous equation (20b) (20*c*) (20*e*), which uses the following theoretical formula (20e) can be used.

$$C_4=(p_4-X)\cos\theta z+(q_4-Y)\sin\theta z \tag{20e}$$

However, various measurement errors are included in the actual measurement values (raw measurement values) of the encoders. Therefore, main controller 20 shows the value whose error has been corrected as measurement value $C_4$. Accordingly, in the linkage process described above, main controller 20 uses stage position induced error correction information and/or correction information on the grating pitch of the scale (and correction information on the grating deformation) and the like, and performs an inverse correction of theoretical value $C_4$ obtained from formula (20d) or formula (20e) and computes raw value C4' before correction, and then sets raw value C4' as the initial value of the measured value of encoder Enc4.

In the linkage process of the encoder, or more specifically, on computing and setting initial value $C_4$ of the fourth encoder, an error can occur. When exposure of all the shot areas on the wafer is actually performed, the switching of the encoder will be performed, for example, around 100 times. Accordingly, even if the error which occurs in one linkage process is small enough to ignore, the errors may be accumulated by repeating the switching many times, and may come to exceed a permissible level. Incidentally, assuming that the errors occur at random, the cumulative error which occurs by performing the switching 100 times is around 10 times the error which occurs when the switching is performed once. Accordingly, the precision of the linkage process must be improved as much as possible.

Therefore, the following two linkage methods, or more specifically, the coordinate linkage method and the phase linkage method will be introduced.

In the coordinate linkage method, first of all, from measurement values $C_1$, $C_2$, and $C_3$ of the three encoders before the switching, position coordinates (X, Y, θz) of wafer stage WST are calculated back via simultaneous equation (20a) to (20c). From the position coordinates, initial value $C_4$ of the fourth encoder Enc4 is predicted via formula (20d) (or formula (20e). And this initial value $C_4$ is converted into a discrete value of measurement unit δ, or more specifically, into 6Xc4 (in this case, c4 is a count value). Then, the position coordinate is calculated back, by substituting sum $\delta xc_4+dC_4$ of the discrete value and minute amount $dC_4$ into $C_4$ on the left-hand side of formula (20d) (or formula (20e)) and solving the simultaneous equations (20b) to (20d) (or, simultaneous equations (20b) (20*c*) (20*e*)). However, measurement values $C_2$ and $C_3$ are in common with the preceding ones. Minute amount $dC_4$ is decided so that position coordinates (X', Y', θz') obtained here coincide with position coordinates (X, Y, θz) which have been obtained earlier. Then, discrete value $\delta xc_4$ (count value $c_4$) is set in the fourth encoder Enc4 as the initial value. At the same time, a phase offset is set to $\phi_0=\phi'-2\pi dC_4/\delta$ so as to correct phase φ' to phase $2\pi dC_4/\delta$, which corresponds to minute amount $dC_4$. In this case, minute amount $dC_4$ can be different from remainder $C_4\%\delta$ due to computation errors or the like of the position coordinate of wafer stage WST using the simultaneous equations (20b) to (20d) (or, simultaneous equations (20b) (20_c_) (20_e_)).

In the coordinate linkage method, according to its principle, the position coordinate of wafer stage WST that has been computed is stored without fail before and after the switching of the encoder. However, it makes no difference in the error being accumulated each time the linkage process is repeated.

As was explained in detail based on FIGS. 19A to 19E, in the embodiment, when the switching process is performed between two adjacent encoders in the same head unit, the switching process is executed while the two encoders simultaneously face the same scale. In this case, from the state where Y head $\mathbf{64}_4$, which is the new head to be used, faces Y scale $\mathbf{39}Y_2$ as shown in FIG. 19B until the state where Y head $\mathbf{64}_3$, which is the head to be suspended later, moves off of Y scale $\mathbf{39}Y_2$ as shown in FIG. 19D, there is a section of around 6 mm where the adjacent two heads face the same scale. In this case, the maximum movement speed of wafer stage WST is, for example, 1 m/sec, therefore, the time while the two adjacent heads face the same scale is around 6 msec or more. Therefore, performing the linkage process will be considered while using the switching time to secure a sufficient linkage accuracy even if it is as short as around 6 msec, rather than performing the linkage process as soon as the preparations have been completed as is described in the example above.

The procedure will be explained, referring to examples shown in FIGS. 19A to 19E. However, Y head $\mathbf{64}_3$ in the drawing corresponds to the first head (the first encoder) Enc1 which will be suspended later on, and Y head $\mathbf{64}_4$ corresponds to the fourth head (the fourth encoder) Enc4 which will be newly used. As shown in FIG. 19B, when the fourth encoder Enc4 ($\mathbf{64}_4$) faces the scale ($\mathbf{39}Y_2$), main controller 20 immediately restores the fourth encoder Enc4 ($\mathbf{64}_4$). Then, according to the procedure described above, main controller 20 predicts measurement value $C_4$ of the fourth encoder Enc4 ($\mathbf{64}_4$), and provisionally sets an initial value ($c_4$ and $\phi_0$) determined by predicted value $C_4$ in the state shown in FIG. 19C, or more specifically, at a timing when the center of the adjacent two encoders ($\mathbf{64}_3$ and $\mathbf{64}_4$) is positioned at the center of the scale ($\mathbf{39}Y_2$).

Now, in the example previously described, the encoders whose measurement values were monitored to compute the position coordinate of wafer stage WST were immediately switched after setting the initial value (performing the linkage process) from a first combination of Enc1, Enc2, and Enc3 to a second combination of Enc2, Enc3, Enc4. However, in this case, the switching is not yet performed, and prediction of measurement value $C_4$ of the fourth encoder Enc4 is still being performed. Then, main controller 20 obtains a difference $\Delta C_4$, which is a difference of the predicted value and the actual measurement value of the fourth encoder Enc4 in the provisional setting state, and the difference is time-averaged until the initial value of the fourth encoder Enc4 is actually set. Incidentally, as it will be described later on, because the measurement results of encoder system 150 are monitored at every predetermined time interval in the embodiment, a moving average will be applied to a predetermined number of monitoring results.

Difference $\Delta C_4$ of the predicted value of measurement value $C_4$ of the fourth encoder Enc4 and the actual measurement value in the provisional setting state ideally takes a zero value, however, the value actually becomes nonzero due to various causes of error. Furthermore, because most causes of error occur randomly with respect to time, the value of difference $\Delta C_4$ fluctuates randomly as well with respect to the passage of time. In this case, by taking a time average of difference $\Delta C_4$, an error component is averaged and the random fluctuation becomes smaller. Therefore, main controller 20 takes 6 msec or more of the switching time, and applies time average to difference $\Delta C_4$. Then, after confirming that the fluctuation becomes small enough to be within a permissible level, main controller 20 adds difference $\Delta C_4$ to the provisional predicted value $C_4$ described earlier, and sets the initial values ($c_4$ and $\phi_0$) determined from predicted value $C_4+\Delta C_4$ as the measurement values of the fourth encoder Enc4. After this main setting is completed, main controller 20 switches the encoders used to compute the position coordinate of wafer stage WST to the second combination Enc2, Enc3, and Enc4. Then, main controller 20 suspends the first encoder End when it moves off away from the corresponding scale. This completes the switching process.

In the case of the other method, or the phase linkage method, the basics procedure is the same as the coordinate linkage method described earlier, however, the handling of the phase offset is different. In the coordinate linkage method, the phase offset to the fourth encoder was set again so that the position coordinate of wafer stage WST matches completely before and after the switching of the encoder. In the phase linkage method, the phase offset will not be reset, and the phase offset which is already set will be continuously used. More specifically, in the phase linkage method, only the count value will be reset. In this case, the position coordinate of wafer stage WST which is computed before and after the switching of the encoder may be discontinuous. However, when the phase offset is set precisely, errors do not occur unless a setting error of the count value occurs. Accordingly, accumulation of errors by the repetition of the linkage process also does not occur. Incidentally, as long as the setting procedure of the count value previously described is followed, the possibility of the setting error occurring is extremely low.

However, even if the phase offset is set precisely once, it may lose its accuracy due to a shift of the setting position of the encoder head and the like occurring. Therefore, after the start-up of exposure apparatus 100, the coordinate linkage method is applied at the time of the first linkage process so as to set the phase offset, and then at the time of the linkage process that follows, the phase linkage method is applied. Then, during an idle state of exposure apparatus 100 or at the beginning of a lot or the like, it is preferable to update the phase offset to the latest value by appropriately performing the coordinate linkage method.

Studies of the inventor(s) and the like have recently revealed that when wafer stage WST is driven in an accelerating manner, the scale is distorted, which causes a measurement error in the encoder. More specifically, when the coordinate linkage method is applied and a phase offset is set during the movement of wafer stage WST in an accelerating manner, a linkage error occurs, which reduces the accuracy of the phase offset. Accordingly, it is not preferable to apply the coordinate linkage method and to set the phase offset at the time of linkage process which occurs during the movement of wafer stage WST in an accelerating manner. Therefore, for example, at the time of start up, during an idle state of exposure apparatus 100, or at the beginning of a lot or the like, a sequence is to be performed to update the phase offset for of all or a part of the encoders (heads). However, in this sequence, the coordinate linkage method is to be performed by driving wafer stage WST at a constant speed or having positioned wafer stage WST at the linkage position without fail, so that an accurate phase offset is set. Then, by switching the encoders by applying the phase linkage method at the time of exposure and at the time of alignment measurement, it becomes possible to constantly secure position measurement of wafer stage WST with high precision.

Now, in the embodiment, the position coordinate of wafer stage WST is controlled by main controller 20 at a time interval of, for example, 96 μsec. At each control sampling interval, a position servo control system (a part of main controller 20) updates the current position of wafer stage WST, computes thrust command values and the like to position the stage to a target position, and outputs the values. As previously described, the current position of wafer stage WST is computed from the measurement values of the interferometers or the encoders.

Now, as is previously described, intensity of the interference light is measured with the interferometer and the encoder. The measurement values are forwarded to main controller 20. Main controller 20 counts the number of times (more specifically, the number of fringes of the interference light) of intensity change of the interference light. And from the counter value (count value), the position of wafer stage WST is computed. Accordingly, main controller 20 monitors the measurement value of the interferometer and the encoder at a time interval (measurement sampling interval) much shorter than the control sampling interval so as not to lose track of the fringes.

Therefore, in the embodiment, main controller 20 constantly continues to receive the measurement values by a discharge from all the encoders (not always three) that face the scanning area of the scales, while wafer stage WST is within the effective stroke range. And, main controller 20 performs the switching operation (a linkage operation between a plurality of encoders) of the encoders described above in synchronization with position control of wafer stage WST which is performed at each control sampling interval. In such an arrangement, the switching operation of an electrically high-speed encoder will not be required, which also means that costly hardware to realize such a high-speed switching operation does not necessarily have to be arranged.

Figure 21:
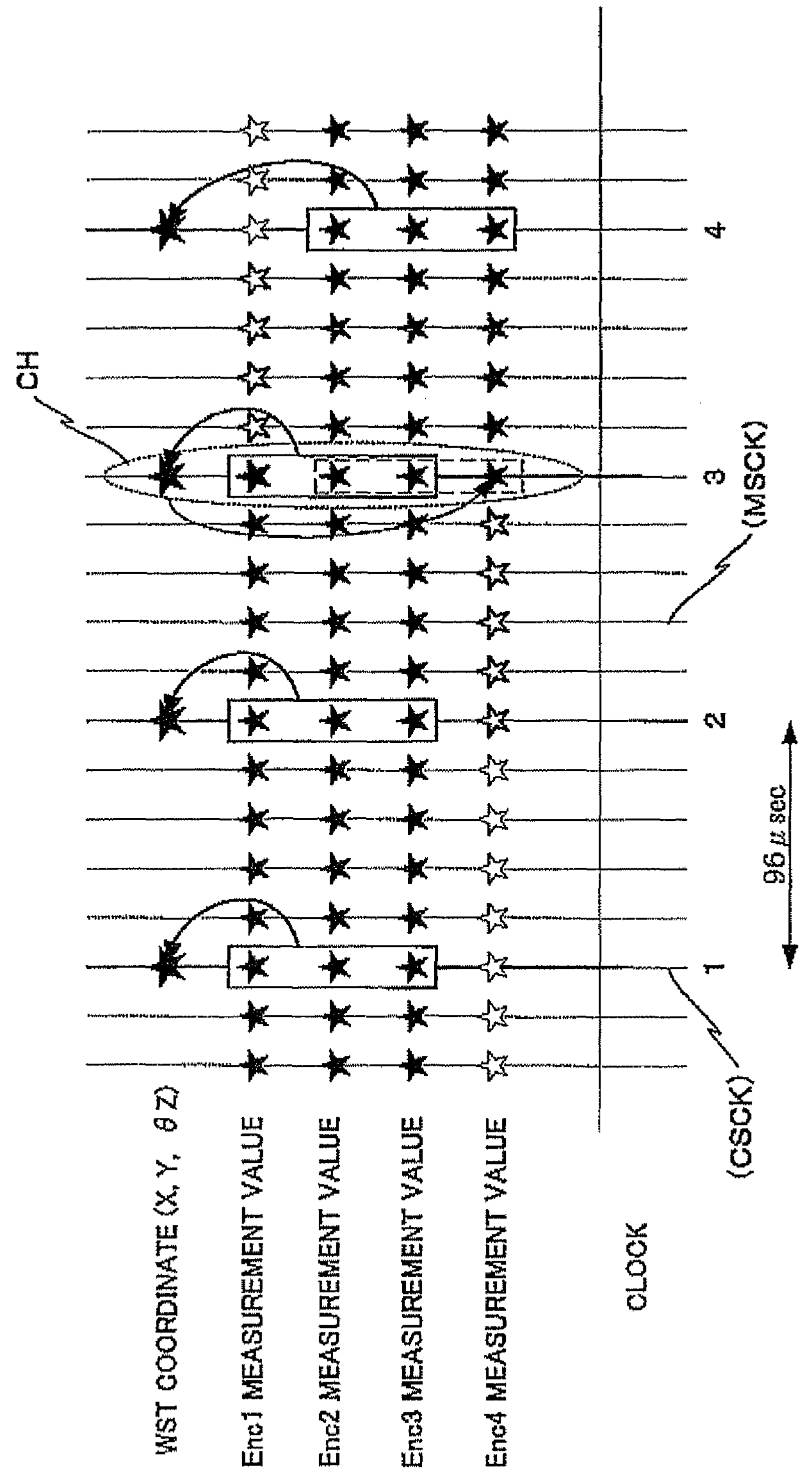
FIG. 21 is a view conceptually showing position control of the wafer stage, intake of the measurement value of the encoder, and an encoder switching timing.

FIG. 21 conceptually shows the timing of position control of wafer stage WST, the uptake of the measurement values of the encoder, and the switching of the encoder in the embodiment. Reference code CSCK in the drawing indicates the generation timing of a sampling clock (a control clock) of the position control of wafer stage WST, and reference code MSCK indicates a generation timing of a sampling clock (a measurement clock) of the measurement of the encoder (and interferometer). Further, reference code CH typically shows the switching (linkage) process of the encoder described in detail in FIGS. 19A to 19E.

Main controller 20 executes the switching of the encoder (head) by dividing the operation into two stages; the restoration and the linkage process of the encoder. When describing the switching according to an example shown in FIG. 21, first of all, the encoders which are operating at the time of the first control clock are the three encoders of the first combination, Enc1, Enc2 and Enc3. Main controller 20 monitors the measurement value of these encoders, and computes the position coordinate (X, Y, θz) of wafer stage WST. Next, according to the position coordinate of wafer stage WST, main controller 20 confirms all the encoders which are on the scanning area of the X scales and the Y scales. And, from the encoder, main controller 20 specifies encoder Enc4 which needs restoration, and restores the encoder at the time of the second control clock. At this point in the process, the number of operating encoders becomes 4. And, from the operating encoders, main controller 20 specifies the encoder whose measurement values are to be monitored to compute the position coordinate of wafer stage WST at the time of the next control clock, according to the position coordinate of wafer stage WST. Assume that the second combination Enc2, Enc3 and Enc4 are specified here. Main controller 20 confirms whether this specified combination matches the combination that was used to compute the position coordinate of wafer stage WST at the time of the previous control clock. In this example, encoder Enc1 in the first combination and encoder Enc4 in the second combination are different. Therefore, a linkage process CH to the second combination is performed at the time of the third control clock. Hereinafter, main controller 20 monitors the measurement values of the second combination Enc2, Enc3 and Enc4, and computes the position coordinate (X, Y, θz) of wafer stage WST. As a matter of course, linkage process CH is not performed if there is no change in the combination. Encoder Enc1, which is removed from the monitoring subject, is suspended at the time of the fourth control clock when encoder Enc1 moves off from the scanning area on the scale.

Main controller 20 performs scheduling of the encoder switching process for each shot map (exposure map), and stores the results in memory 34. Accordingly, if there is no retry (redoing), then the contents of the schedule in every shot map becomes constant. However, in actual practice, because a retry must be considered, it is preferable for main controller 20 to constantly update the schedule slightly ahead while performing the exposure operation.

Incidentally, so far, in order to describe the principle of the switching method of the encoder to be used in position control of wafer stage WST in the embodiment, four encoders (heads) Enc1, Enc2, Enc3 and Enc4 were taken up, however, encoders Enc1 and Enc2 representatively show any of the following Y heads 65 and 64 of head units 62A and 62C and Y heads 67 and 68 of head units 62E and 62F, encoder Enc3 representatively shows X head 66 of head units 62B and 62D, and encoder Enc4 representatively show any of the following Y heads 65, 64, 67, and 68 or X head 66.

By detecting a foreign material adhered on the scale surface and the like, abnormality may occur in the measurement results of the encoder. In this case, the scanning beam of the encoder has an expanse of 2 mm in the measurement direction and 50 μm in the grid line direction on the scale surface (the grating surface of the reflection grating). Accordingly, even a small foreign material can be detected. Furthermore, in a practical point of view, it is extremely difficult to completely prevent foreign materials from entering the device and from adhering on the scale surface for over a long period. A situation where a head of an encoder malfunctions and the output from the encoder cannot be obtained in a certain section can be considered. Therefore, when abnormality is detected by the measurement result of the encoder, a backup operation such as to switch the measurement to a measurement by interferometer system 118, or to correct the measurement result of the encoder using the measurement result of interferometer system 118 becomes necessary.

In the case of the liquid immersion type exposure apparatus employed in the embodiment, water droplets may remain on the scale surface. For example, the liquid immersion area frequently passes over scale 39$X_1$ which is adjacent to measurement stage MST at the time of the scrum state. Further, as for the other scales as well, at the time of edge shot exposure, the liquid immersion area enters a part of an area on the scale. Accordingly, the water droplets that cannot be recovered and are left on the scale may be a source which causes abnormality to occur in the measurement results of the encoder. In this case, when the scanning beam from the encoder scans the water droplets on the scale, the scanning beam is interrupted by the water droplets which reduces the beam intensity, and in the worst case, the output signal is cut off. Further, because the scanning beam scans materials of a different refractive index, linearity of the measurement results with respect to the displacement may deteriorate. On the basis of such various influences, main controller 20 must determine the occurrence of abnormality in the measurement results.

The abnormality of the measurement results of the encoder can be determined from from sudden temporal change of the measurement results, or from deviation or the like of the measurement results of the encoder from the measurement results of interferometer system 118. First of all, in the former case, when the position coordinates of wafer stage WST obtained at every measurement sampling interval using the encoders change so much from the position coordinates obtained at the time of the previous sampling that it cannot be possible when taking into considering the actual drive speed of the stage, main controller 20 decides that abnormality has occurred. As for the latter case, in the embodiment, position measurement using interferometer system 118 is performed in the whole stroke area, independently from the position measurement of wafer stage WST using the encoder. Therefore, in the case the deviation of the position coordinates of wafer stage WST obtained using the encoder from the position coordinates obtained using interferometer system 118 exceeds a permissible level which is decided in advance, main controller 20 decides that abnormality has occurred.

When abnormality is detected in the measuring instrument system, such as the output signal of encoders 70A to 70F (refer to FIG. 6) being cut off, main controller 20 immediately performs a backup operation so as to switch to a servo control by interferometer system 118 (refer to FIG. 6) in order to prevent the servo control of the drive of wafer stage WST (hereinafter shortly referred to as stage drive control, as appropriate) from stopping. More specifically, main controller 20 switches the measuring instrument system used to compute the position coordinates of wafer stage WST (wafer table WTB) from encoder system 150 (encoders 70A to 70F) to interferometer system 118. On this operation, a linkage process is performed so that the position coordinates of wafer stage WST that have been computed are successive.

Figure 22:
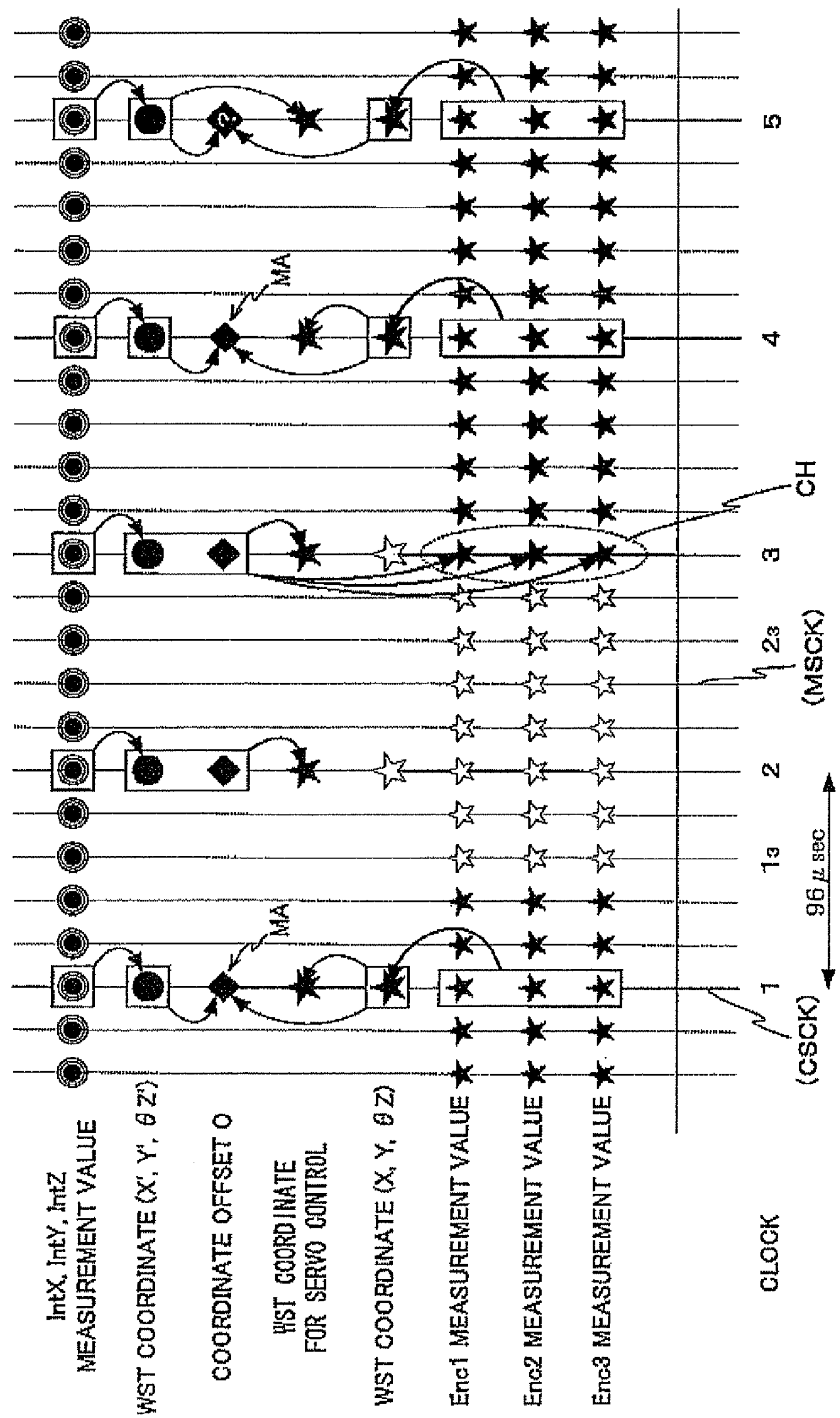
FIG. 22 is a view showing an outline of a linkage process in a switching (and a reversed switching) from servo control of the wafer stage by the encoder system to servo control by the interferometer system.

FIG. 22 shows an outline of the linkage process in the switching (and switching from servo control of the drive of wafer stage WST by interferometer system 118 to servo control of the drive of wafer stage WST by encoder system 150) from servo control of the drive of wafer stage WST by encoder system 150 to servo control of the drive of wafer stage WST by interferometer system 118. As shown in this FIG. 22, first of all, main controller 20 performs pre-processing for linkage process with respect to each control clock (CSCK). In this case, at the time of measurement clock (MSCK), as shown by a solid black figure, the output signals of both encoder system 150 and interferometer system 118 are constantly monitored. Incidentally, in actual practice, the measurement clock of interferometer system 118 occurs more frequently than the measurement clock of encoder system 150, however, in this case, in order to avoid complication, only the measurement clock which occurs simultaneously is shown. And, at the time of the control clock, main controller 20 computes the position coordinate (X, Y, θz) of wafer stage WST from the measurement results of the encoder system (Enc1, Enc2, Enc3) as in the first clock in FIG. 22, and also computes the position coordinate (X', Y', θz') of wafer stage WST from the measurement results of the interferometer system (IntX, IntY, IntZ). At the same time, the difference of the two position coordinates (X, Y, θz) and (X', Y', θz') is obtained. Furthermore, moving average MAK{(X, Y, θz)−(X', Y', θz')} of this difference is taken for a predetermined number of clocks, and is kept as a coordinate offset O. However, in FIG. 22, the computing of the moving average of the difference is outlined by reference code MA.

As is previously described, this coordinate offset O can also be used as an index to judge abnormality generation in the measurement results of encoder system 150. If an absolute value of coordinate offset O is equal to or under a permissible value decided beforehand, main controller 20 will decide that no abnormality has occurred, and in the case the absolute value exceeds the permissible value, then main controller 20 will decide that abnormality has occurred. At the time of the first control clock in FIG. 22, main controller 20 decides that no abnormality has occurred, therefore, refers to the position coordinate (X, Y, θz) of wafer stage WST computed from the measurement results of encoder system 150 as the position coordinate used for the servo control of wafer stage WST.

On detecting the abnormality of the output signals of encoder system 150, main controller 20 promptly performs the linkage process to interferometer system 118. For example, at the time of the 13 clock in FIG. 22, as shown by an outlined figure in FIG. 22, assume that the output signals of Enc1, Enc2, and Enc3 are cut off. In this case, main controller 20 adds the coordinate offset O kept at the time of the first control clock just before to the position coordinate (X', Y', θz') of wafer stage WST computed from the measurement results of interferometer system 118 at the time of the second control clock, so that the position coordinate coincides with the position coordinate (X, Y, θz) of wafer stage WST computed from the measurement results of encoder system 150 at the time of the control clock just before (in this case, at the time of the first control clock). Then, until the recovery of the output signal is detected, main controller 20 performs the stage drive control, referring to the position coordinate [(X', Y', θz')+O] to which this offset cancellation has been performed.

Incidentally, FIG. 22 shows the case where all the output signals of the three encoders Enc1, Enc2, and Enc3 are cut off at the time of the $1_3$ clock. However, as well as the three output signals, in the case any one or two output signals are cut off, because when the output signals supplied becomes two or less, the position coordinate of wafer stage WST cannot be computed using the simultaneous equations (20a) to (20c) previously described, therefore, main controller 20 performs a similar switching of the stage drive control.

And, on detecting the recovery of the output signals of encoder system 150, main controller 20 promptly performs the reverse linkage process from interferometer system 118 to encoder system 150. In this case, assume that the output signals of encoders Enc1, Enc2, and Enc3 are restored at the time of the $2_3$ clock in FIG. 22. At the time of the third control clock after having detected the recovery, main controller 20 substitutes the position coordinate [(X', Y', θz')+O] supplied from interferometer system 118 to which offset cancellation has been supplied into simultaneous equations (20a) to (20c) and computes the measurement values that each encoder Enc1, Enc2, and Enc3 is to show, and performs initialization. In FIG. 22, this reverse linkage process is shown by reference code CH. Incidentally, in this case, phase linkage method can be applied. From the next fourth control clock onward, similar to the time of the first clock, main controller 20 performs the usual servo control by encoder system 150. At the same time, main controller 20 begins to update the coordinate offset again.

Not only in the case when the output signals from the encoder is cut off as described above, main controller 20 performs a similar switching of the stage drive control also in the case when the reliability of the output signals is low. In this case, the reliability of the output signals is inspected by using the coordinate offset previously described as an index.

The fifth control clock in FIG. 22 shows a state when reliability was judged to be less than a permissible level and the position coordinate (X', Y', θz') of wafer stage WST computed from the measurement results of interferometer system 118 is used as the position coordinate used in servo control. Incidentally, because the coordinate offset at this time is unreliable, it cannot be used in the offset cancellation. Therefore, of the coordinate offsets obtained in the past, a predetermined number of clocks immediately before can be stored, and the cancellation can be performed using the latest coordinate offsets whose reliability is sufficiently compensated. And, in the case when the reliability is sufficiently restored, the position coordinate (X, Y, θz) of wafer stage WST computed from the measurement results of encoder system 150 is used as the position coordinate used in the servo control, similar to the time of the first and fourth control clock.

When abnormality occurs in encoder system 150, main controller 20 selects a suitable processing method according to the generation timing. As a processing method that can be performed frequently, the following three methods are prepared. First of all, (a) an alert of abnormality generation is issued to a user, and by automatic operation, the stage drive control is switched to a control by interferometer system 118. (b) An alert is issued to a user, and requests the user to judge whether to continue the process believing that the backup operation has functioned normally, perform the alignment measurement all over again along with the switching of stage drive control by interferometer system 118 to the stage drive control by encoder system 150, or to cancel the process. (c) Perform the automatic switching of the stage drive control without issuing an alert. Method (a) should be applied at the time of exposure, whereas method (b) should be applied at the time of alignment. Incidentally, method (c) is to be applied on the switching of stage drive control from encoder system 150 to interferometer system 118.

There is a case when main controller 20 switches to a stage drive control by interferometer system 118 (refer to FIG. 6) besides the case described above when abnormality occurs in encoder system 150 (refer to FIG. 6). As is previously described, encoder system 150 is placed to measure the position coordinates of wafer stage WST in the effective stroke area of wafer stage WST, or more specifically, in the area where the stage moves for alignment and exposure operation. However, the areas where the stage moves for loading and unloading of the wafer shown in FIGS. 9 and 10 are not covered. Accordingly, when wafer stage WST is located at the loading/unloading area, a stage drive control by interferometer system 118 is executed. Therefore, as shown in FIG. 11, wafer stage WST passes over the effective stroke area and the loading/unloading area, main controller 20 performs the switching process of the stage drive control.

First of all, when wafer stage WST moves to the effective stroke area from the loading/unloading area to begin exposure, main controller 20 switches from the stage drive control by interferometer system 118 to the stage drive control by encoder system 150. Here, because wafer alignment (EGA) to decide the wafer offset is executed later, precision of the XY position measurement is not required. In this case, main controller 20 applies the coordinate linkage method and initializes the measurement values of the three encoders to be used so that the position coordinates of wafer stage WST computed before and after the switching become continuous. Specifically, main controller 20 substitutes the position coordinate (X', Y', θz') of wafer stage WST computed from the measurement results of interferometer system 118 into formulas (20a) to (20c), and decides theoretical values $C_1$, $C_2$, and $C_3$ which the three encoders to be used should show. And the position coordinate (X, Y, θz) of wafer stage WST is calculated back, by separating each of the three determined theoretical values to a discrete value by a measurement unit (the product of a measurement unit and a count value) and the sum of a minute amount, and substituting the results in formulas (20a) to (20c). On this calculation, the minute amount is decided so as to reproduce the position coordinate (X', Y', θz') obtained from interferometer system 118. The minute amount which has been determined is converted into a phase unit, and the phase offset is obtained. Finally, the count values and the phase offset obtained in the manner described are to be set to the three encoders. Incidentally, the phase linkage method can be applied. In such a case, only the count values are to be set to the three encoders.

However, because the measurement error of rotation angle θz causes a rotation shift between the shot area on the wafer and the exposure pattern, the rotation angle of wafer stage WST during the reticle alignment (the Pri-BCHK latter process previously described) must be precisely reproduced. Therefore, also on the switching of stage drive control by interferometer system 118 to stage drive control by encoder system 150, a precise linkage process becomes indispensable.

Incidentally, in the embodiment, when the Y interferometer and the Y encoder are taken as an example, the spacing between the two measurement axes of Y interferometer 16, for example, is 26 mm. In contrast, the spacing between Y head 65 of Y encoder 62A that faces Y scale 39$Y_1$ and Y head 64 of Y encoder 62C that simultaneously faces Y scale 39$Y_2$, for example, is 422 mm. Therefore, in the switching from interferometer system 118 to encoder system 150, the coordinate linkage method is applied so that rotation angle θz becomes continuous before and after the switching. Here, it is assumed that the linkage error is small enough to be ignored. In this case, because the measurement error of rotation angle θz is equal in both of the measuring instrument systems, the measurement error of the Y interferometer is amplified proportional to the spacing of the measurement axes, or more specifically, around 16 times, which becomes the measurement error of the Y encoder. In this viewpoint, even if the coordinate linkage method or the phase linkage method is employed, it is inconvenient to use rotation angle θz indicated by interferometer system 118 in the linkage process.

Now, as shown in FIG. 11, in the position of wafer stage WST at the time of the beginning of stage drive control by encoder system 150, Y head 67$_3$ and Y head 67$_2$, which is adjacent to Y head 67$_3$, face the same scanning area on Y scale 39$Y_2$. Further, Y head 68$_2$ and Y head 68$_3$, which is adjacent to Y head 68$_2$, face the same scanning area on Y scale 39$Y_1$. Therefore, suppressing the amplification of the measurement error in the linkage process from interferometer system 118 to encoder system 150 by using two adjacent Y heads that simultaneously face the same scale is considered.

In a state at the time of beginning of the stage drive control by encoder system 150 shown in FIG. 11, the three encoder heads to be used after switching are 66$_1$, 67$_3$, and 68$_2$. And, Y heads 67$_2$ and 68$_3$ adjacent to Y heads 67$_3$ and 68$_2$, respectively, are to be used secondarily to control the amplification of the measurement error.

First of all, the phase linkage method is applied, and the switching process from interferometer system 118 to the three encoder heads 66$_1$, 67$_3$, and 68$_2$ is performed. More specifically, the position coordinate (X', Y', θz') of wafer stage WST which interferometer system 118 indicates is substituted into formulas (20a) to (20c), and the theoretical values that the three encoder heads should show are computed. These theoretical values are converted into count values, and the count values which have been obtained are initialized as the measurement values of the three encoders. At this point, the phase offset is not reset, and the phase offset which has already been set is sequentially used.

In a state where the linkage process described above is completed, the phase of Y heads $67_3$ and $68_2$ (φ' in formula (16)) is compared. And, it is confirmed that the phase of the Y heads substantially matches. Furthermore, it is confirmed that no linkage errors have occurred in their count values. Then, it is confirmed that the phase of Y heads $67_2$ and $68_3$ which are adjacent to Y heads $67_3$ and $68_2$ also substantially matches.

In this case, when a linkage error occurs in the count value of Y heads $67_3$ and $68_2$, then, even if the phase of the Y heads matches each other, the phase will have actually shifted by an integral multiple of 2π. Here, the phase is defined within a range of 0 to 2π. In this case, phase difference $\Delta\phi_{23}$ of the phase of adjacent heads $67_2$ and $68_3$ relates to phase difference $\Delta\phi_{32}$ of Y heads $67_3$ and $68_2$ as in $\Delta\phi_{23}=|p_{67,2}-p_{68,3}|/|p_{67,3}-p_{68,2}|\Delta\phi_{32}$. In this case, coefficient $|p_{67,2}-p_{68,3}|/|p_{67,3}-p_{68,2}|$ is the spacing ratio of the heads, which is around 1.15, according to the setting position of the Y heads in the embodiment. Accordingly, the phase difference of adjacent heads $67_2$ and $68_3$ will take the value of $\Delta\phi_{23}=1.15\times2\pi n$.

From the principle above, the phase of Y heads $67_3$ and $68_2$ almost matches ($\Delta\phi_{32}\approx0$). Furthermore, if it can be confirmed that the phase of the adjacent heads $67_2$ and $68_3$ also substantially matches ($\Delta\phi_{23}\approx0$), then, it would mean that the confirmation has been made of the switching process (linkage process) from interferometer system 118 to the three encoder heads $66_1$, $67_3$, and $68_2$ to have been precisely completed. On the contrary, in the case the phase of the adjacent heads $67_2$ and $68_3$ is shifted by $1.15\times2\pi n$, however, $n\neq0$, (since the phase is output as the value between 0 to 2π, $\Delta\phi_{23}\approx0.15\times2\pi n$ is detected), even when the phase of Y heads $67_3$ and $68_2$ substantially matches ($\Delta\phi_{32}\neq0$), it means that a linkage error has occurred. In such a case, the count values of Y heads $67_3$ and $68_2$ are to be corrected, or the switching process is to be performed again.

Incidentally, the encoder heads which are used for stage position measurement are set so that they are usually automatically selected. However, at the time of switching to the stage drive control by encoder system 150, because a high linkage precision is required, the encoder heads should be set so that a particular encoder is selected as in the description above. Further, is also favorable to realize high linkage precision by employing the FIA measurement using alignment systems AL1 and AL$\mathbf{2}_{1\ to\ 4}$ together.

Meanwhile, when exposure has been completed and wafer stage WST moves from the loading/unloading area to the effective stroke area to exchange the wafer, the stage drive control by encoder system 150 is switched to the stage drive control by interferometer system 118. The procedure is basically similar to the backup operation to switch to servo control by interferometer system 118 previously described. However, on the linkage process, the coordinate offset is not used to dissolve the linkage error accumulated in each switching of the encoder head. More specifically, the stage drive control is performed referring to uncorrected position coordinates of wafer stage WST that are obtained from interferometer system 118.

However, when the coordinate offset grows large, or more specifically, the divergence between the output signals of interferometer system 118 and the output signals of encoder system 150 grows large, the position coordinates of wafer stage WST which is computed before and after the switching become discontinuous, and an inconvenience may occur in the stage drive control. To avoid this, the following process can be carried out. (a) After the exposure has been completed, when wafer stage WST stops for the scrum state with measurement stage MST, the control is switched to stage servo control by interferometer system 118. (b) The stage moves to the unload position without performing an explicit switching process, and when the encoder output is cut off, the control is switched to servo control by interferometer system 118. In the process above, as in the backup process by interferometer system 118 previously described, the linkage method using the coordinate offset is performed so that the position coordinates of the stage do not become discontinuous. Then, when wafer stage WST stops, such as when the wafer is unloaded, the position coordinates of wafer stage WST are to be reset to uncorrected position coordinates obtained from interferometer system 118, without using the coordinate offset.

Incidentally, in the description so far, in order to simplify the description, while main controller 20 performed the control of each part of the exposure apparatus including the control of reticle stage RST and wafer stage WST, the linkage of interferometer system 118 and encoder system 150, the switching (backup) and the like, as a matter of course, at least a part of the control of main controller 20 described above can be performed shared by a plurality of controllers. For example, a stage controller which performs the control of both stages RST and WST, the linkage of interferometer system 118 and encoder system 150, the switching (backup) and the like can be arranged to operate under main controller 20. Further, the control that main controller 20 performs does not necessarily have to be realized by hardware, and the control can be realized by software using a computer program that sets the operation of main controller 20 or each operation of some controllers that share the control as previously described.

As discussed in detail above, according to exposure apparatus 100 related to the embodiment, main controller 20 performs position measurement of wafer stage WST using interferometer system 118 in parallel with position measurement of the movement plane of wafer stage WST using encoder system 150. Then, in cases such as when abnormality of encoder system 150 is detected in the position measurement, or when wafer stage WST moves off from the measurement area of encoder system 150, main controller 20 switches from drive control (servo control) of wafer stage WST based on the measurement results of encoder system 150 to drive control (servo control) of wafer stage WST based on the measurement results of interferometer system 118. Accordingly, wafer stage WST can be driven continuously two-dimensionally in the entire stroke area, even at the time when abnormality occurs in encoder system 150.

Further, according to exposure apparatus 100 related to the embodiment, wafer stage WST is driven two-dimensionally by main controller 20 with good precision, while a plurality of encoders is switched according to the method described above, or continuously even at the time when abnormality occurs in encoder system 150. And, because the pattern of reticle R is transferred and formed on each of a plurality of shot areas on wafer W mounted on wafer stage WST which is driven with good precision, it becomes possible to form a pattern with good precision on each shot area on wafer W. Especially, in the embodiment, because of the relative movement between illumination light IL, which is irradiated on wafer W via reitcle R and projection optical system PL, and wafer W, wafer stage WST is driven with good precision by the method described above. Accordingly, it becomes possible to form a pattern on wafer W with good precision by scanning exposure. Furthermore, in the embodiment, because a high-resolution exposure can be realized by liquid immersion exposure, a fine pattern can be transferred with good precision on wafer W also from this viewpoint.

Incidentally, in the embodiment above, while the case has been described where the movable body drive method and the movable body drive system related to the present invention is used for the drive of wafer stage WST, as well as this, or instead of this, the movable body drive method and the movable body drive system related to the present invention can be used for the drive of other movable bodies, such as for example, reticle stage RST and/or the measurement stage and the like. Especially, in the case of using the movable body drive method and the movable body drive system related to the present invention for the drive of reticle stage RST as well as wafer stage WST, it becomes possible to transfer the pattern of reticle R on wafer W with good precision.

Incidentally, the configuration of each measurement device such as the encoder system described in the embodiment above is only an example, and it is a matter of course that the present invention is not limited to this. For example, in the embodiment above, an example has been described where an encoder system is employed that has a configuration where a grid section (a Y scale and an X scale) is arranged on a wafer table (a wafer stage), and X heads and Y heads facing the grid section are placed external to the wafer stage, however, the present invention is not limited to this, and as is disclosed in, for example, the U.S. Patent Application Publication No. 2006/0227309 description, an encoder system which is configured having an encoder head arranged on the wafer stage and has a grid section (for example, a two-dimensional grid, or a linear grid section having a two-dimensional placement) facing the encoder heads placed external to the wafer stage can also be adopted. In this case, a Z head can also be arranged on the wafer stage, and the surface of the grid section can be a reflection surface on which the measurement beam of the Z head is irradiated. Further, in the embodiment above, while the case has been described where an optical encoder is used as the encoder, a magnetic encoder can also be used.

Further, in the embodiment above, while the lower surface of nozzle unit 32 and the lower end surface of the tip optical element of projection optical system PL were on a substantially flush surface, as well as this, for example, the lower surface of nozzle unit 32 can be placed nearer to the image plane (more specifically, to the wafer) of projection optical system PL than the outgoing surface of the tip optical element. That is, the configuration of local liquid immersion unit 8 is not limited to the configuration described above, and the configurations can be used, which are described in, for example, EP Patent Application Publication No. 1 420 298 description, the pamphlet of International Publication No. 2004/055803, the pamphlet of International Publication No. 2004/057590, the pamphlet of International Publication No. 2005/029559 (the corresponding U.S. Patent Application Publication No. 2006/0231206 description), the pamphlet of International Publication No. 2004/086468 (the corresponding U.S. Patent Application Publication No. 2005/0280791 description), the U.S. Pat. No. 6,952,253 description, and the like. Further, as disclosed in the pamphlet of International Publication No. 2004/019128 (the corresponding U.S. Patent Application Publication No. 2005/0248856 description), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as H+, Cs+, K+, Cl−, SO42−, or PO42− to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an F2 laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery device, a recovery pipe or the like.

Further, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a reduction projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stage WSTs, as is disclosed in, for example, the U.S. Pat. No. 6,590,634 description, the U.S. Pat. No. 5,969,441 description, the U.S. Pat. No. 6,208,407 description and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an F2 laser (output wavelength: 157 nm), an Ar2 laser (output wavelength: 126 nm) or a Kr2 laser (output wavelength: 146 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides the sources above, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, as disclosed in, for example, U.S. Pat. No. 6,611,316 description, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body drive method and the movable body drive system of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus of a sample or a wire bonding apparatus in other precision machines.

Incidentally, the disclosures of the various publications (descriptions), the pamphlets of the International Publications, and the U.S. patent application Publication descriptions and the U.S. patent descriptions that are cited in the embodiment above and related to exposure apparatuses and the like are each incorporated herein by reference.

Semiconductor devices are manufactured through the following steps: a step where the function/performance design of the wafer is performed, a step where a wafer is made using silicon materials, a lithography step where the pattern formed on the reticle (mask) by the exposure apparatus (pattern formation apparatus) in the embodiment previously described is transferred onto a wafer, a development step where the wafer that has been exposed is developed, an etching step where an exposed member of an area other than the area where the resist remains is removed by etching, a resist removing step where the resist that is no longer necessary when etching has been completed is removed, a device assembly step (including processes such as a dicing process, a bonding process, and a packaging process), inspection steps and the like.

By using the device manufacturing method of the embodiment described above, because the exposure apparatus (pattern formation apparatus) in the embodiment above and the exposure method (pattern formation method) thereof are used in the exposure step (step 216), exposure with high throughput can be performed while maintaining the high overlay accuracy. Accordingly, the productivity of highly integrated microdevices on which fine patterns are formed can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body drive method in which a movable body is driven at least in a uniaxial direction, the method comprising:

a first process in which positional information of the movable body in the uniaxial direction is measured using a laser interferometer and an encoder at their respective sampling intervals, and the movable body is driven in the uniaxial direction based on measurement results of the encoder; and a second process in which a measurement device used in position control of the movable body in the uniaxial direction is switched from the encoder to the laser interferometer whose output coordinate is corrected so that the output coordinate becomes successive to the output coordinate of the encoder just before when abnormality occurring in the encoder output is detected.

2. The movable body drive method according to claim 1, the method further comprising:

a third process in which a difference between the output coordinate by the encoder and the output coordinate by the laser interferometer is updated at every predetermined interval, wherein in the second process, when abnormality occurring in the encoder output is detected, by correcting the output coordinate of the laser interferometer at that time using the latest difference, the output coordinate of the laser interferometer is corrected to be successive to the output coordinate of the encoder just before.

3. The movable body drive method according to claim 2, the method further comprising:

a fourth process in which after the measurement device used in the position control of the movable body in the uniaxial direction has been switched from the encoder to the laser interferometer, the measurement device used in the position control of the movable body in the uniaxial direction is switched from the laser interferometer to the encoder.

4. The movable body drive method according to claim 3 wherein in the fourth process, the measurement device used in the position control of the movable body in the uniaxial direction is switched from the laser interferometer to the encoder after reliability of the output of the encoder is evaluated.

5. The movable body drive method according to claim 3 wherein the switching from the laser interferometer to the encoder in the fourth process is performed by computing the output coordinate of the encoder during the switching, using an offset of a measurement unit computed based on the output coordinate of the laser interferometer and an offset of the encoder equal to or less than the measurement unit that has already been set.

6. A pattern formation method to form a pattern on an object wherein a movable body on which the object is mounted is driven using the movable body drive method according to claim 1 to perform pattern formation to the object.

7. The pattern formation method according to claim 6 wherein the object has a sensitive layer, and a pattern is formed on the object by an exposure of the sensitive layer by irradiation of an energy beam.

8. A device manufacturing method including a pattern formation process wherein in the pattern formation process, a pattern is formed on a substrate using the pattern formation method according to claim 6.

9. A pattern formation method to form a pattern on an object wherein at least one of a plurality of movable bodies including a movable body on which the object is mounted is driven using the movable body drive method according to claim 1 to perform pattern formation to the object.

10. The pattern formation method according to claim 9 wherein the object has a sensitive layer, and a pattern is formed on the object by an exposure of the sensitive layer by irradiation of an energy beam.

11. A device manufacturing method including a pattern formation process wherein in the pattern formation process, a pattern is formed on a substrate using the pattern formation method according to claim 9.

12. An exposure method in which a pattern is formed on an object by an irradiation of an energy beam wherein for relative movement of the energy beam and the object, a movable body on which the object is mounted is driven, using the movable body drive method according to claim 1.

13. A movable body drive method in which a movable body is driven in directions of three degree of freedom in a predetermined plane, the method comprising:

a first process in which the movable body is driven based on an output of an interferometer system that measures positional information in the directions of three degrees of freedom; and a second process in which when switching from servo control of the position in the directions of three degrees of freedom of the movable body using the interferometer system to servo control of the position in the directions of three degrees of freedom of the movable body using an encoder system, the switching of the control is performed by phase linkage where an output coordinate of the encoder system at the time of the switching is computed using an offset of a measurement unit computed based on the output coordinate of the interferometer system and an offset of the encoder system equal to or less than the measurement unit that has already been set for at least about a rotational direction in the predetermined plane.

14. The movable body drive method according to claim 13 wherein when switching from servo control of the position in the directions of three degrees of freedom of the movable body using the interferometer system to servo control of the position in the directions of three degrees of freedom of the movable body using the encoder system, the switching of the control is performed by a coordinate linkage where an initial value of the output coordinate of the encoder system is set coinciding with the output coordinate of the interferometer system for directions of two degrees of freedom, excluding the rotational direction in the predetermined plane.

15. The movable body drive method according to claim 13 wherein in the movable body, a grating that has a grid arranged periodically in the uniaxial direction is installed, and the encoder system has a head unit, which intersects a longitudinal direction of the grating and is placed substantially covering the whole area of the stroke of the movable body, including a plurality of head sections that are also placed at a spacing so that two adjacent head sections do not move off from the grating, and in the second process, on the switching of the control, the phase linkage is performed for the rotational direction in the predetermined plane, after having converted rotation quantity of the movable body measured by the interferometer system into rotation quantity between two adjacent head sections of the head unit.

16. A pattern formation method to form a pattern on an object wherein a movable body on which the object is mounted is driven using the movable body drive method according to claim 13 to perform pattern formation to the object.

17. The pattern formation method according to claim 16 wherein the object has a sensitive layer, and a pattern is formed on the object by an exposure of the sensitive layer by irradiation of an energy beam.

18. A device manufacturing method including a pattern formation process wherein in the pattern formation process, a pattern is formed on a substrate using the pattern formation method according to claim 16.

19. A pattern formation method to form a pattern on an object wherein at least one of a plurality of movable bodies including a movable body on which the object is mounted is driven using the movable body drive method according to claim 13 to perform pattern formation to the object.

20. The pattern formation method according to claim 19 wherein the object has a sensitive layer, and a pattern is formed on the object by an exposure of the sensitive layer by irradiation of an energy beam.

21. A device manufacturing method including a pattern formation process wherein in the pattern formation process, a pattern is formed on a substrate using the pattern formation method according to claim 19.

22. An exposure method in which a pattern is formed on an object by an irradiation of an energy beam wherein for relative movement of the energy beam and the object, a movable body on which the object is mounted is driven, using the movable body drive method according to claim 13.

23. A movable body drive method in which a movable body is driven at least in a uniaxial direction, the method comprising:

a first process in which the movable body is driven based on an output of an encoder that measures positional information in the uniaxial direction of the movable body; and a second process in which in the case of switching from servo control of the position of the movable body using the encoder to servo control of the position of the movable body using a laser interferometer, switching of the control is performed at the point when the movable body stops or becomes stationary and when a difference between the positional information of the movable body by the encoder and the positional information of the movable body by the laser interferometer exceeds a predetermined threshold value.

24. A pattern formation method to form a pattern on an object wherein a movable body on which the object is mounted is driven using the movable body drive method according to claim 23 to perform pattern formation to the object.

25. The pattern formation method according to claim 24 wherein the object has a sensitive layer, and a pattern is formed on the object by an exposure of the sensitive layer by irradiation of an energy beam.

26. A device manufacturing method including a pattern formation process wherein in the pattern formation process, a pattern is formed on a substrate using the pattern formation method according to claim 24.

27. A pattern formation method to form a pattern on an object wherein at least one of a plurality of movable bodies including a movable body on which the object is mounted is driven using the movable body drive method according to claim 23 to perform pattern formation to the object.

28. The pattern formation method according to claim 27 wherein the object has a sensitive layer, and a pattern is formed on the object by an exposure of the sensitive layer by irradiation of an energy beam.

29. A device manufacturing method including a pattern formation process wherein in the pattern formation process, a pattern is formed on a substrate using the pattern formation method according to claim 27.

30. An exposure method in which a pattern is formed on an object by an irradiation of an energy beam wherein for relative movement of the energy beam and the object, a movable body on which the object is mounted is driven, using the movable body drive method according to claim 23.

31. A movable body drive method in which a movable body is driven at least in a uniaxial direction, the method comprising:

a first process in which the movable body is driven based on an output of an encoder that measures positional information in the uniaxial direction of the movable body; and a second process in which a coordinate linkage is performed in the case of switching from servo control of the position of the movable body using the encoder to servo control of the position of the movable body using the laser interferometer, when abnormality occurring in the encoder output is detected, where an initial value of the output of the laser interferometer is set to coincide with the output coordinate of the encoder just before.

32. A pattern formation method to form a pattern on an object wherein a movable body on which the object is mounted is driven using the movable body drive method according to claim 31 to perform pattern formation to the object.

33. The pattern formation method according to claim 32 wherein the object has a sensitive layer, and a pattern is formed on the object by an exposure of the sensitive layer by irradiation of an energy beam.

34. A device manufacturing method including a pattern formation process wherein in the pattern formation process, a pattern is formed on a substrate using the pattern formation method according to claim 32.

35. A pattern formation method to form a pattern on an object wherein at least one of a plurality of movable bodies including a movable body on which the object is mounted is driven using the movable body drive method according to claim 31 to perform pattern formation to the object.

36. The pattern formation method according to claim 35 wherein the object has a sensitive layer, and a pattern is formed on the object by an exposure of the sensitive layer by irradiation of an energy beam.

37. A device manufacturing method including a pattern formation process wherein in the pattern formation process, a pattern is formed on a substrate using the pattern formation method according to claim 35.

38. An exposure method in which a pattern is formed on an object by an irradiation of an energy beam wherein for relative movement of the energy beam and the object, a movable body on which the object is mounted is driven, using the movable body drive method according to claim 31.

39. A position control method in which a position of a movable body is controlled in at least a uniaxial direction wherein the position of the movable body is controlled using at least one of an output from an encoder that generates information corresponding to the position in the uniaxial direction of the movable body and an output from a laser interferometer that irradiates a laser beam to the movable body in the uniaxial direction and generates a signal corresponding to an optical path length of the laser beam in the uniaxial direction to the movable body, and relation information between positional information of the movable body using the output from the encoder and positional information of the movable body using the output from the laser interferometer is obtained, whereby when abnormality occurs in one of the output from the encoder and the output from the laser interferometer used for the control of the movable body, the other output and the relation information are used to control the position of the movable body, the abnormality being determined based on a deviation between a measurement result of the encoder and a measurement result of the laser interferometer.

40. The position control method according to claim 39 wherein as the relation information, a difference information between positional information of the movable body using the output from the encoder and positional information of the movable body using the output from the laser interferometer is obtained.

41. The position control method according to claim 39 wherein the abnormality is determined when the deviation exceeds a predetermined threshold value.

42. A position control method of a movable body in which a position of a movable body is controlled in at least a uniaxial direction wherein when starting position control of the movable body using an output from an encoder that generates information corresponding to the position in the uniaxial direction of the movable body, after controlling the position of the movable body using an output from a laser interferometer that irradiates a laser beam to the movable body in the uniaxial direction and generates a signal corresponding to an optical path length of the laser beam in the uniaxial direction to the movable body, positional information based on the output from the encoder is adjusted using positional information based on the output from the laser interferometer.

43. The position control method according to claim 42 wherein when starting the position control using the output from the encoder, a first coordinate information which is obtained using the output from the encoder is adjusted to coincide with a second coordinate information which is obtained using the output of the laser interferometer.

44. An exposure method in which an object is exposed with an energy beam, the method comprising:

moving a movable body that can hold the object, while measuring positional information of the movable body using one of a first measurement device including an encoder and a second measurement device including an interferometer; and deciding positional information of the other of the first and second measurement devices based on positional information of the one of the measurement devices, in order to control the movement by switching the one of the measurement devices to the other of the measurement devices during the movement, the switching from the one of the measurement devices to the other of the measurement devices is performed when a difference between the positional information of the movable body by the first measuring device and the positional information of the movable body by the second measuring device exceeds a predetermined threshold value.

* * * * *